United States Patent
Kawashima

(10) Patent No.: US 11,444,434 B2
(45) Date of Patent: Sep. 13, 2022

(54) NITRIDE SEMICONDUCTOR MULTILAYER STRUCTURE, LIGHT EMITTING ELEMENT, LIGHT SOURCE APPARATUS, AND METHOD FOR PRODUCING NITRIDE SEMICONDUCTOR MULTILAYER STRUCTURE

(71) Applicant: Takeshi Kawashima, Miyagi (JP)

(72) Inventor: Takeshi Kawashima, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 315 days.

(21) Appl. No.: 16/749,001

(22) Filed: Jan. 22, 2020

(65) Prior Publication Data

US 2020/0244043 A1    Jul. 30, 2020

(30) Foreign Application Priority Data

Jan. 25, 2019   (JP) .............................. JP2019-011681

(51) Int. Cl.
*H01S 5/343* (2006.01)
*H01L 33/14* (2010.01)
(Continued)

(52) U.S. Cl.
CPC ...... *H01S 5/34333* (2013.01); *H01L 33/0075* (2013.01); *H01L 33/14* (2013.01); *H01L 33/32* (2013.01)

(58) Field of Classification Search
CPC ............ H01S 5/34333; H01S 5/04253; H01S 5/18308; H01S 5/18369; H01S 5/2216; H01S 5/04252; H01S 5/04256; H01S 5/04257; H01S 5/18325; H01S 5/18341; H01S 5/3095; H01S 2301/176; H01L 33/0075; H01L 33/14; H01L 33/32; H01L 33/007; H01L 33/025
(Continued)

(56) References Cited

U.S. PATENT DOCUMENTS 5,652,437 A * 7/1997 Harris ................. H01L 21/0485
257/77
2003/0185267 A1* 10/2003 Hwang ............... H01S 5/18358
372/96
(Continued)

FOREIGN PATENT DOCUMENTS

JP   2001-267686    9/2001
JP   2002-158405    5/2002
(Continued)

OTHER PUBLICATIONS

U.S. Appl. No. 16/504,758, filed Jul. 8, 2019.
Japanese Office Action for 2019-011681 dated Jul. 26, 2022.

*Primary Examiner* — Vu A Vu
(74) *Attorney, Agent, or Firm* — IPUSA, PLLC

(57) ABSTRACT

A nitride semiconductor multilayer structure includes a first nitride semiconductor layer; a second nitride semiconductor layer; and a third nitride semiconductor layer formed between the first nitride semiconductor layer and the second nitride semiconductor layer. The third nitride semiconductor layer includes a first region and a second region that surrounds the first region in a same plane, and an indium content of the second region is lower than an indium content of the first region.

10 Claims, 40 Drawing Sheets

(51) Int. Cl.
*H01L 33/00* (2010.01)
*H01L 33/32* (2010.01)

(58) Field of Classification Search
USPC .................................................... 372/44.01
See application file for complete search history.

(56) References Cited

U.S. PATENT DOCUMENTS

| | | | |
|---|---|---|---|
| 2004/0026710 | A1* | 2/2004 | Tsuda et al. |
| 2010/0065811 | A1* | 3/2010 | Senes .................... B82Y 20/00 |
| | | | 257/13 |
| 2019/0273360 | A1 | 9/2019 | Kawashima et al. |

FOREIGN PATENT DOCUMENTS

| | | |
|---|---|---|
| JP | 2004-72026 | 3/2004 |
| JP | 2011-014693 | 1/2011 |

* cited by examiner

NITRIDE SEMICONDUCTOR MULTILAYER STRUCTURE, LIGHT EMITTING ELEMENT, LIGHT SOURCE APPARATUS, AND METHOD FOR PRODUCING NITRIDE SEMICONDUCTOR MULTILAYER STRUCTURE

CROSS-REFERENCE TO RELATED APPLICATIONS

The present application claims priority under 35 U.S.C. § 119 to Japanese Patent Application No. 2019-011681, filed on Jan. 25, 2019, the entire contents of which are incorporated herein by reference.

BACKGROUND OF THE INVENTION

1. Field of the Invention

The disclosures herein relate to a nitride semiconductor multilayer structure, a light emitting element, a light source apparatus, and a method for producing the nitride semiconductor multilayer structure.

2. Description of the Related Art

In edge-emitting lasers and surface-emitting lasers, in order to efficiently amplify light, population inversion is produced by causing a current to flow through a narrow region, thereby confining light. For example, a current confinement structure is produced by embedding an n-type semiconductor layer in a region, through which no current flows, of a p-type semiconductor layer formed over a wafer.

Patent Document 1 describes a device having a current confinement structure in which an opening is formed in an n-AlInN layer and multiple nitride semiconductor layers are stacked on the AlInN layer.

In the device described in Patent Document 1, because the opening is formed in the n-AlInN layer, the n-AlInN layer has a level difference. Further, because the n-AlInN layer has the level difference, a nitride semiconductor layer formed on the n-AlInN layer also has a level difference. If a nitride semiconductor layer is formed on an underlayer having a level difference, the composition and the thickness of a mixed crystal tends to vary. For this reason, it is difficult to obtain stable characteristics. Furthermore, if a nitride semiconductor layer having a level difference is used for a surface-emitting laser, the level difference becomes the cause of light scattering, which may result in a reduction in characteristics, such as an increase in a threshold.

RELATED-ART DOCUMENTS

Patent Documents

Patent Document 1: Japanese Unexamined Patent Application Publication No. 2011-14693

SUMMARY OF THE INVENTION

According to an embodiment of the present invention, a nitride semiconductor multilayer structure includes a first nitride semiconductor layer; a second nitride semiconductor layer; and a third nitride semiconductor layer formed between the first nitride semiconductor layer and the second nitride semiconductor layer. The third nitride semiconductor layer includes a first region and a second region that surrounds the first region in a same plane, and an indium content of the second region is lower than an indium content of the first region.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

It is a general object of the present invention to provide a nitride semiconductor multilayer structure, a light emitting element, a light source apparatus, and a method for producing the nitride semiconductor multilayer structure, in which stable characteristics can be obtained.

In the following, embodiments of the present invention will be described with reference to the accompanying drawings. In the specification and drawings, elements having substantially the same functions or configurations are referred to by the same numerals and a duplicate description thereof may be omitted. In the following description, a side of a substrate on which a nitride semiconductor layer is formed is referred to as an upper side. However, a nitride semiconductor multilayer structure may be used upside down or may be disposed at any angle.

First Embodiment

Figure 1:
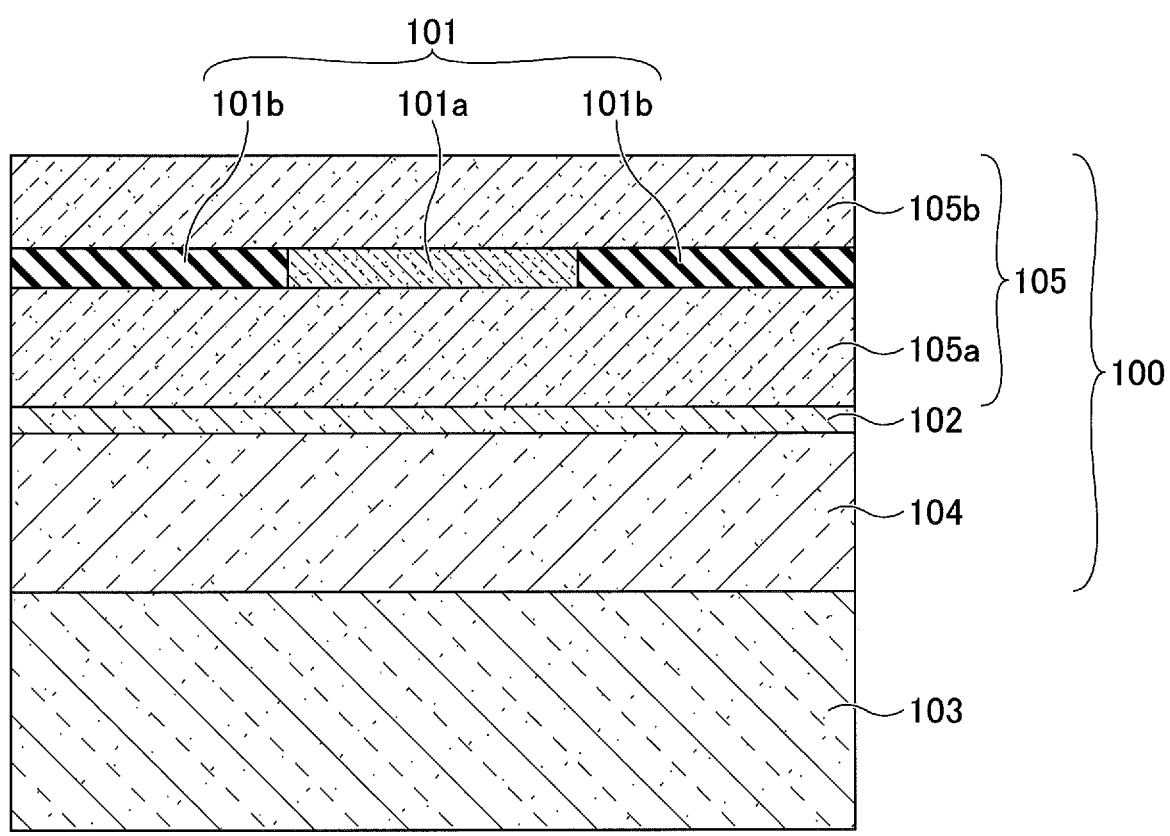
FIG. 1 is a cross-sectional view of a nitride semiconductor multilayer structure according to a first embodiment.

First, a first embodiment will be described. The first embodiment relates to a nitride semiconductor multilayer structure. FIG. 1 is a cross-sectional view of the nitride semiconductor multilayer structure according to the first embodiment.

As illustrated in FIG. 1, a nitride semiconductor multilayer structure 100 according to the first embodiment includes an n-type semiconductor layer 104, an active layer 102 formed on the n-type semiconductor layer 104, and a p-type semiconductor layer 105 formed on the active layer 102. The p-type semiconductor layer 105 includes a lower semiconductor layer 105a formed on the active layer 102, a current confinement layer 101 formed on the lower semiconductor layer 105a, and an upper semiconductor layer 105b formed on the current confinement layer 101. The lower semiconductor layer 105a is an example of a first nitride semiconductor layer, the upper semiconductor layer 105b is an example of a second nitride semiconductor layer, and the current confinement layer 101 is an example of a third nitride semiconductor layer.

The current confinement layer 101 includes a first region 101a and a second region 101b. The second region 101b surrounds the first region 101a in a same plane. The second region 101b has an indium (In) content lower than that of the first region 101a.

The nitride semiconductor multilayer structure 100 is formed, for example, on a substrate 103. Examples of the substrate 103 include a substrate on which nitride semiconductor layers can be stacked. A nitride semiconductor substrate such as a GaN substrate or an AlN substrate may be used as the substrate 103. A GaN template having a nitride semiconductor layer deposited on a heterogeneous substrate may be used as the substrate 103. Examples of the heterogeneous substrate include a sapphire substrate, a Si substrate, a GaAs substrate, and a SiC substrate.

As described above, the In content of the second region 101b is lower than the In content of the first region 101a in the nitride semiconductor multilayer structure 100. Therefore, a band gap of the second region 101b is larger than a band gap of the first region 101a. Accordingly, in the current confinement layer 101, a current is blocked by the second region 101b and selectively flows through the first region 101a.

As will be described below in detail, the current confinement layer 101 can be formed without employing a nitride semiconductor layer having a level difference. Therefore, the nitride semiconductor multilayer structure 100 provides stable characteristics.

In order to obtain better selectivity of a current path, the band gap of the second region 101b is preferably larger than the band gap of each of the lower semiconductor layer 105a, the upper semiconductor layer 105b, and the first region 101a by 0.5 eV or more, and more preferably by 1.0 eV or more. As differences between the band gaps increase, band offsets between the second region 101b and the lower semiconductor layer 105a, the upper semiconductor layer 105b, and the first region 101a become large. Thus, the second region 101b can readily block the current.

Note that, regardless of the In content, the second region 101b may have the largest band gap, among the lower semiconductor layer 105a, the upper semiconductor layer 105b, the first region 101a, and the second region 101b.

In general, the higher an In content, the higher the refractive index of a nitride semiconductor. Therefore, the refractive index of the second region 101b is lower than the refractive index of the first region 101a. Thus, light emitted from the active layer 102 is readily confined within a part of the current confinement layer 101 plane, namely in a plane parallel to the substrate 103. In terms of a light confinement effect, it is preferable for the current confinement layer 101 to include Al. This is because a difference in refractive index between the first region 101a and the second region 101b can be readily increased. Further, an excellent optical confinement effect is highly suitable for an edge-emitting laser and a surface-emitting laser.

The nitride semiconductor multilayer structure 100 may be used to obtain a light confinement effect. For example, even if the difference in In content between the first region 101a and the second region 101b is small and also a current confinement effect is small, a light confinement effect can be obtained. Accordingly, even if the nitride semiconductor multilayer structure 100 is unable to obtain an excellent current confinement effect, the nitride semiconductor multilayer structure 100 may be used only to obtain a light confinement effect in combination with another structure that can obtain a current confinement effect.

The n-type semiconductor layer 104 is, for example, a nitride semiconductor layer doped with an impurity such as Si or Ge. For example, an n-GaN layer or an n-AlGaN layer may be used as the n-type semiconductor layer 104. The p-type semiconductor layer 105 is a nitride semiconductor layer doped with an impurity such as Mg. For example, a p-GaN layer or a p-AlGaN layer may be used as the p-type semiconductor layer 105.

For example, the active layer 102 confines carriers injected from the n-type semiconductor layer 104 or the p-type semiconductor layer 105, and emits light. For example, in order to obtain high light emission efficiency, a multi-quantum well layer in which an InGaN layer and a GaN layer are alternately stacked or a multi-quantum well layer in which two InGaN layers having different compositions are alternately stacked is preferably used as the active layer 102.

The thickness of the current confinement layer 101 is not limited, but is preferably 20 nm or more. This is to suppress tunneling of carriers, such as electrons and holes, in the second region 101b. If the current confinement layer 101 is too thick, a crystal defect tends to occur due to a difference in lattice constant between the current confinement layer 101 and the other nitride semiconductor layers. Therefore, the thickness of the current confinement layer 101 is preferably less than or equal to the critical thickness.

Next, a method for producing the nitride semiconductor multilayer structure 100 according to the first embodiment will be described. FIG. 2A through FIG. 2E are cross-sectional views illustrating the method for producing the nitride semiconductor multilayer structure 100 according to the first embodiment. In this producing method, the nitride semiconductor layers included in the nitride semiconductor multilayer structure 100 are epitaxially grown on the substrate 103. As an epitaxial growth method, a metal organic vapor deposition (MOCVD) method, a molecular beam epitaxy (MBE) method, a plasma chemical vapor deposition (PCVD) method, or a hydride vapor phase epitaxy (HVPE) method may be used.

Figure 2A:
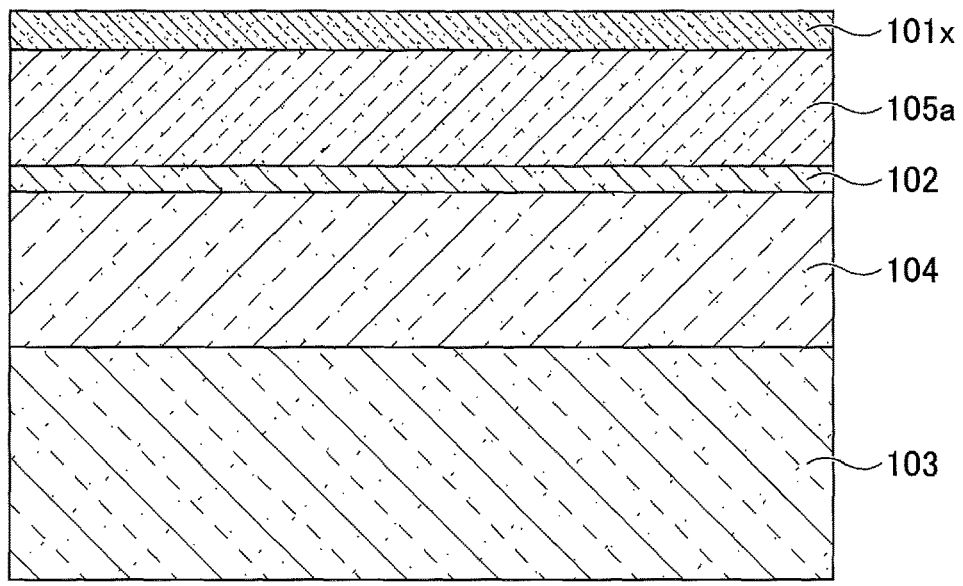
FIG. 2A is a cross-sectional view (part 1) illustrating a method for producing the nitride semiconductor multilayer structure according to the first embodiment.

First, as illustrated in FIG. 2A, the n-type semiconductor layer 104, the active layer 102, the lower semiconductor layer 105a, and an intermediate semiconductor layer 101x are formed on or above the substrate 103. The intermediate semiconductor layer 101x includes In, and has the same In content as that of the first region 101a.

Figure 2B:
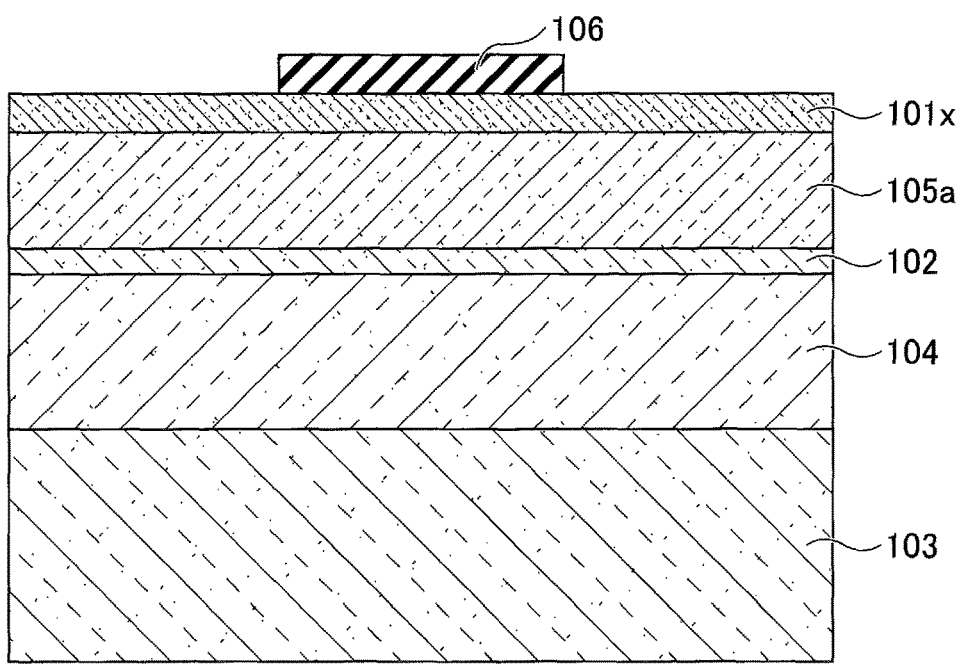
FIG. 2B is a cross-sectional view (part 2) illustrating the method for producing the nitride semiconductor multilayer structure according to the first embodiment.

Next, as illustrated in FIG. 2B, a protective mask 106 is formed on the intermediate semiconductor layer 101x. The protective mask 106 covers a region where the first region 101a is to be formed. The protective mask 106 may be any film capable of blocking hydrogen. For example, a silicon oxide film ($SiO_2$ film) or a silicon nitride film (SiN film) may be used as the protective mask 106.

Figure 2C:
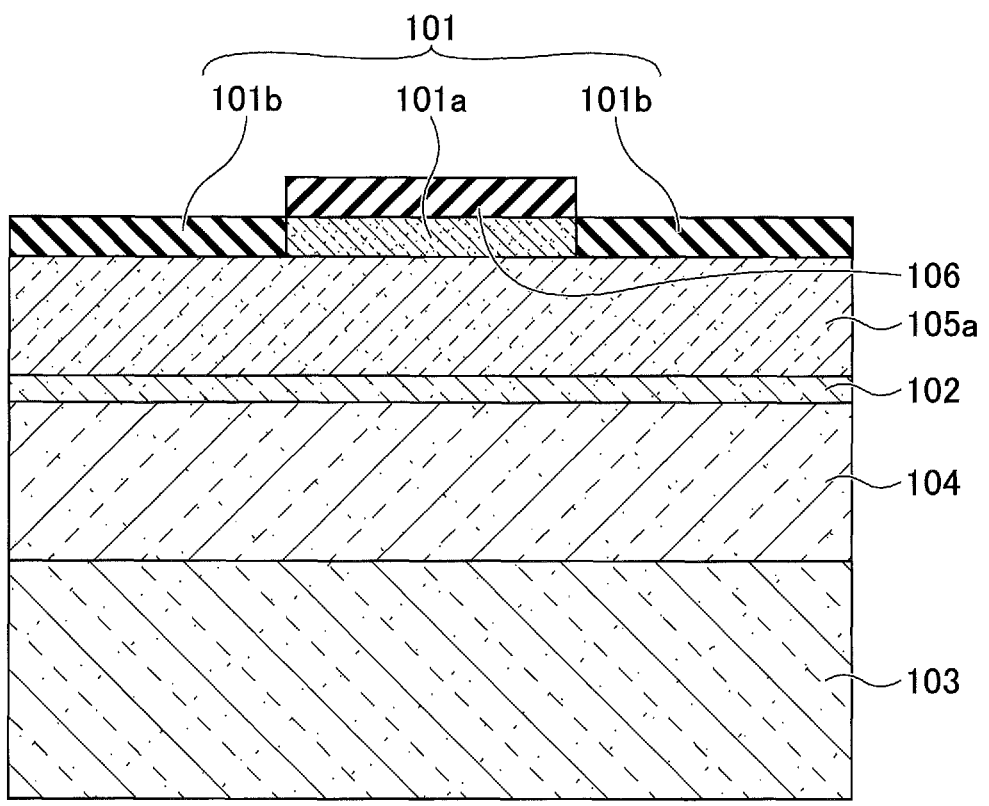
FIG. 2C is a cross-sectional view (part 3) illustrating the method for producing the nitride semiconductor multilayer structure according to the first embodiment.

Next, heat treatment is performed at a temperature of 500° C. or higher in an atmosphere including hydrogen. By the heat treatment, hydrogen penetrates an exposed portion of the intermediate semiconductor layer 101x not covered by the protective mask 106, and also In is evaporated from the exposed portion. As a result, as illustrated in FIG. 2C, the second region 101b whose In content is lower than the In content of the intermediate semiconductor layer 101x is formed. The remainder of the intermediate semiconductor layer 101x becomes the first region 101a whose In content remains unchanged from the In content of the intermediate semiconductor layer 101x. In this manner, the current confinement layer 101 including the first region 101a and the second region 101b is formed.

For the heat treatment, a film forming apparatus such as a MOCVD apparatus used to form the n-type semiconductor layer 104, the active layer 102, the lower semiconductor layer 105a, and the intermediate semiconductor layer 101x may be used. Alternatively, a heat treatment apparatus may be used for the heat treatment.

Figure 2D:
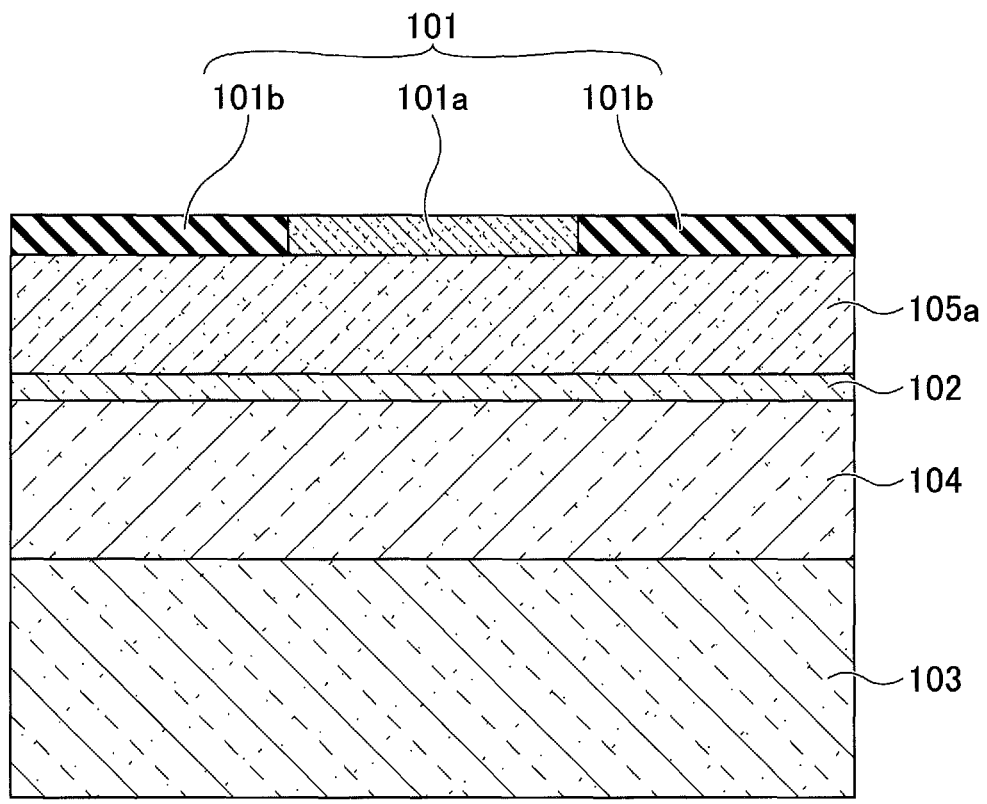
FIG. 2D is a cross-sectional view (part 4) illustrating the method for producing the nitride semiconductor multilayer structure according to the first embodiment.

Next, as illustrated in FIG. 2D, the protective mask 106 is removed.

Figure 2E:
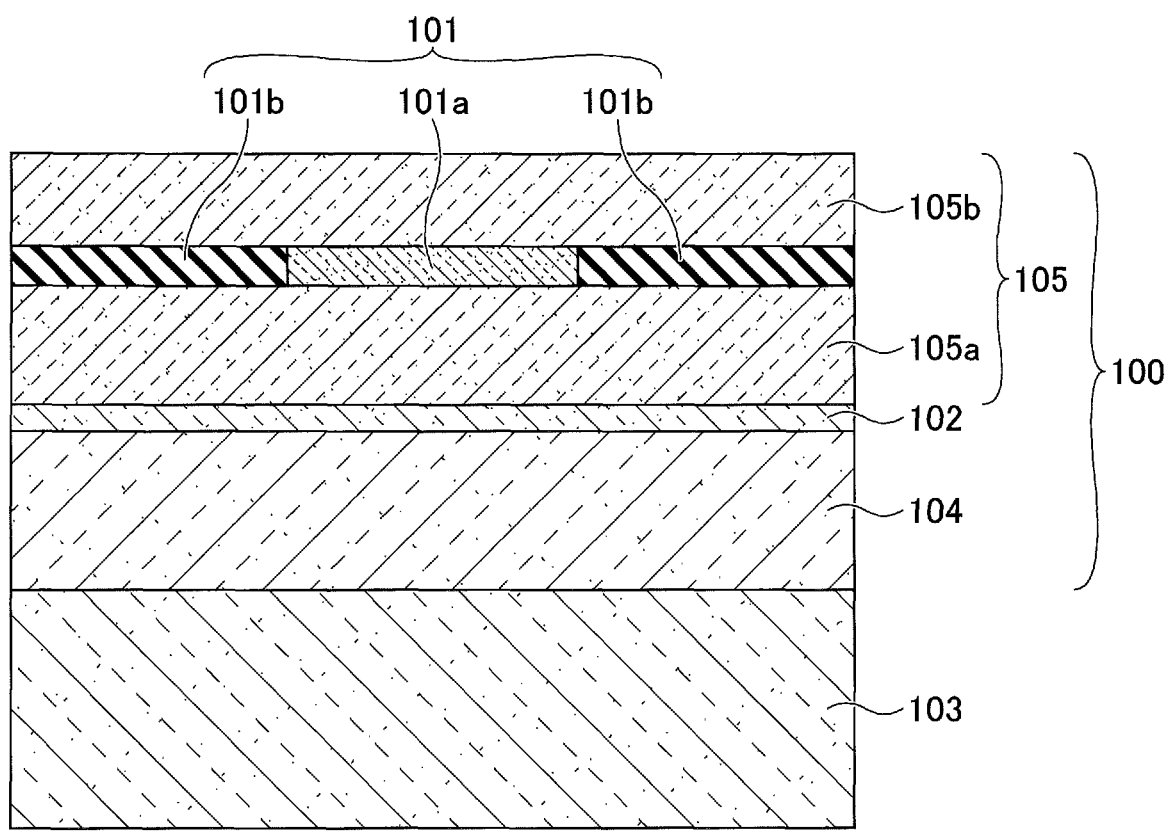
FIG. 2E is a cross-sectional view (part 5) illustrating the method for producing the nitride semiconductor multilayer structure according to the first embodiment.

Next, as illustrated in FIG. 2E, the upper semiconductor layer 105b is formed on the current confinement layer 101.

In this manner, the nitride semiconductor multilayer structure 100 according to the first embodiment can be produced.

According to the above-described method, the current confinement layer 101 can be formed without forming a level difference in the intermediate semiconductor layer 101x. Accordingly, stable characteristics can be obtained.

Note that the protective mask 106 is not required to be formed directly on the intermediate semiconductor layer 101x. That is, another nitride semiconductor layer may be formed between the protective mask 106 and the intermediate semiconductor layer 101x. For example, a nitride semiconductor layer that does not include In, such as a GaN layer or an AlGaN layer, may be formed with a thickness of 100 nm or less. In this case, the evaporation rate of In can be suppressed by the nitride semiconductor layer that does not include In. Therefore, the In content of the current confinement layer 101 can be readily controlled.

Second Embodiment

Figure 3:
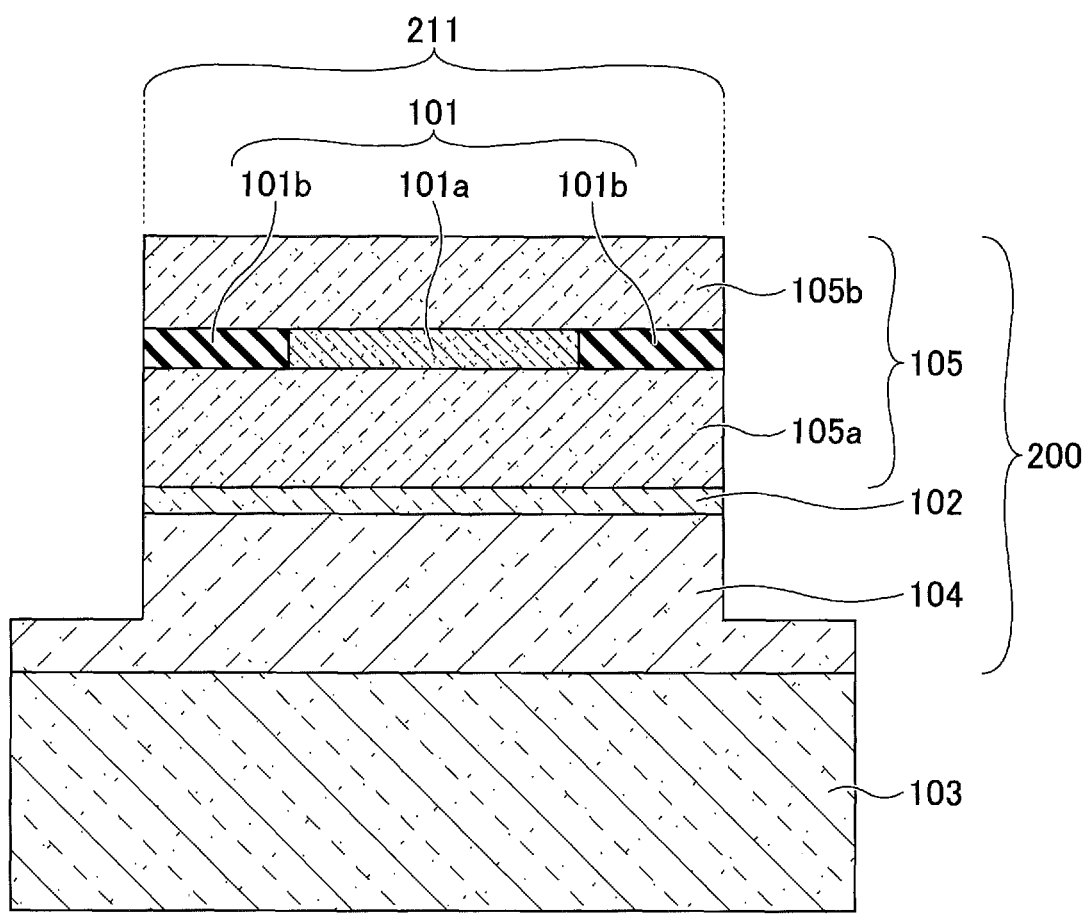
FIG. 3 is a cross-sectional view of a nitride semiconductor multilayer structure according to a second embodiment.

Next, a second embodiment will be described. The second embodiment relates to a nitride semiconductor multilayer structure. FIG. 3 is a cross-sectional view of a nitride semiconductor multilayer structure according to the second embodiment.

As illustrated in FIG. 3, in a nitride semiconductor multilayer structure 200 according to the second embodiment, the p-type semiconductor layer 105, the current confinement layer 101, the active layer 102, and a portion of n-type semiconductor layer 104 are etched, thereby forming a mesa structure 211. Other configurations are similar to those of the first embodiment.

The nitride semiconductor multilayer structure 200 according to the second embodiment provides a similar effect to that of the nitride semiconductor multilayer structure 100.

The shape in plan view of the mesa structure 211 is not particularly limited. For example, if the nitride semiconductor multilayer structure 200 is used for an edge-emitting laser, the mesa structure 211 has a stripe shape. For example, if the nitride semiconductor multilayer structure 200 is used for a surface-emitting laser, the mesa structure 211 has a circular shape or a rectangular shape.

Figure 4A:
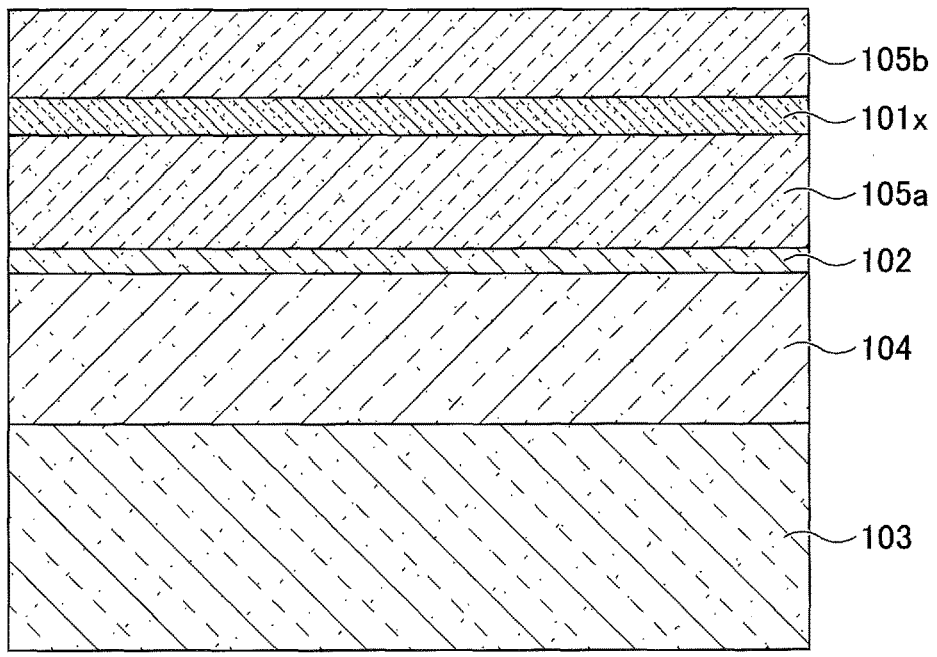
FIG. 4A is a cross-sectional view (part 1) illustrating a method for producing the nitride semiconductor multilayer structure according to the second embodiment.
Figure 4B:
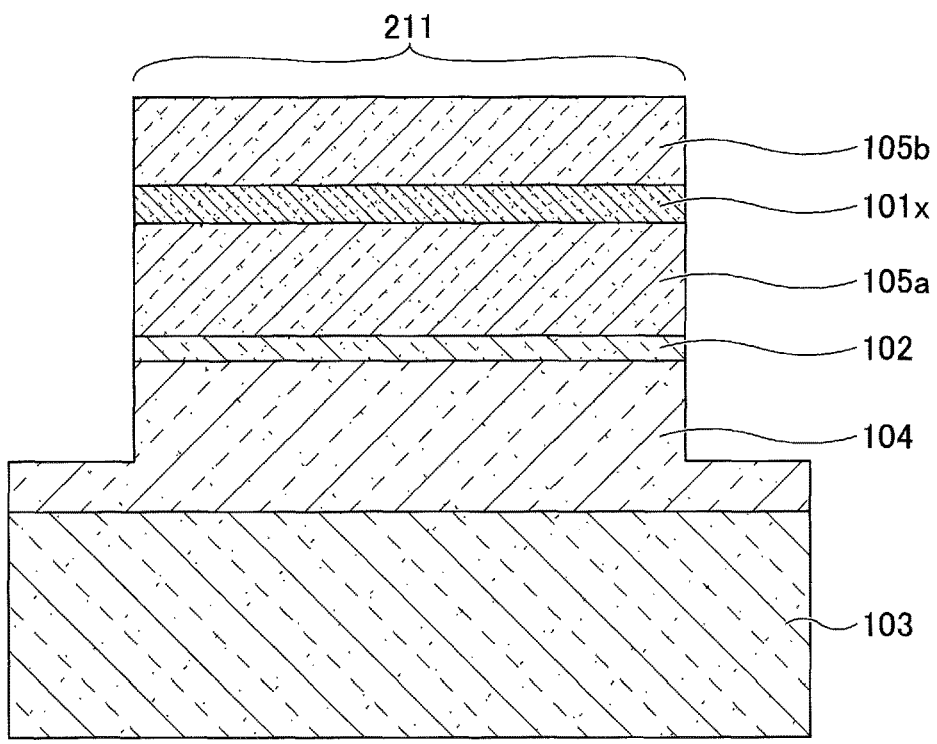
FIG. 4B is a cross-sectional view (part 2) illustrating the method for producing the nitride semiconductor multilayer structure according to the second embodiment.
Figure 4C:
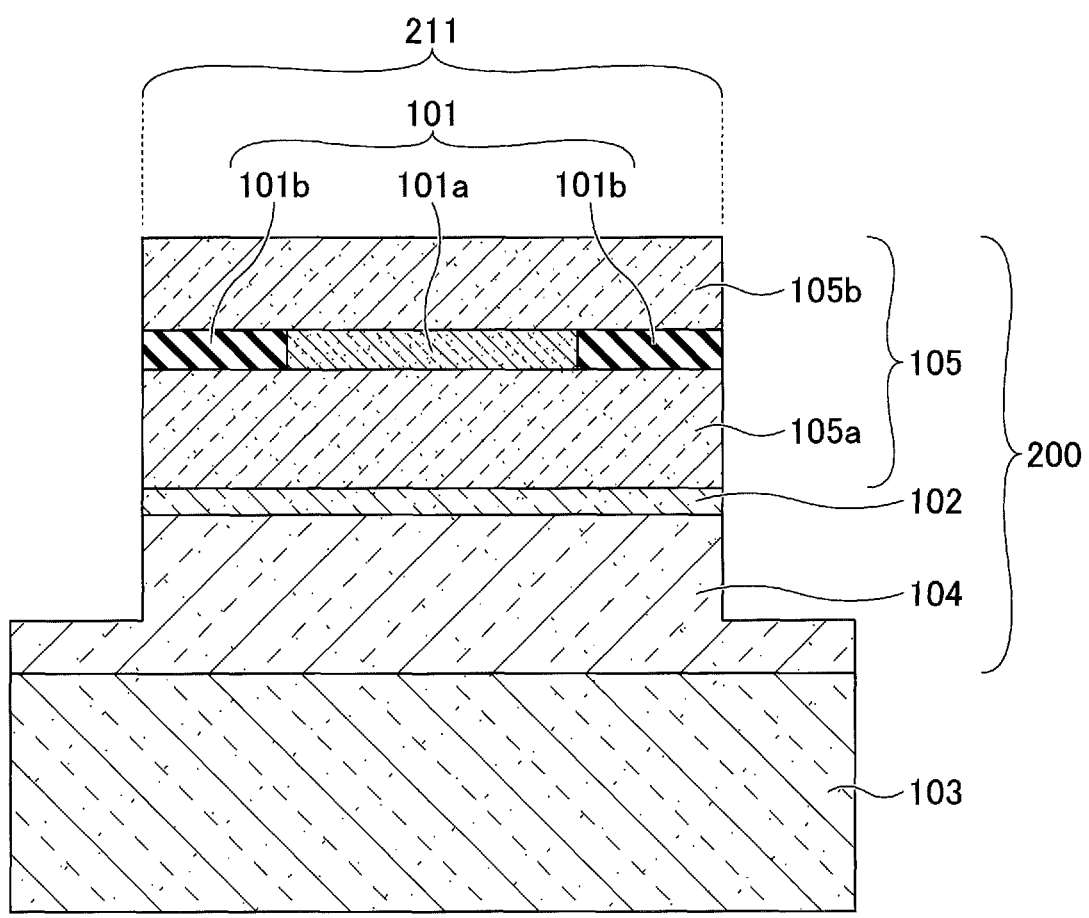
FIG. 4C is a cross-sectional view (part 3) illustrating the method for producing the nitride semiconductor multilayer structure according to the second embodiment.

Next, a method for producing the nitride semiconductor multilayer structure 200 according to the second embodiment will be described. FIG. 4A through FIG. 4C are cross-sectional views illustrating the method for producing the nitride semiconductor multilayer structure 200 according to the second embodiment. In this producing method, the nitride semiconductor layers included in the nitride semiconductor multilayer structure 200 are epitaxially grown on the substrate 103.

First, as illustrated in FIG. 4A, the n-type semiconductor layer 104, the active layer 102, the lower semiconductor layer 105a, the intermediate semiconductor layer 101x, and the upper semiconductor layer 105b are formed on or above the substrate 103.

Next, as illustrated in FIG. 4B, the p-type semiconductor layer 105, the intermediate semiconductor layer 101x, the active layer 102, and a portion of the n-type semiconductor layer 104 are removed by lithography and dry etching, thereby forming the mesa structure 211.

Next, heat treatment is performed at a temperature greater than or equal to 500° C. in an atmosphere including hydrogen. By the heat treatment, hydrogen penetrates the intermediate semiconductor layer 101x from the side walls, and also In included in the intermediate semiconductor layer 101x is evaporated from the side walls. As a result, as illustrated in FIG. 4C, the second region 101b whose In content is lower than In content of the intermediate semiconductor layer 101x is formed. The remainder of the intermediate semiconductor layer 101x becomes the first region 101a whose In content remains unchanged from the In content of the intermediate semiconductor layer 101x. In this manner, the current confinement layer 101 including the first region 101a and the second region 101b is formed.

In this manner, the nitride semiconductor multilayer structure 200 according to the second embodiment can be produced.

According to the above-described method, the current confinement layer 101 can be formed without forming a level difference in the intermediate semiconductor layer 101x. Accordingly, stable characteristics can be obtained.

Note that the mesa structure 211 may be formed to the extent that at least the side walls of the intermediate semiconductor layer 101x are exposed.

Further, the In content is not required to be sharply and discontinuously changed between the first region 101a and the second region 101b. A region in which the In content continuously changes may be present between the first region 101a and the second region 101b.

In the first embodiment and the second embodiment, the atmosphere in the heat treatment may be an atmosphere of hydrogen gas only or an atmosphere of a mixture of hydrogen gas and an inert gas such as nitrogen gas. The In evaporation rate can be controlled in accordance with the percentage of the inert gas. Further, the atmosphere in the heat treatment may include ammonia ($NH_3$) in addition to hydrogen gas. During the heat treatment, nitrogen included in the nitride semiconductor layers may be desorbed, which may cause exposed surfaces to be roughened. However, if the atmosphere includes ammonia, nitrogen desorption is inhibited, and thus, the exposed surfaces tend to be maintained flat.

The heat treatment temperature is not particularly limited, and may be any temperature as long as In can be evaporated. For example, the heat treatment temperature may be greater than or equal to 500° C. as described above. The heat treatment temperature is preferably T greater than or equal to 200 (° C.), and more preferably T greater than or equal to 100° C., where T (° C.) denotes a temperature at which the intermediate semiconductor layer 101x (the third nitride semiconductor layer) can be formed with excellent crystallinity. In addition, the heat treatment temperature is less than or equal to a temperature at which the intermediate semiconductor layer 101x is decomposed. For example, if the intermediate semiconductor layer 101x is an InGaN layer, Ga begins to evaporate in a temperature range of 1100° C. to 1200° C. Therefore, if the heat treatment temperature exceeds 1200° C., the intermediate semiconductor layer 101x may be decomposed before the current confinement layer 101 is formed. Accordingly, if the intermediate semiconductor layer 101x is an InGaN layer, the heat treatment temperature is preferably less than or equal to 1200° C., and more preferably 1100° C. If the intermediate semiconductor layer 101x is an AlInN layer or an AlGaInN layer, the thermal decomposition of the intermediate semiconductor layer 101x is suppressed by Al included in the intermediate semiconductor layer 101x, and thus, the heat treatment temperature can be increased to 1400° C. The temperature T is dependent on the In content of the intermediate semiconductor layer 101x. As the In content decreases, the temperature T tends to increase.

Third Embodiment

Figure 5:
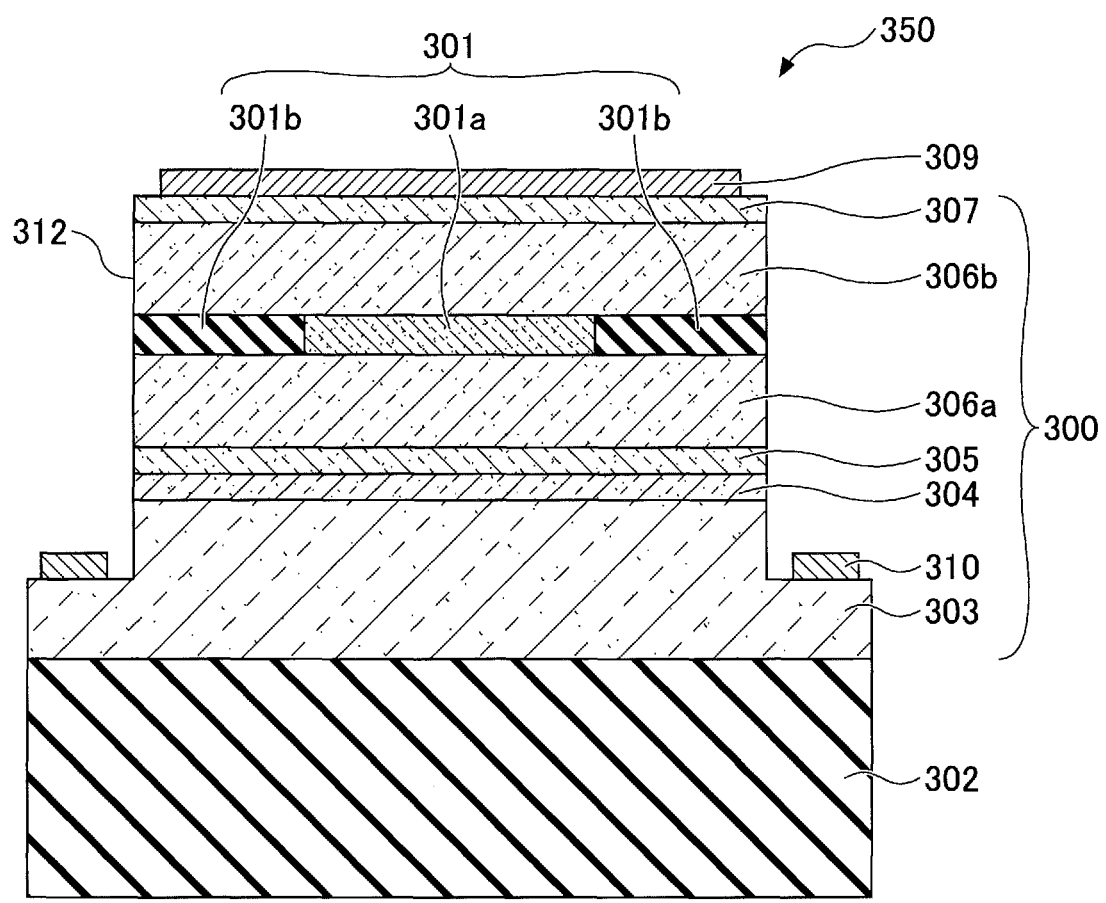
FIG. 5 is a cross-sectional view of a light emitting diode according to a third embodiment.

Next, a third embodiment will be described. The third embodiment relates to a light emitting diode including a nitride semiconductor multilayer structure. The light emitting diode is an example of a light emitting element. FIG. 5 is a cross-sectional view of the light emitting diode according to the third embodiment.

As illustrated in FIG. 5, a light emitting diode 350 according to the third embodiment includes a sapphire substrate 302 and a light emitting diode (LED) structure 300 formed on the sapphire substrate 302. The LED structure 300 includes an n-GaN layer 303, a multi-quantum well layer 304, a p-$Al_{0.20}Ga_{0.80}N$ layer 305, a p-GaN layer 306a, a current confinement layer 301, a p-GaN layer 306b, and a $p^{++}$-GaN layer 307. The p-GaN layer 306a is an example of a first nitride semiconductor layer, the p-GaN layer 306b is an example of a second nitride semiconductor layer, and the current confinement layer 301 is an example of a third nitride semiconductor layer. The LED structure 300 is an example of a nitride semiconductor multilayer structure.

The n-GaN layer 303 is formed on the sapphire substrate 302. The thickness of the n-GaN layer 303 is, for example, 5 μm.

The multi-quantum well layer 304 is formed on the n-GaN layer 303. The multi-quantum well layer 304 has a structure including 5 periods of alternating $In_{0.15}Ga_{0.85}N$ and GaN layers. The $In_{0.15}Ga_{0.85}N$ layer has a thickness of 2.5 nm and the GaN layer has a thickness of 7.5 nm. The multi-quantum well layer 304 is an example of an active layer.

The p-$Al_{0.20}Ga_{0.80}N$ layer 305 is formed on the multi-quantum well layer 304. The thickness of the p-$Al_{0.20}Ga_{0.80}N$ layer 305 is, for example, 20 nm.

The p-GaN layer 306a is formed on the p-$Al_{0.20}Ga_{0.80}N$ layer 305. The thickness of the p-GaN layer 306a is, for example, 50 nm.

The current confinement layer 301 is formed on the p-GaN layer 306a. The thickness of the current confinement layer 301 is, for example, 50 nm. The current confinement layer 301 includes a p-$Al_{0.70}In_{0.30}N$ layer 301a and a p-AlN layer 301b. The p-AlN layer 301b surrounds the p-$Al_{0.70}In_{0.30}N$ layer 301a in a same plane. The In content of the p-AlN layer 301b is lower than that of the p-$Al_{0.70}In_{0.30}N$ layer 301a. The p-$Al_{0.70}In_{0.30}N$ layer 301a is an example of a first region, and the p-AlN layer 301b is an example of a second region.

The p-GaN layer 306b is formed on the current confinement layer 301. The thickness of the p-GaN layer 306b is, for example, 50 nm.

The $p^{++}$-GaN layer 307 is formed on the p-GaN layer 306b. The thickness of the $p^{++}$-GaN layer 307 is, for example, 5 nm. The $p^{++}$-GaN layer 307 is doped with Mg, which serves as an acceptor, at a concentration of $1\times10^{20}$ $cm^{-3}$.

An element isolation groove 312 is formed in the $p^{++}$-GaN layer 307, the p-GaN layer 306b, the current confinement layer 301, the p-GaN layer 306a, the p-$Al_{0.20}Ga_{0.80}N$ layer 305, the multi-quantum well layer 304, and a portion of the n-GaN layer 303.

A p-side electrode 309 is formed on the surface of the $p^{++}$-GaN layer 307. An n-side electrode 310 is formed on the surface of an exposed portion of the n-GaN layer 303 in the element isolation groove 312. The p-side electrode 309 has, for example, a Ni film and an Au film sequentially stacked on the $p^{++}$-GaN layer 307. The n-side electrode 310 has, for example, a Ti film and an Al film sequentially stacked on the n-GaN layer 303.

In the light emitting diode 350, the current confinement layer 301 includes the p-$Al_{0.70}In_{0.30}N$ layer 301a and the p-AlN layer 301b as described above. The band gap of the p-$Al_{0.70}In_{0.30}N$ layer 301a is 3.59 eV, and the band gap of the p-AlN layer 301b is 6.2 eV. Further, the band gap of each of the p-GaN layer 306a and the p-GaN layer 306b, which sandwich the current confinement layer 301 therebetween, is 3.4 eV. The band gap of the p-AlN layer 301b is larger, by 1.0 eV or more, than the band gap of each of the p-$Al_{0.70}In_{0.30}N$ layer 301a, the p-GaN layer 306a, and the p-GaN layer 306b, which are formed in the surroundings of the p-AlN layer 301b. Accordingly, large band offsets are formed between the p-AlN layer 301b and the p-$Al_{0.70}In_{0.30}N$ layer 301a, the p-GaN layer 306a, and the p-GaN layer 306b. Accordingly, in the current confinement layer 301, a current is blocked by the p-AlN layer 301b and selectively flows through the p-$Al_{0.70}In_{0.30}N$ layer 301a.

As will be described below in detail, the current confinement layer 301 can be formed without employing a nitride semiconductor layer having a level difference. Accordingly, the light emitting diode 350 including the LED structure 300 can obtain stable characteristics.

Next, a method for producing the light emitting diode 350 according to the third embodiment will be described. FIG. 6A through FIG. 6F are cross-sectional views illustrating the method for producing the light emitting diode 350 according to the third embodiment. In this producing method, the nitride semiconductor layers included in the LED structure 300 are epitaxially grown on the sapphire substrate 302.

Figure 6A:
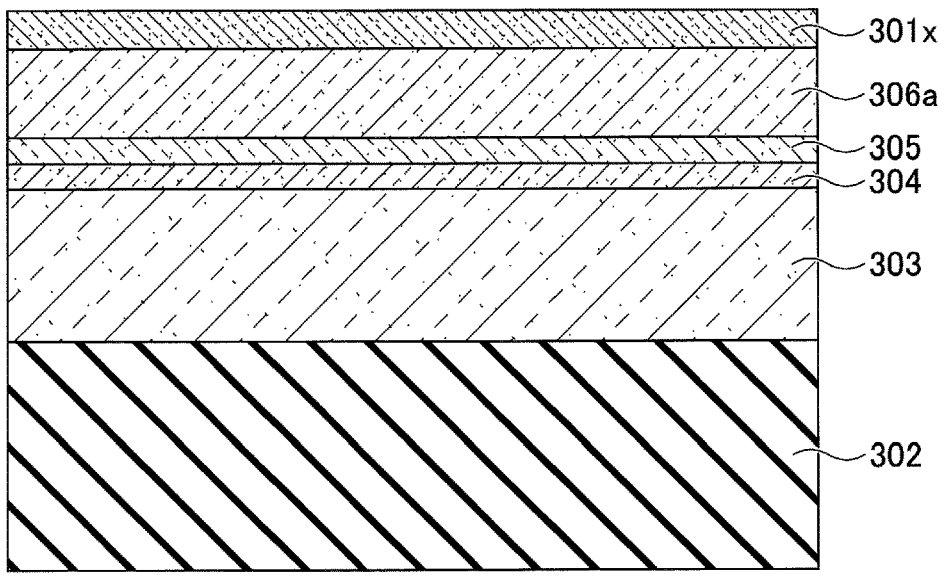
FIG. 6A is a cross-sectional view (part 1) illustrating a method for producing the light emitting diode according to the third embodiment.

First, the MOCVD apparatus is used to sequentially form the n-GaN layer 303, the multi-quantum well layer 304, the p-$Al_{0.20}Ga_{0.80}N$ layer 305, the p-GaN layer 306a, and a p-$Al_{0.70}In_{0.30}N$ layer 301x on or above the sapphire substrate 302, as illustrated in FIG. 6A. Before forming the n-GaN layer 303, a GaN buffer layer (not illustrated) having a thickness of 20 nm may be formed on the sapphire substrate 302.

Figure 6B:
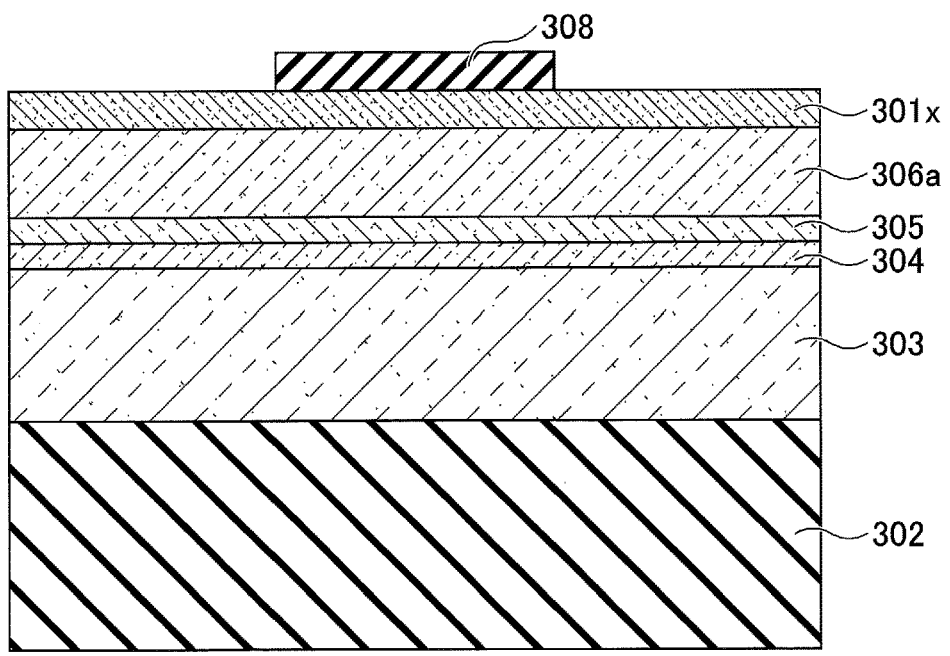
FIG. 6B is a cross-sectional view (part 2) illustrating the method for producing the light emitting diode according to the third embodiment.

Next, a structure illustrated in FIG. 6A is removed from the MOCVD apparatus, and a $SiO_2$ film 308 having a thickness of 100 nm is formed on the p-$Al_{0.70}In_{0.30}N$ layer 301x as illustrated in FIG. 6B. The $SiO_2$ film 308 serves as a protective mask that covers a region where the p-$Al_{0.70}In_{0.30}N$ layer 301a is to be formed. The $SiO_2$ film 308 may be formed by photolithography, for example.

Figure 6C:
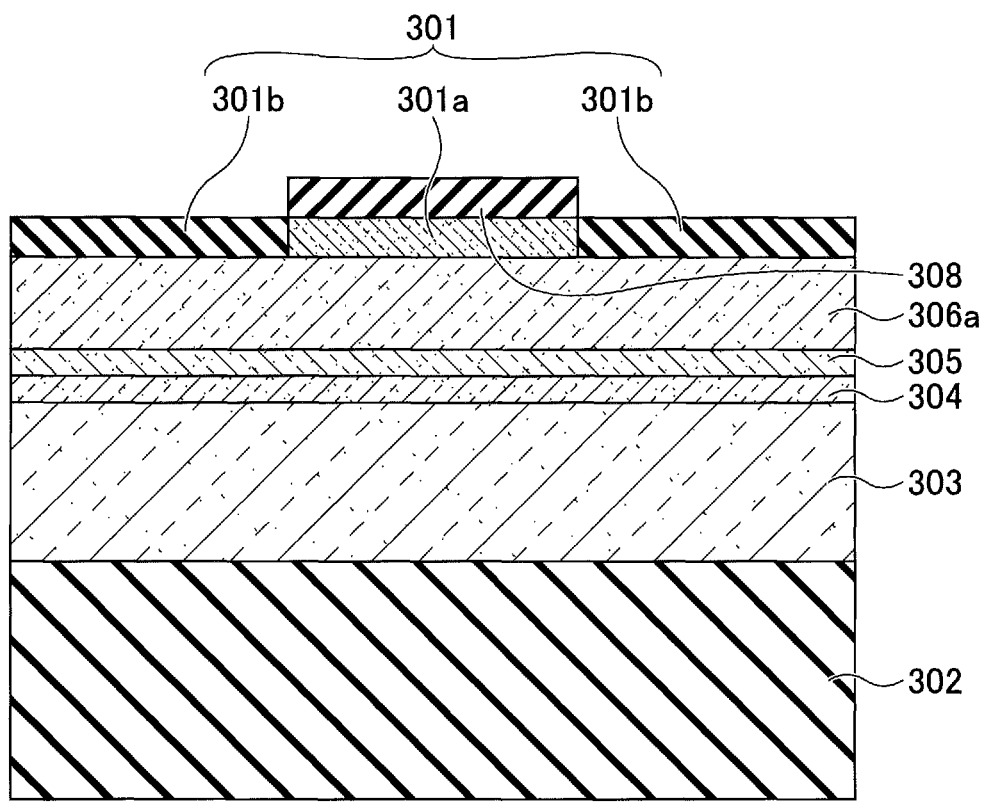
FIG. 6C is a cross-sectional view (part 3) illustrating the method for producing the light emitting diode according to the third embodiment.

Next, a structure illustrated in FIG. 6B is placed in a heat treatment apparatus, and heat treatment is performed at a temperature of 800° C. in a hydrogen atmosphere. The heat treatment time is set to 10 minutes, for example. By the heat treatment, hydrogen penetrates an exposed portion of the p-$Al_{0.70}In_{0.30}N$ layer 301x not covered by the $SiO_2$ film 308, and also In is evaporated from the exposed portion. As a result, as illustrated in FIG. 6C, the portion of the p-$Al_{0.70}In_{0.30}N$ layer 301x exposed from the $SiO_2$ film 308 becomes the p-AlN layer 301b. The remainder of the p-$Al_{0.70}In_{0.30}N$ layer 301x becomes the p-$Al_{0.70}In_{0.30}N$ layer 301a whose In content remains unchanged from that of the p-$Al_{0.70}In_{0.30}N$ layer 301x. In this manner, the current confinement layer 301 including the p-$Al_{0.70}In_{0.30}N$ layer 301a and the p-AlN layer 301b is formed.

Figure 6D:
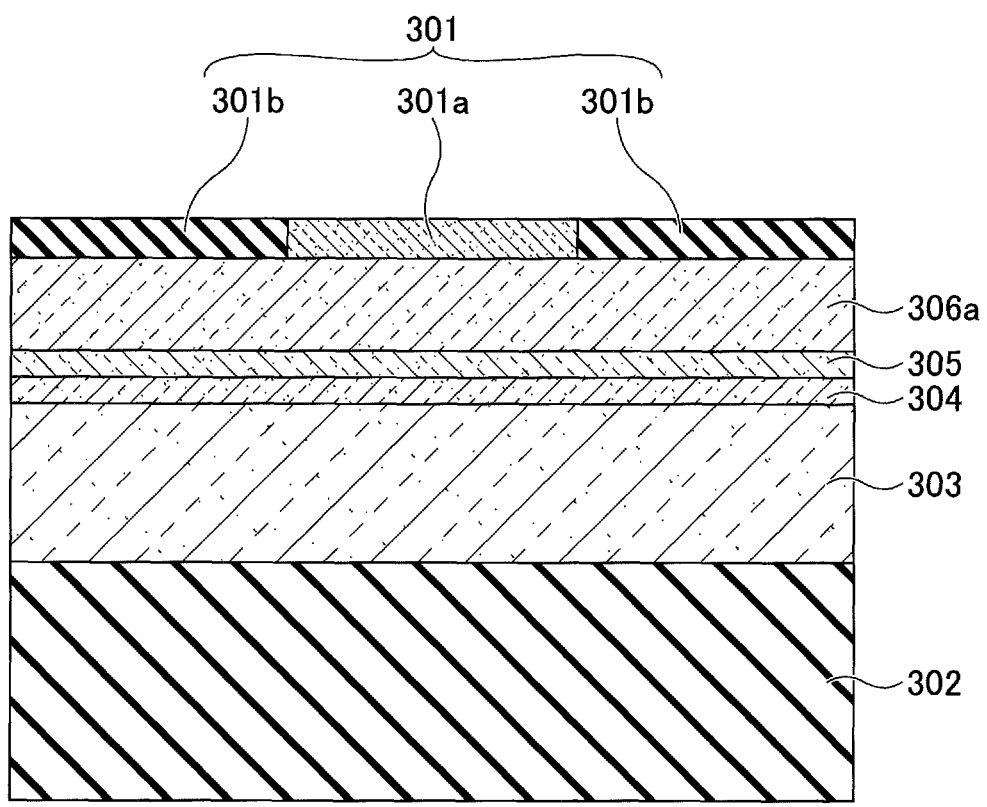
FIG. 6D is a cross-sectional view (part 4) illustrating the method for producing the light emitting diode according to the third embodiment.

Next, a structure illustrated in FIG. 6C is removed from the heat treatment apparatus, and the $SiO_2$ film 308 is removed as illustrated in FIG. 6D. The $SiO_2$ film 308 may be removed by buffered hydrofluoric acid, for example.

Next, a structure illustrated in FIG. 6D is placed in the MOCVD apparatus, and the p-GaN layer 306b and the $p^{++}$-GaN layer 307 are sequentially formed on the current confinement layer 301.

Figure 6E:
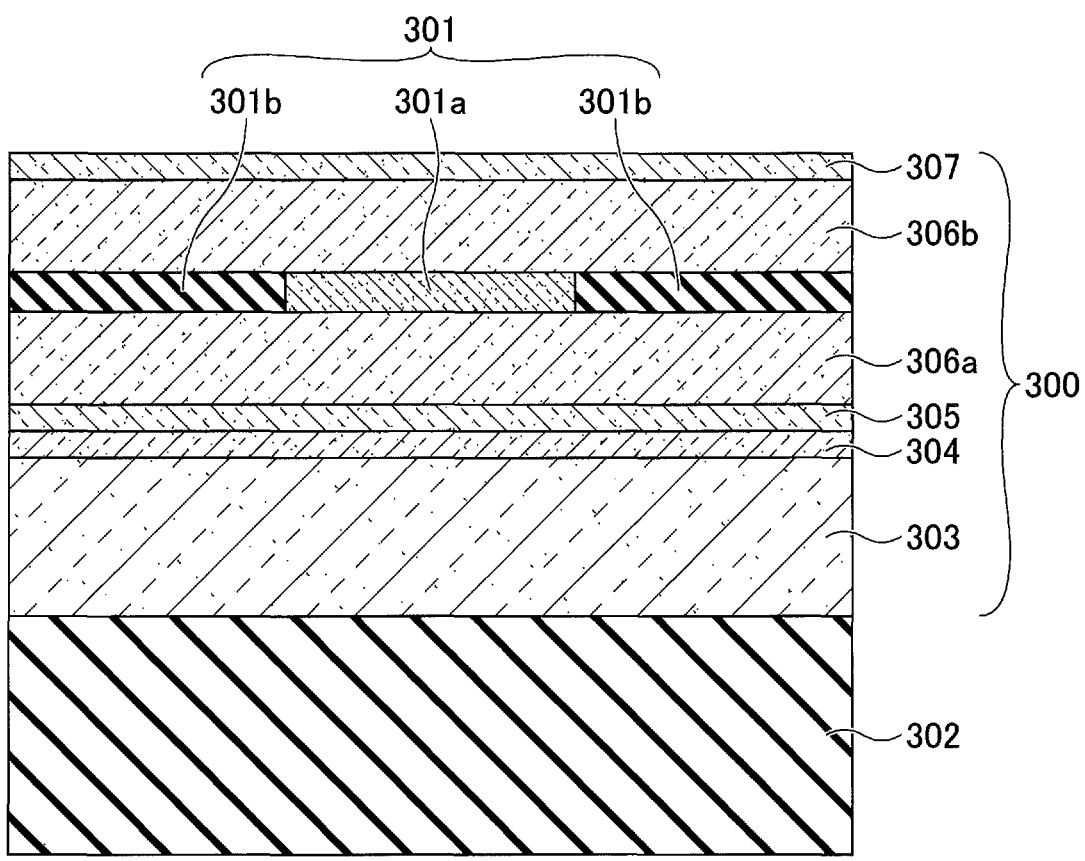
FIG. 6E is a cross-sectional view (part 5) illustrating the method for producing the light emitting diode according to the third embodiment.
Figure 6F:
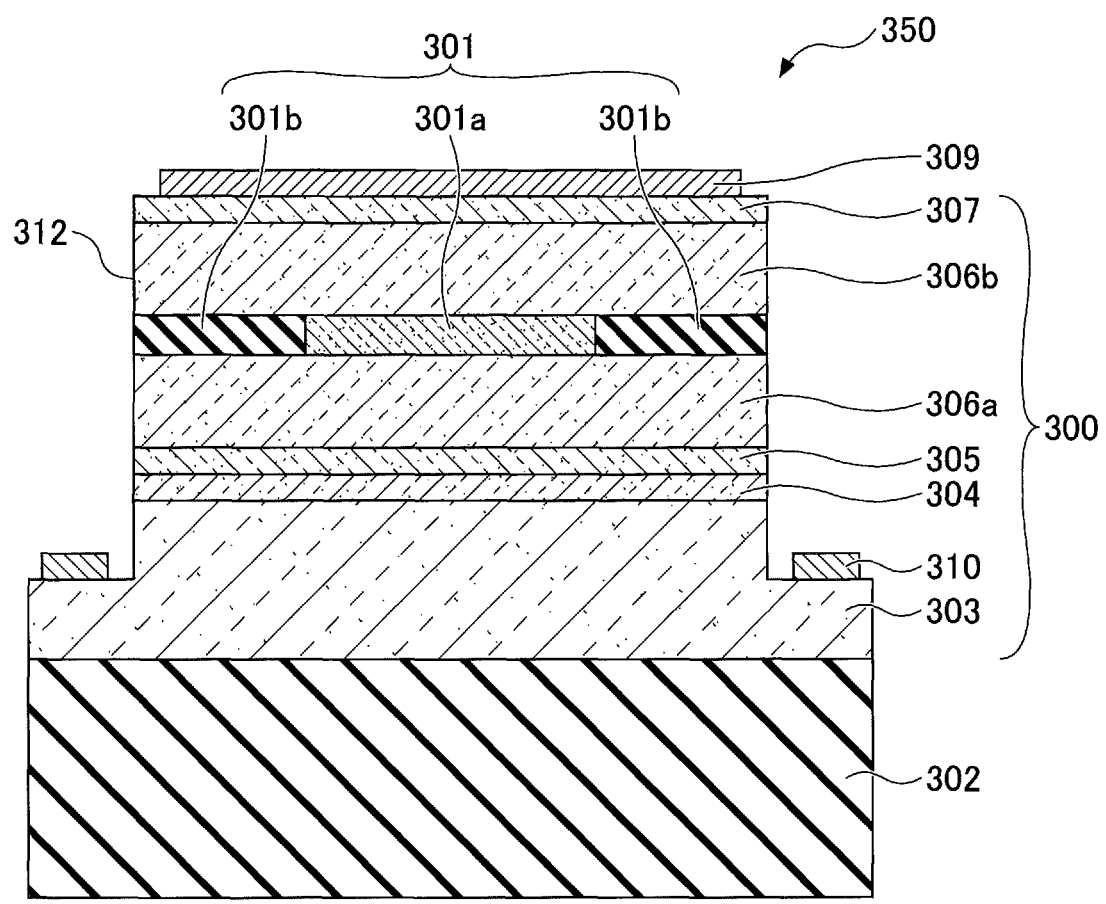
FIG. 6F is a cross-sectional view (part 6) illustrating the method for producing the light emitting diode according to the third embodiment.

Subsequently, a structure illustrated in FIG. 6E is removed from the MOCVD apparatus, and activation annealing of the acceptor is performed. Next, as illustrated in FIG. 6F, the element isolation groove 312 is formed in the $p^{++}$-GaN layer 307, the p-GaN layer 306b, the current confinement layer 301, the p-GaN layer 306a, the p-$Al_{0.20}Ga_{0.80}N$ layer 305, the multi-quantum well layer 304, and a portion of the n-GaN layer 303. The element isolation groove 312 may be formed by lithography and dry etching. Next, the p-side electrode 309 is formed on the surface of the $p^{++}$-GaN layer 307, and the n-side electrode 310 is formed on the surface of a portion of the n-GaN layer 303 exposed from the element isolation groove 312. For example, when the p-side electrode 309 is formed, the Ni film and the Au film are sequentially stacked on the $p^{++}$-GaN layer 307. For example, when the n-side electrode 310 is formed, the Ti film and the Al film are sequentially stacked on the n-GaN layer 303.

In this manner, the light emitting diode 350 according to the third embodiment can be produced.

According to the above-described method, the current confinement layer 301 can be formed without forming a level difference in the p-$Al_{0.70}In_{0.30}N$ layer 301x. Accordingly, stable characteristics can be obtained.

Fourth Embodiment

Figure 7:
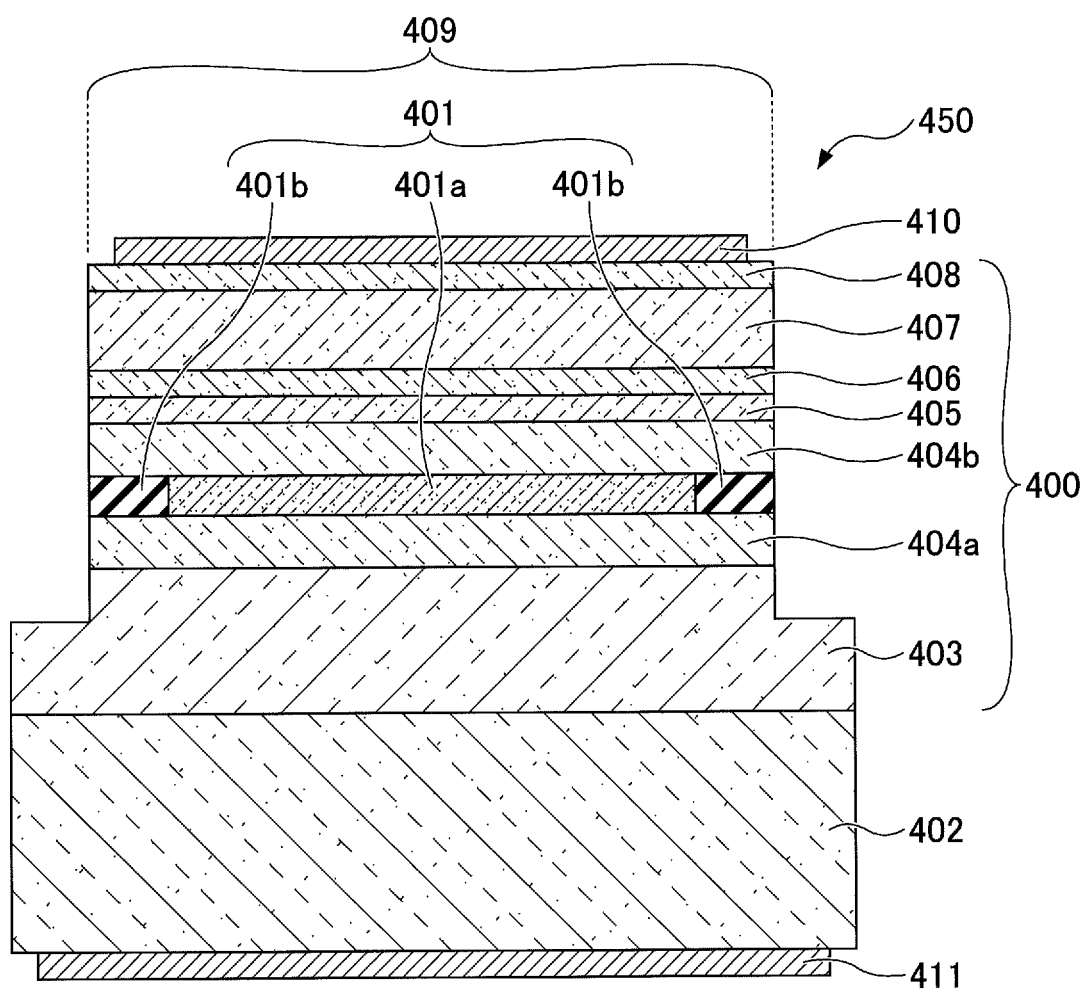
FIG. 7 is a cross-sectional view of a light emitting diode according to a fourth embodiment.

Next, a fourth embodiment will be described. The fourth embodiment relates to a light emitting diode including a nitride semiconductor multilayer structure. The light emitting diode is an example of a light emitting element. FIG. 7 is a cross-sectional view of the light emitting diode according to the fourth embodiment.

As illustrated in FIG. 7, a light emitting diode 450 according to the fourth embodiment includes an n-GaN substrate 402 and a LED structure 400 formed on the n-GaN substrate 402. The LED structure 400 includes an n-GaN layer 403, an n-$In_{0.15}Ga_{0.85}N$ layer 404a, a current confinement layer 401, an n-$In_{0.15}Ga_{0.85}N$ layer 404b, a multi-quantum well layer 405, a p-$Al_{0.20}Ga_{0.80}N$ layer 406, a p-GaN layer 407, and a $p^{++}$-GaN layer 408. The n-$In_{0.15}Ga_{0.85}N$ layer 404a is an example of a first nitride semiconductor layer, the n-$In_{0.15}Ga_{0.85}N$ layer 404b is an example of a second nitride semiconductor layer, and the current confinement layer 401 is an example of a third nitride semiconductor layer. The LED structure 400 is an example of a nitride semiconductor multilayer structure.

The n-GaN layer 403 is formed on the n-GaN substrate 402. The thickness of the n-GaN layer 403 is, for example, 2 μm.

The n-$In_{0.15}Ga_{0.85}N$ layer 404a is formed on the n-GaN layer 403. The thickness of the n-$In_{0.15}Ga_{0.85}N$ layer 404a is, for example, 50 nm.

The current confinement layer 401 is formed on the n-$In_{0.15}Ga_{0.85}N$ layer 404a. The thickness of the current confinement layer 401 is, for example, 20 nm. The current confinement layer 401 includes an n-$In_{0.20}Ga_{0.80}N$ layer 401a and an n-GaN layer 401b. The n-GaN layer 401b surrounds the n-$In_{0.20}Ga_{0.80}N$ layer 401a in a same plane. The In content of the p- n-GaN layer 401b is lower than that of the n-$In_{0.20}Ga_{0.80}N$ layer 401a. The n-$In_{0.20}Ga_{0.80}N$ layer 401a is an example of a first region, and the n-GaN layer 401b is an example of a second region.

The n-$In_{0.15}Ga_{0.85}N$ layer 404b is formed on the current confinement layer 401. The thickness of the n-$In_{0.15}Ga_{0.85}N$ layer 404b is, for example, 50 nm.

The multi-quantum well layer 405 is formed on the n-$In_{0.15}Ga_{0.85}N$ layer 404b. The multi-quantum well layer 405 has a structure including 5 periods of alternating $In_{0.25}Ga_{0.75}N$ and GaN layers. The $In_{0.25}Ga_{0.75}N$ layer has a thickness of 3 nm and the GaN layer has a thickness of 7 nm. The multi-quantum well layer 405 is an example of an active layer.

The p-$Al_{0.20}Ga_{0.80}N$ layer 406 is formed on the multi-quantum well layer 405. The thickness of the p-$Al_{0.20}Ga_{0.80}N$ layer 406 is, for example, 20 nm.

The p-GaN layer 407 is formed on the p-$Al_{0.20}Ga_{0.80}N$ layer 406. The thickness of the p-GaN layer 407 is, for example, 50 nm.

The $p^{++}$-GaN layer 408 is formed on the p-GaN layer 407. The thickness of the $p^{++}$-GaN layer 408 is, for example, 5 nm. The $p^{++}$-GaN layer 408 is doped with Mg, which serves as an acceptor, at a concentration of $1\times10^{20}$ $cm^{-3}$.

In the LED structure 400, the $p^{++}$-GaN layer 408, the p-GaN layer 407, the p-$Al_{0.20}Ga_{0.80}N$ layer 406, the multi-quantum well layer 405, the n-$In_{0.15}Ga_{0.85}N$ layer 404b, the current confinement layer 401, the n-$In_{0.15}Ga_{0.85}N$ layer 404a, and a portion of the n-GaN layer 403 are etched, thereby forming a mesa structure 409.

A p-side electrode 410 is formed on the surface of the p++-GaN layer 408. An n-side electrode 411 is formed on the bottom surface of the n-GaN substrate 402. The p-side electrode 410 has, for example, a Ni film and an Au film sequentially stacked on the p-GaN layer 408. The n-side electrode 411 has, for example, a Ti film and an Al film sequentially stacked on the n-GaN substrate 402.

In the light emitting diode 450, the current confinement layer 401 includes the n-$In_{0.20}Ga_{0.80}N$ layer 401a and the n-GaN layer 401b as described above. The band gap of the n-$In_{0.20}Ga_{0.80}N$ layer 401a is 2.65 eV, and the band gap of the n-GaN layer 401b is 3.4 eV.

Further, the band gap of each of the n-$In_{0.15}Ga_{0.85}N$ layer 404a and the n-$In_{0.15}Ga_{0.85}N$ layer 404b, which sandwich the current confinement layer 401 therebetween, is 2.83 eV. The band gap of the n-GaN layer 401b is larger, by 0.5 eV or more, than the band gap of each of the n-$In_{0.20}Ga_{0.80}N$ layer 401a, the n-$In_{0.15}Ga_{0.85}N$ layer 404a, and the n-$In_{0.15}Ga_{0.85}N$ layer 404b, which are formed in the surroundings of the n-GaN layer 401b. Accordingly, large band offsets are formed between the n-In0.15Ga0.85N layer 404b and the n-$In_{0.20}Ga_{0.80}N$ layer 401a, the n-$In_{0.15}Ga_{0.85}N$ layer 404a, and the n-In0.15Ga0.85N layer 404b. Accordingly, in the current confinement layer 401, a current is blocked by the n-GaN layer 401b and selectively flows through the n-$In_{0.20}Ga_{0.80}N$ layer 401a.

As will be described below in detail, the current confinement layer 401 can be formed without employing a nitride semiconductor layer having a level difference. Accordingly, the light emitting diode 450 including the LED structure 400 can obtain stable characteristics.

Next, a method for producing the light emitting diode 450 according to the fourth embodiment will be described. FIG. 8A through FIG. 8D are cross-sectional views illustrating the method for producing the light emitting diode 450 according to the fourth embodiment. In this producing method, the nitride semiconductor layers included in the LED structure 400 are epitaxially grown on or above the n-GaN substrate 402.

Figure 8A:
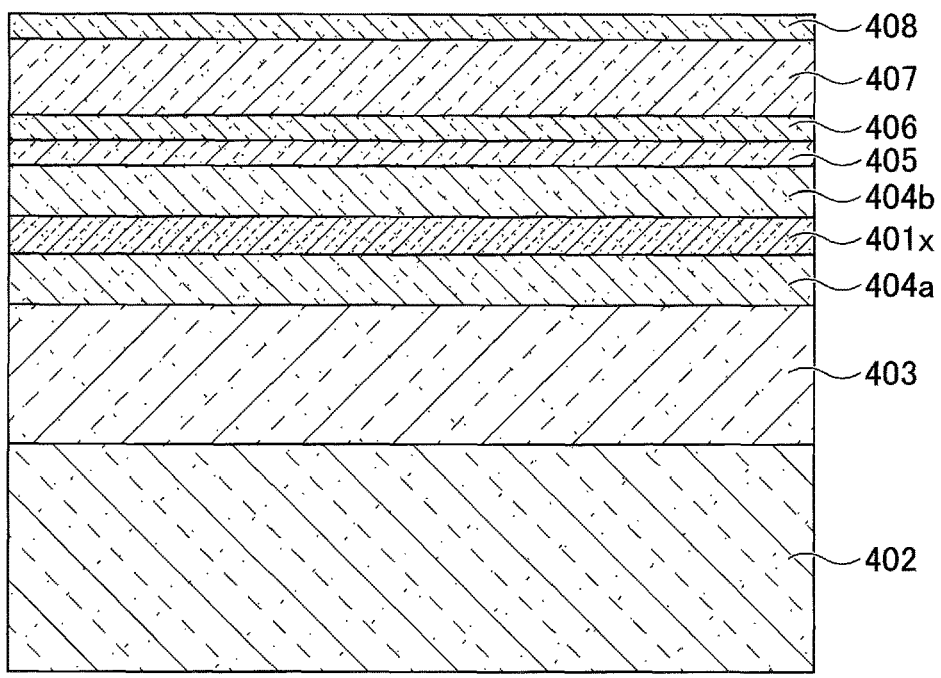
FIG. 8A is a cross-sectional view (part 1) illustrating a method for producing the light emitting diode according to the fourth embodiment.

First, the MOCVD apparatus is used to sequentially form the n-GaN layer 403, the n-$In_{0.15}Ga_{0.85}N$ layer 404a, an n-$In_{0.20}Ga_{0.80}N$ layer 401x, the n-$In_{0.15}Ga_{0.85}N$ layer 404b, the multi-quantum well layer 405, the p-$Al_{0.20}Ga_{0.80}N$ layer 406, the p-GaN layer 407, and the $p^{++}$-GaN layer 408 on the n-GaN substrate 402, as illustrated in FIG. 8A.

Figure 8B:
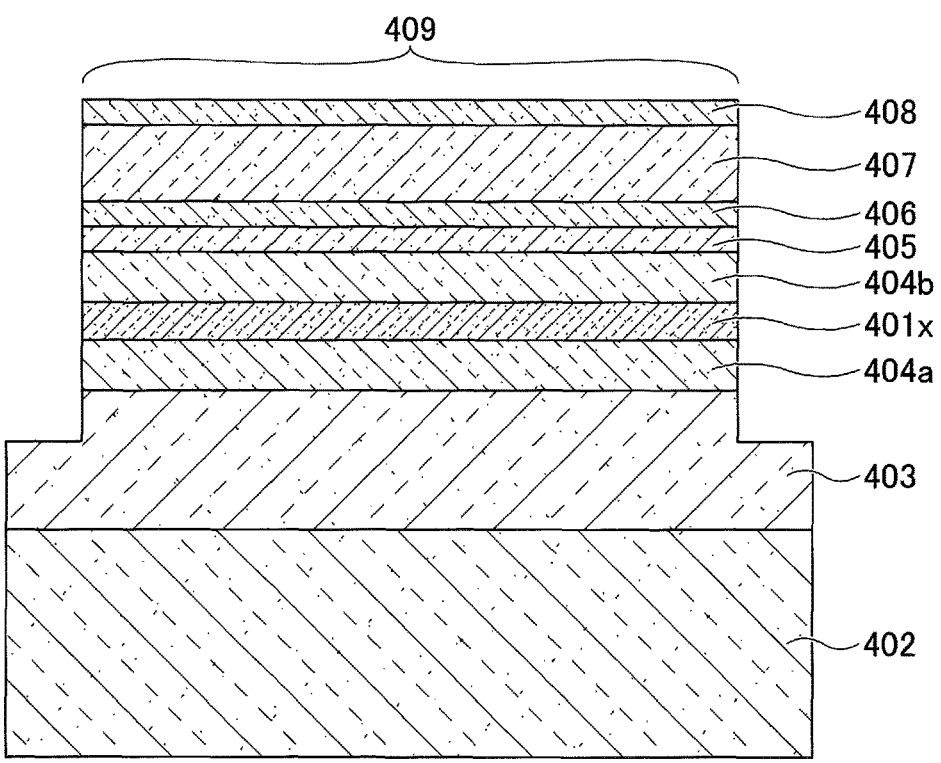
FIG. 8B is a cross-sectional view (part 2) illustrating the method for producing the light emitting diode according to the fourth embodiment.

Next, a structure illustrated in FIG. 8A is removed from the MOCVD apparatus, and the $p^{++}$-GaN layer 408, the p-GaN layer 407, the p-$Al_{0.20}Ga_{0.80}N$ layer 406, the multi-quantum well layer 405, the n-$In_{0.15}Ga_{0.85}N$ layer 404b, the n-$In_{0.20}Ga_{0.80}N$ layer 401x, the n-$In_{0.15}Ga_{0.85}N$ layer 404a, and a portion of the n-GaN layer 403 are removed by lithography and dry etching, thereby forming the mesa structure 409 as illustrated in FIG. 8B.

Figure 8C:
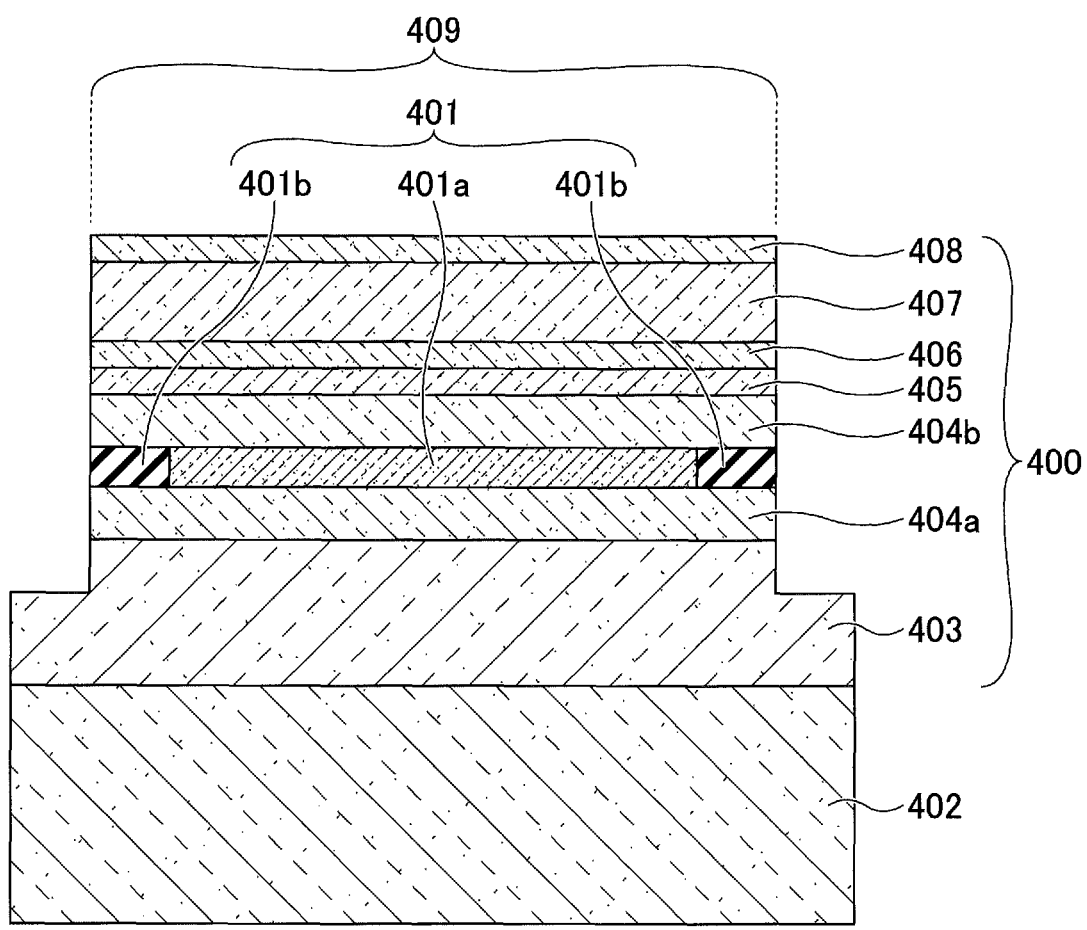
FIG. 8C is a cross-sectional view (part 3) illustrating the method for producing the light emitting diode according to the fourth embodiment.
Figure 8D:
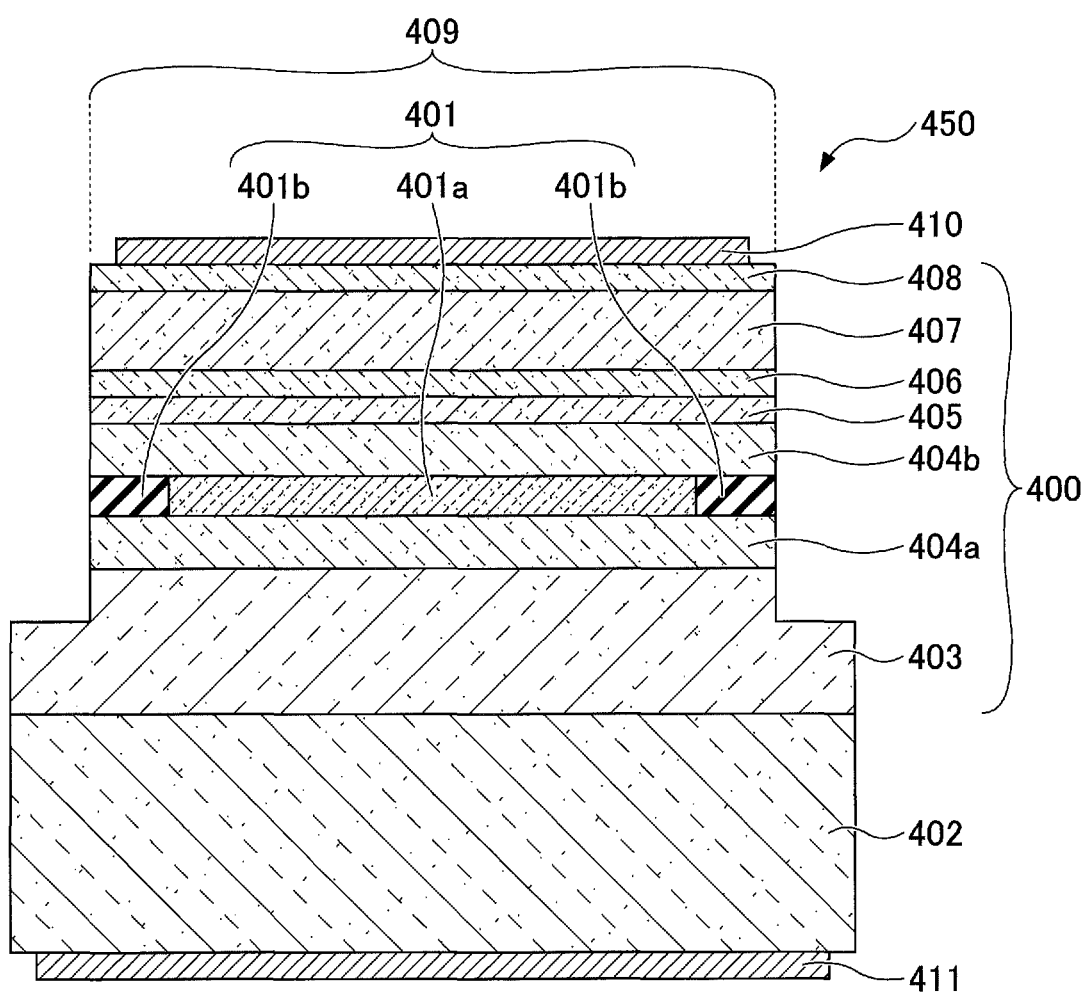
FIG. 8D is a cross-sectional view (part 4) illustrating the method for producing the light emitting diode according to the fourth embodiment.

Next, a structure illustrated in FIG. 8B is placed in the heat treatment apparatus, and heat treatment is performed at a temperature of 750° C. in a mixed gas atmosphere of hydrogen and ammonia. The heat treatment time is set to 5 minutes, for example. By the heat treatment, hydrogen penetrates the n-$In_{0.20}Ga_{0.80}N$ layer 401x from the side walls, and also In included in the n-$In_{0.20}Ga_{0.80}N$ layer 401x is evaporated from the side walls. As a result, as illustrated in FIG. 8C, a portion of the n-$In_{0.20}Ga_{0.80}N$ layer 401x in the vicinity of the side walls becomes the n-GaN layer 401b. The remainder of the n-$In_{0.20}Ga_{0.80}N$ layer 401x becomes the n-$In_{0.20}Ga_{0.80}N$ layer 401a whose In content remains unchanged from that of the n-$In_{0.20}Ga_{0.80}N$ layer 401x. In this manner, the current confinement layer 401 including the n-$In_{0.20}Ga_{0.80}N$ layer 401a and the n-GaN layer 401b is formed. For example, the n-GaN layer 401b is formed within a range of approximately 1 μm from the side walls.

Next, a structure illustrated in FIG. 8C is removed from the heat treatment apparatus, and activation annealing of the acceptor is performed. Next, the p-side electrode 410 is formed on the surface of the $p^{++}$-GaN layer 408, and the n-side electrode 411 is formed on the bottom surface of the n-GaN substrate 402. For example, when the p-side electrode 410 is formed, the Ni film and the Au film are sequentially stacked on the $p^{++}$-GaN layer 408. For example, when the n-side electrode 411 is formed, the Ti film and the Al film are sequentially stacked on the n-GaN substrate 402.

In this manner, the light emitting diode 450 according to the fourth embodiment can be produced.

According to the above-described method, the current confinement layer 401 can be formed without forming a level difference in the n-$In_{0.20}Ga_{0.80}N$ layer 401x. Accordingly, stable characteristics can be obtained.

Note that the mesa structure 409 may be formed to the extent that at least the side walls of the n-$In_{0.20}Ga_{0.80}N$ layer 401x are exposed.

Further, the In content is not required to be sharply and discontinuously changed between the n-$In_{0.20}Ga_{0.80}N$ layer 401a and the n-GaN layer 401b. A region in which the In content continuously changes may be present between the n-$In_{0.20}Ga_{0.80}N$ layer 401a and the n-GaN layer 401b.

Fifth Embodiment

Figure 9:
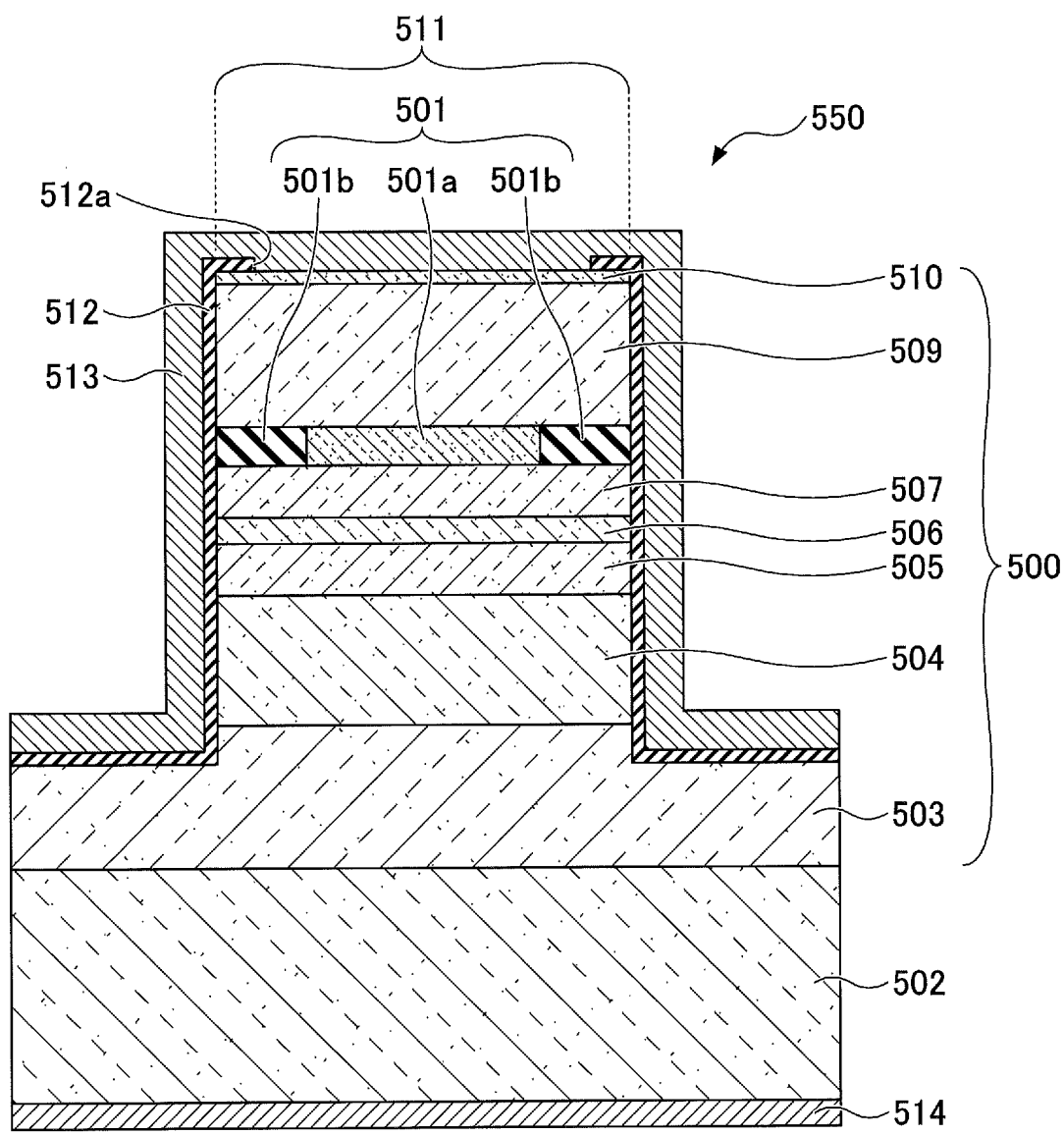
FIG. 9 is a cross-sectional view of an edge-emitting laser according to a fifth embodiment.

Next, a fifth embodiment will be described. The fifth embodiment relates to an edge-emitting laser including a nitride semiconductor multilayer structure. The edge-emitting laser is an example of a light emitting element. FIG. 9 is a cross-sectional view of the edge-emitting laser according to the fifth embodiment.

As illustrated in FIG. 9, an edge-emitting laser 550 according to the fifth embodiment includes an n-GaN substrate 502 and a laser structure 500 formed on the n-GaN substrate 502. The laser structure 500 includes an n-GaN layer 503, an n-$Al_{0.05}Ga_{0.95}N$ layer 504, a GaN layer 505, a multi-quantum well layer 506, a p-GaN layer 507, a current confinement layer 501, a p-$Al_{0.05}Ga_{0.95}N$ layer 509, and a $p^{++}$-GaN layer 510. The p-GaN layer 507 is an example of a first nitride semiconductor layer, the p-$Al_{0.05}Ga_{0.95}N$ layer 509 is an example of a second nitride semiconductor layer, and the current confinement layer 501 is an example of a third nitride semiconductor layer. The laser structure 500 is an example of a nitride semiconductor multilayer structure.

The n-GaN layer 503 is formed on the n-GaN substrate 502. The thickness of the n-GaN layer 503 is, for example, 1 μm.

The n-$Al_{0.05}Ga_{0.95}N$ layer 504 is formed on the n-GaN layer 503. The thickness of the n-$Al_{0.05}Ga_{0.95}N$ layer 504 is, for example, 500 nm.

The GaN layer 505 is formed on the n-$Al_{0.05}Ga_{0.95}N$ layer 504. The thickness of the GaN layer 505 is, for example, 100 nm.

The multi-quantum well layer 506 is formed on the GaN layer 505. The multi-quantum well layer 506 has a structure including 3 periods of alternating $In_{0.10}Ga_{0.90}N$ and GaN layers. The $In_{0.10}Ga_{0.90}N$ layer has a thickness of 2.5 nm and the GaN layer has a thickness of 7.5 nm. The multi-quantum well layer 506 is an example of an active layer.

The p-GaN layer 507 is formed on the multi-quantum well layer 506. The thickness of the p-GaN layer 507 is, for example, 100 nm.

The current confinement layer 501 is formed on the p-GaN layer 507. The thickness of the current confinement layer 501 is, for example, 20 nm. The current confinement layer 501 includes a p-$Al_{0.75}In_{0.25}N$ layer 501a and a p-AlN layer 501b. The p-AlN layer 501b surrounds the p-$Al_{0.75}In_{0.25}N$ layer 501a in a same plane. The In content of the p-AlN layer 501b is lower than that of the p-$Al_{0.75}In_{0.25}N$ layer 501a. The p-$Al_{0.75}In_{0.25}N$ layer 501a is an example of a first region, and the p-AlN layer 501b is an example of a second region.

The p-$Al_{0.05}Ga_{0.95}N$ layer 509 is formed on the current confinement layer 501. The thickness of the p-$Al_{0.05}Ga_{0.95}N$ layer 509 is, for example, 500 nm.

The $p^{++}$-GaN layer 510 is formed on the p-$Al_{0.05}Ga_{0.95}N$ layer 509. The thickness of the $p^{++}$-GaN layer 510 is, for example, 5 nm. The $p^{++}$-GaN layer 510 is doped with Mg, which serves as an acceptor, at a concentration of $1 \times 10^{20}$ $cm^{-3}$.

In the laser structure 500, the $p^{++}$-GaN layer 510, the p-$Al_{0.05}Ga_{0.95}N$ layer 509, the current confinement layer 501, the p-GaN layer 507, the multi-quantum well layer 506, the GaN layer 505, the n-$Al_{0.05}Ga_{0.95}N$ layer 504, and a portion of the n-GaN layer 503 are etched, thereby forming a stripe-shaped mesa structure 511 having, for example, a width of 30 μm.

A SiN film 512, serving as a passivation film, is formed so as to cover the top surface and the side surfaces of the mesa structure 511 and also the top surface of the n-GaN layer 503. The SiN film 512 has an opening 512a that exposes a portion of the top surface of the $p^{++}$-GaN layer 510. For example, the p-$Al_{0.75}In_{0.25}N$ layer 501a is located inward relative to the opening 512a in plan view.

A p-side electrode 513 is formed on the surface of the $p^{++}$-GaN layer 510. The p-side electrode 513 is formed so as to extend along the surface of the SiN film 512, for example. An n-side electrode 514 is formed on the bottom surface of the n-GaN substrate 502. The p-side electrode 513 has, for example, a Ni film and an Au film sequentially stacked on the $p^{++}$-GaN layer 510. The n-side electrode 514 has, for example, a Ti film and an Al film sequentially stacked on the n-GaN substrate 502.

In the edge-emitting laser 550, the current confinement layer 501 includes the p-$Al_{0.75}In_{0.25}N$ layer 501a and the p-AlN layer 501b as described above. The band gap of the p-$Al_{0.75}In_{0.25}N$ layer 501a is 3.97 eV, and the band gap of the p-AlN layer 501b is 6.2 eV. Further, the p-GaN layer 507 and the p-$Al_{0.05}Ga_{0.95}N$ layer 509, which sandwich the current confinement layer 501 therebetween, have band gaps of 3.4 eV and 3.51 eV, respectively. The band gap of the p-AlN layer 501b is larger, by 1.0 eV or more, than the band gap of each of the p-$Al_{0.75}In_{0.25}N$ layer 501a, the p-GaN layer 507, and the p-$Al_{0.05}Ga_{0.95}N$ layer 509, which are formed in the surroundings of the p-AlN layer 501b. Accordingly, large band offsets are formed between the p-AlN layer 501b and the p-$Al_{0.75}In_{0.25}N$ layer 501a, the p-GaN layer 507, and the p-$Al_{0.05}Ga_{0.95}N$ layer 509. Accordingly, in the current confinement layer 501, a current is blocked by the p-AlN layer 501b and selectively flows through the p-$Al_{0.75}In_{0.25}N$ layer 501a.

As will be described below in detail, the current confinement layer 501 can be formed without employing a nitride semiconductor layer having a level difference. Accordingly, the edge-emitting laser 550 including the laser structure 500 can obtain stable characteristics.

Further, the refractive index of the p-AlN layer 501b is lower than the refractive index of the p-$Al_{0.75}In_{0.25}N$ layer 501a. Accordingly, it is possible to obtain a light confinement effect in the in-plane direction of the substrate.

Further, the band gap of the p-$Al_{0.75}In_{0.25}N$ layer 501a is larger than the band gaps of the p-GaN layer 507 and the p-$Al_{0.05}Ga_{0.95}N$ layer 509. Therefore, the p-$Al_{0.75}In_{0.25}N$ layer 501a may function as an electron blocking layer that prevents the leakage of electrons from the multi-quantum well layer 506 toward the p-$Al_{0.05}Ga_{0.95}N$ layer 509.

Next, a method for producing the edge-emitting laser 550 according to the fifth embodiment will be described. FIG. 10A through FIG. 10D are cross-sectional views illustrating the method for producing the edge-emitting laser 550 according to the fifth embodiment. In this producing method, the nitride semiconductor layers included in the laser structure 500 are epitaxially grown on the n-GaN substrate 502.

Figure 10A:
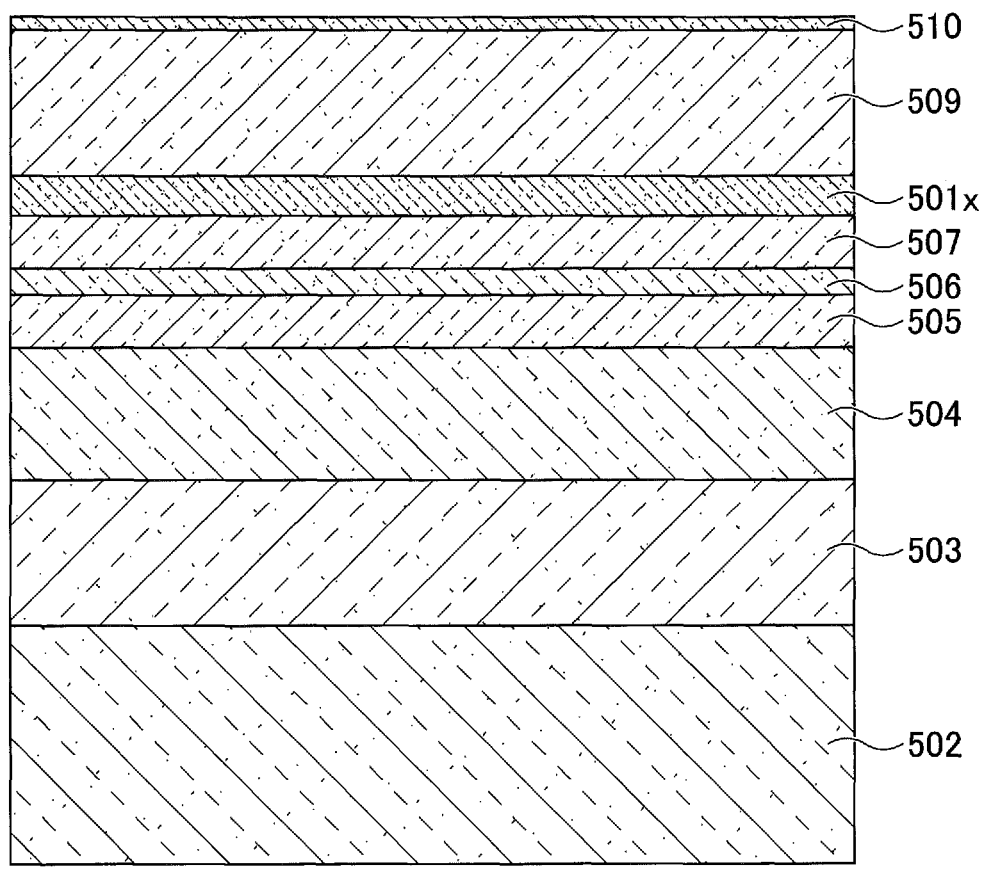
FIG. 10A is a cross-sectional view (part 1) illustrating a method for producing the edge-emitting laser according to the fifth embodiment.

First, the MOCVD apparatus is used to sequentially form the n-GaN layer 503, the n-$Al_{0.05}Ga_{0.95}N$ layer 504, the GaN layer 505, the multi-quantum well layer 506, the p-GaN layer 507, a p-$Al_{0.75}In_{0.25}N$ layer 501x, the p-$Al_{0.05}Ga_{0.95}N$ layer 509, and the $p^{++}$-GaN layer 510 on or above the n-GaN substrate 502, as illustrated in FIG. 10A.

Figure 10B:
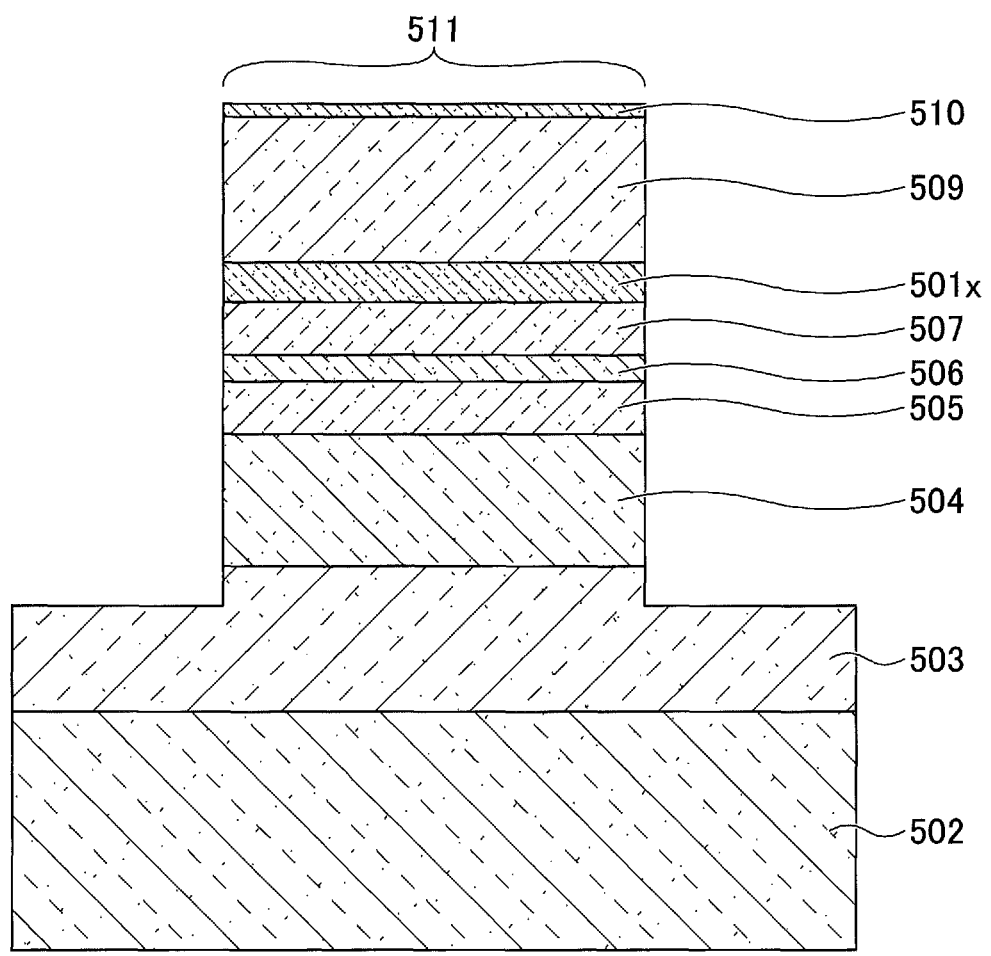
FIG. 10B is a cross-sectional view (part 2) illustrating the method for producing the edge-emitting laser according to the fifth embodiment.

Next, a structure illustrated in FIG. 10A is removed from the MOCVD apparatus, and the $p^{++}$-GaN layer 510, the p-$Al_{0.05}Ga_{0.95}N$ layer 509, the p-$Al_{0.75}In_{0.25}N$ layer 501x, the p-GaN layer 507, the multi-quantum well layer 506, the GaN layer 505, the n-$Al_{0.05}Ga_{0.95}N$ layer 504, and a portion of the n-GaN layer 503 are removed by lithography and dry etching, thereby forming the stripe-shaped mesa structure 511, as illustrated in FIG. 10B.

Figure 10C:
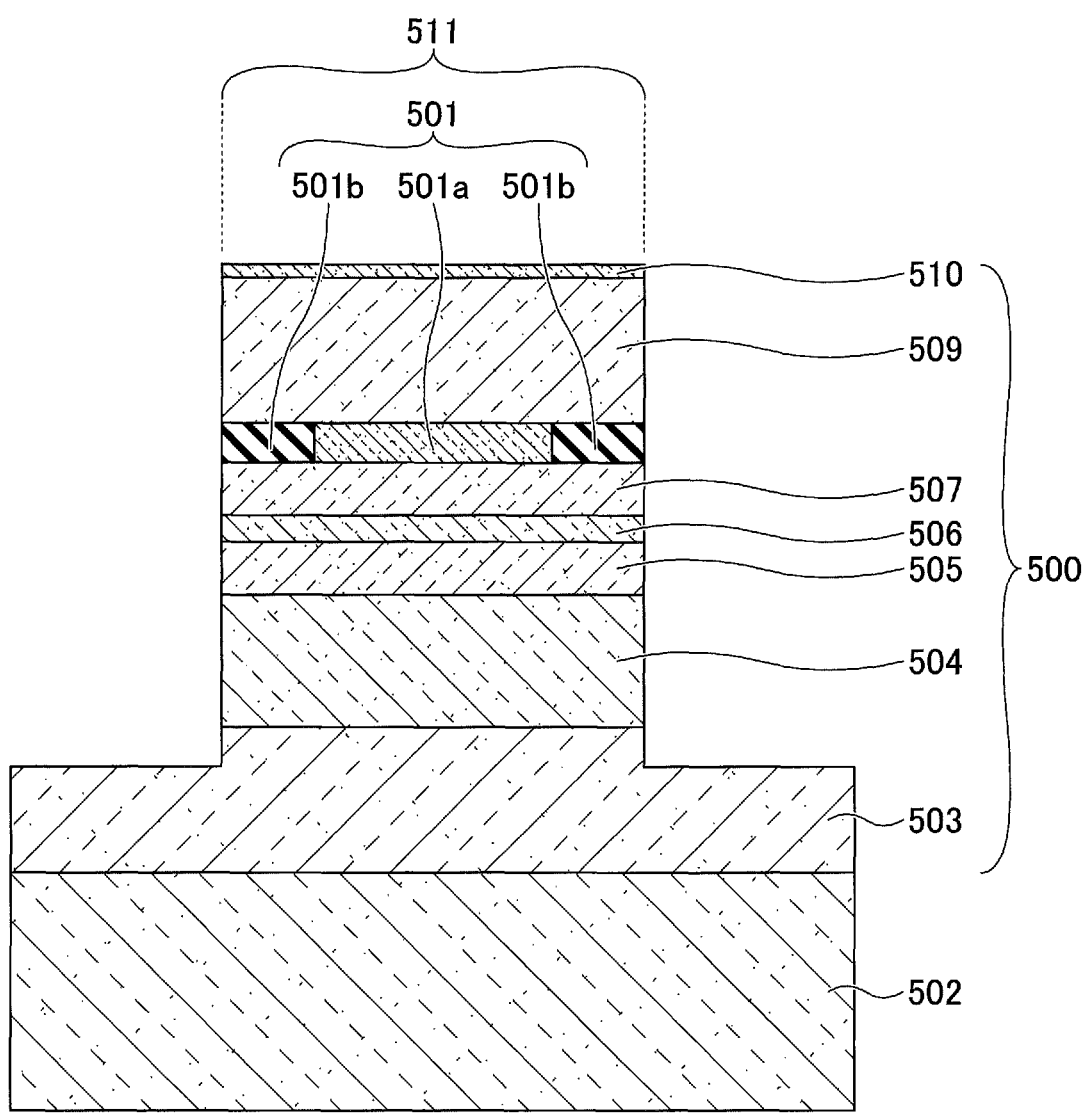
FIG. 10C is a cross-sectional view (part 3) illustrating the method for producing the edge-emitting laser according to the fifth embodiment.

Next, a structure illustrated in FIG. 10B is placed in the heat treatment apparatus, and heat treatment is performed at a temperature of 800° C. in a mixed gas atmosphere of hydrogen and ammonia. The heat treatment time is set to 10 minutes, for example. By the heat treatment, hydrogen penetrates the p-$Al_{0.75}In_{0.25}N$ layer 501x from the side walls, and also In included in the p-$Al_{0.75}In_{0.25}N$ layer 501x is evaporated from the side walls. As a result, as illustrated in FIG. 10C, a portion of the p-$Al_{0.75}In_{0.25}N$ layer 501x in the vicinity of the side walls becomes the p-AlN layer 501b. The remainder of the p-$Al_{0.75}In_{0.25}N$ layer 501x becomes the p-$Al_{0.75}In_{0.25}N$ layer 501a whose In content remains unchanged from that of the p-$Al_{0.75}In_{0.25}N$ layer 501x. In this manner, the current confinement layer 501 including the p-$Al_{0.75}In_{0.25}N$ layer 501a and the p-AlN layer 501b is formed. For example, the p-AlN layer 501b may be formed within a range of approximately 5 μm from the side walls, and the p-$Al_{0.75}In_{0.25}N$ layer 501a has a width of approximately 20 μm.

Figure 10D:
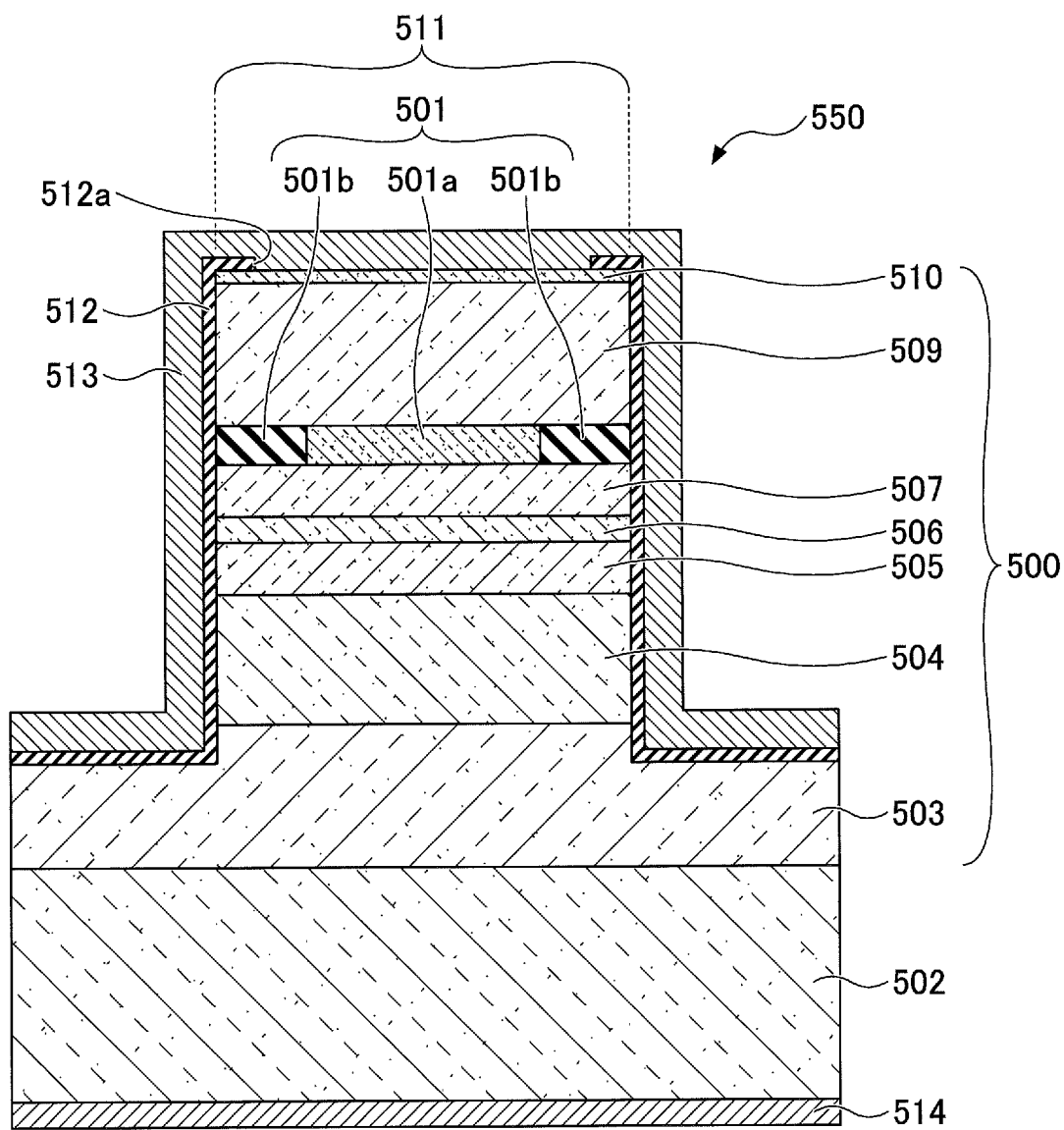
FIG. 10D is a cross-sectional view (part 4) illustrating the method for producing the edge-emitting laser according to the fifth embodiment.

Next, a structure illustrated in FIG. 10C is removed from the heat treatment apparatus, and activation annealing of the acceptor is performed. Next, as illustrated in FIG. 10D, the SiN film 512 is formed so as to cover the top surface and the side surfaces of the mesa structure 511 and also the top surface of the n-GaN layer 503. Then, the opening 512a that exposes a portion of the top surface of the $p^{++}$-GaN layer 510 is formed on the SiN film 512. Next, the p-side electrode 513 is formed on the top surface of the $p^{++}$-GaN layer 510, and is also formed so as to extend along the surface of the SiN film 512. The n-side electrode 514 is formed on the bottom surface of the n-GaN substrate 502. For example, when the p-side electrode 513 is formed, the Ni film and the Au film are sequentially stacked on the $p^{++}$-GaN layer 510. For example, when the n-side electrode 514 is formed, the Ti film and the Al film are sequentially stacked on the n-GaN substrate 502.

In this manner, the edge-emitting laser 550 according to the fifth embodiment can be produced.

According to the above-described method, the current confinement layer 501 can be formed without forming a level difference in the p-$Al_{0.75}In_{0.25}N$ layer 501x. Accordingly, stable characteristics can be obtained.

Note that the mesa structure 511 may be formed to the extent that at least the side walls of the p-$Al_{0.75}In_{0.25}N$ layer 501x are exposed.

Further, the In content is not required to be sharply and discontinuously changed between the p-$Al_{0.75}In_{0.25}N$ layer 501a and the p-AlN layer 501b. A region in which the In content continuously changes may be present between the p-$Al_{0.75}In_{0.25}N$ layer 501a and the p-AlN layer 501b.

Sixth Embodiment

Figure 11:
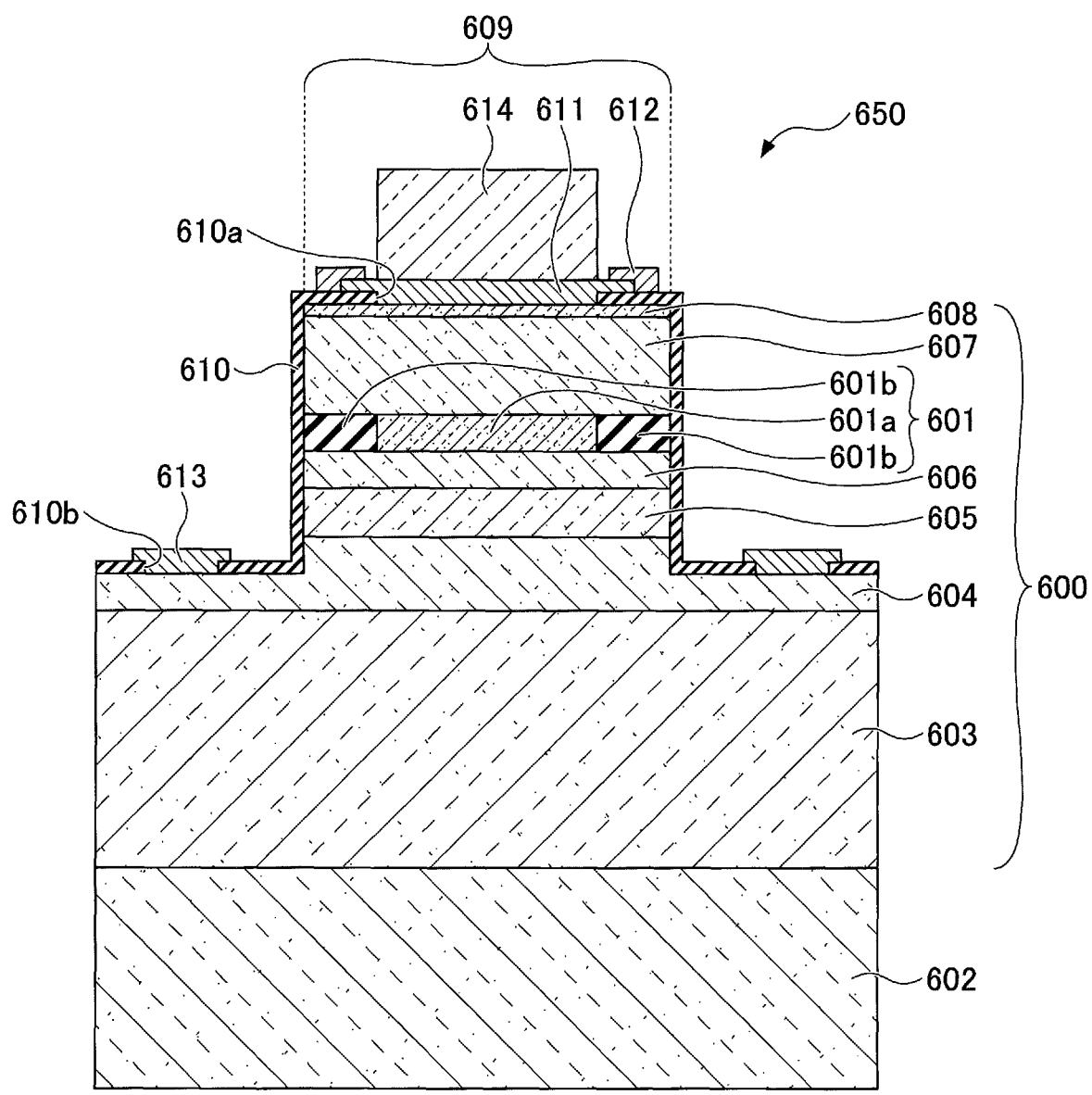
FIG. 11 is a cross-sectional view of a surface-emitting laser according to a sixth embodiment.

Next, a sixth embodiment will be described. The sixth embodiment relates to a surface-emitting laser including a nitride semiconductor multilayer structure. The surface-emitting laser is an example of a light emitting element. FIG. 11 is a cross-sectional view of the surface-emitting laser according to the sixth embodiment.

As illustrated in FIG. 11, a surface-emitting laser 650 according to the sixth embodiment includes an n-GaN substrate 602 and a laser structure 600 formed on the n-GaN substrate 602. The laser structure 600 includes a lower multilayer film reflector 603, an n-GaN layer 604, a multi-quantum well layer 605, a p-$Al_{0.20}Ga_{0.80}N$ layer 606, a current confinement layer 601, a p-GaN layer 607, and a $p^{++}$-GaN layer 608. The p-$Al_{0.20}Ga_{0.80}N$ layer 606 is an example of a first nitride semiconductor layer, the p-GaN layer 607 is an example of a second nitride semiconductor layer, and the current confinement layer 601 is an example of a third nitride semiconductor layer. The laser structure 600 is an example of a nitride semiconductor multilayer structure.

The lower multilayer film reflector 603 is formed on the n-GaN substrate 602. The lower multilayer film reflector 603 has a structure including 46 periods of alternating high refractive index and low refractive index layers. The high refractive index layer is, for example, an $In_{0.05}Ga_{0.95}N$ layer having a thickness of 50 nm. The low refractive index layer has a multilayer structure in which two AlN layers having a thickness of 6 nm are inserted between three GaN layers having a thickness of 6 nm.

The n-GaN layer 604 is formed on the lower multilayer film reflector 603. The thickness of the n-GaN layer 604 is, for example, 1.1 μm.

The multi-quantum well layer 605 is formed on the n-GaN layer 604. The multi-quantum well layer 605 has a structure including 5 periods of alternating $In_{0.10}Ga_{0.90}N$ and GaN layers. The $In_{0.10}Ga_{0.90}N$ layer has a thickness of 4 nm and the GaN layer has a thickness of 6 nm. The multi-quantum well layer 605 is an example of an active layer.

The p-$Al_{0.20}Ga_{0.80}N$ layer 606 is formed on the multi-quantum well layer 605. The thickness of the p-$Al_{0.20}Ga_{0.80}N$ layer 606 is, for example, 20 nm.

The current confinement layer 601 is formed on the p-$Al_{0.20}Ga_{0.80}N$ layer 606. The thickness of the current confinement layer 601 is, for example, 35 nm. The current confinement layer 601 includes a p-$Al_{0.70}In_{0.30}N$ layer 601a and a p-$Al_{0.90}In_{0.10}N$ layer 601b. The p-$Al_{0.90}In_{0.10}N$ layer 601b surrounds the p-$Al_{0.70}In_{0.30}N$ layer 601a in a same plane. The In content of the p-$Al_{0.90}In_{0.10}N$ layer 601b is lower than that of the p-$Al_{0.70}In_{0.30}N$ layer 601a. The p-$Al_{0.70}In_{0.30}N$ layer 601a is an example of a first region, and the p-$Al_{0.90}In_{0.10}N$ layer 601b is an example of a second region.

The p-GaN layer 607 is formed on the current confinement layer 601. The thickness of the p-GaN layer 607 is, for example, 75 nm.

The p$^{++}$-GaN layer 608 is formed on the p-GaN layer 607. The thickness of the p$^{++}$-GaN layer 608 is, for example, 5 nm. The p$^{++}$-GaN layer 608 is doped with Mg, which serves as an acceptor, at a concentration of $1 \times 10^{20}$ $cm^{-3}$.

In the laser structure 600, the p$^{++}$-GaN layer 608, the p-GaN layer 607, the current confinement layer 601, the p-$Al_{0.20}Ga_{0.80}N$ layer 606, the multi-quantum well layer 605, and a portion of the n-GaN layer 604 are etched, thereby forming a circular-shaped mesa structure 609 in plan view.

A SiN film 610, serving as a passivation film, is formed so as to cover the top surface and the side surfaces of the mesa structure 609 and also the top surface of the n-GaN layer 604. The SiN film 610 has an opening 610a that exposes a portion of the top surface of the p$^{++}$-GaN layer 608, and also has an opening 610b that exposes a portion of the top surface of the n-GaN layer 604. For example, the p-$Al_{0.70}In_{0.30}N$ layer 601a is located inward relative to the opening 610a in plan view.

An indium tin oxide (ITO) film 611 is formed on the surface of the p$^{++}$-GaN layer 608 through the opening 610a while partially extending onto the SiN film 610. At the upper side of the mesa structure 609, an upper electrode 612 having a ring shape in plan view is formed on the SiN film 610 and on the ITO film 611. A dielectric distributed Bragg reflector (DBR) 614 is formed on the ITO film 611 so as to be located inward relative to the upper electrode 612. A lower electrode 613 is formed on the n-GaN layer 604 through the opening 610b while partially extending onto the SiN film 610. The upper electrode 612 has, for example, a Ti film and an Au film sequentially stacked on the SiN film 610 and the ITO film 611. The lower electrode 613 has, for example, a Ti film and an Al film sequentially stacked on the n-GaN layer 604. The DBR 614 includes a tantalum oxide film ($Ta_2O_5$ film) and a $SiO_2$ film. The lower multilayer film reflector 603 and the DBR 614 are included in a resonator structure.

In the surface-emitting laser 650, the current confinement layer 601 includes the p-$Al_{0.70}In_{0.30}N$ layer 601a and the p-$Al_{0.90}In_{0.10}N$ layer 601b as described above. The band gap of the p-$Al_{0.70}In_{0.30}N$ layer 601a is 3.59 eV, and the band gap of the p-$Al_{0.90}In_{0.10}N$ layer 601b is 5.24 eV. Further, the p-$Al_{0.20}Ga_{0.80}N$ layer 606 and the p-GaN layer 607, which sandwich the current confinement layer 601 therebetween, have band gaps of 3.85 eV and 3.4 eV, respectively. The band gap of the p-$Al_{0.90}In_{0.10}N$ layer 601b is larger, by 1.0 eV or more, than the band gap of each of the p-$Al_{0.70}In_{0.30}N$ layer 601a, the p-$Al_{0.20}Ga_{0.80}N$ layer 606, and the p-GaN layer 607, which are formed in the surroundings of the p-$Al_{0.90}In_{0.10}N$ layer 601b. Accordingly, large band offsets are formed between the p-$Al_{0.90}In_{0.10}N$ layer 601b and the p-$Al_{0.70}In_{0.30}N$ layer 601a, the p-$Al_{0.20}Ga_{0.80}N$ layer 606, and the p-GaN layer 607. Accordingly, in the current confinement layer 601, a current is blocked by the p-$Al_{0.90}In_{0.10}N$ layer 601b and selectively flows through the p-$Al_{0.70}In_{0.30}N$ layer 601a.

As will be described below in detail, the current confinement layer 601 can be formed without employing a nitride semiconductor layer having a level difference. Accordingly, the surface-emitting laser 650 including the laser structure 600 can obtain stable characteristics.

Further, the refractive index of the p-$Al_{0.90}In_{0.10}N$ layer 601b is lower than the refractive index of the p-$Al_{0.70}In_{0.30}N$ layer 601a. Accordingly, it is possible to obtain a light confinement effect in the in-plane direction of the substrate.

Next, a method for producing the surface-emitting laser 650 according to the sixth embodiment will be described. FIG. 12A through FIG. 12D are cross-sectional views illustrating the method for producing the surface-emitting laser 650 according to the sixth embodiment. In this producing method, the nitride semiconductor layers included in the laser structure 600 are epitaxially grown on the n-GaN substrate 602.

Figure 12A:
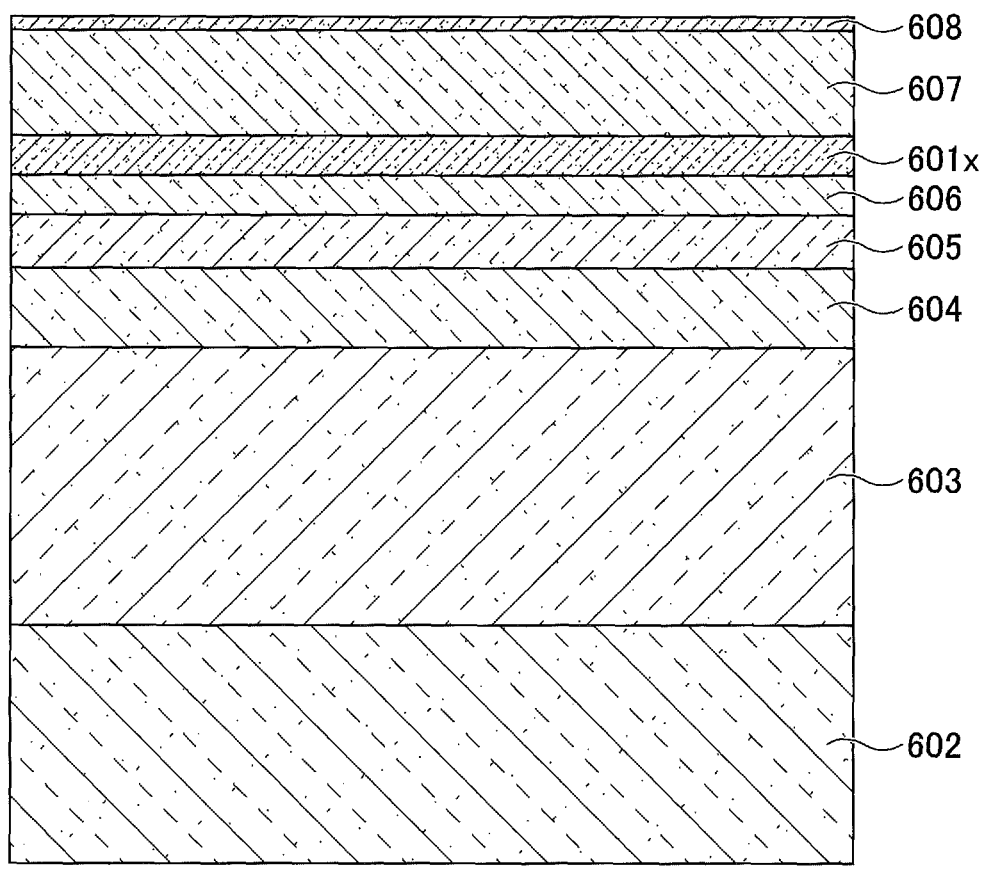
FIG. 12A is a cross-sectional view (part 1) illustrating a method for producing the surface-emitting laser according to the sixth embodiment.

First, the MOCVD apparatus is used to sequentially form the lower multilayer film reflector 603, the n-GaN layer 604, the multi-quantum well layer 605, the p-$Al_{0.20}Ga_{0.80}N$ layer 606, a p-$Al_{0.70}In_{0.30}N$ layer 601x, the p-GaN layer 607, and the p$^{++}$-GaN layer 608 on or above the n-GaN substrate 602, as illustrated in FIG. 12A.

Figure 12B:
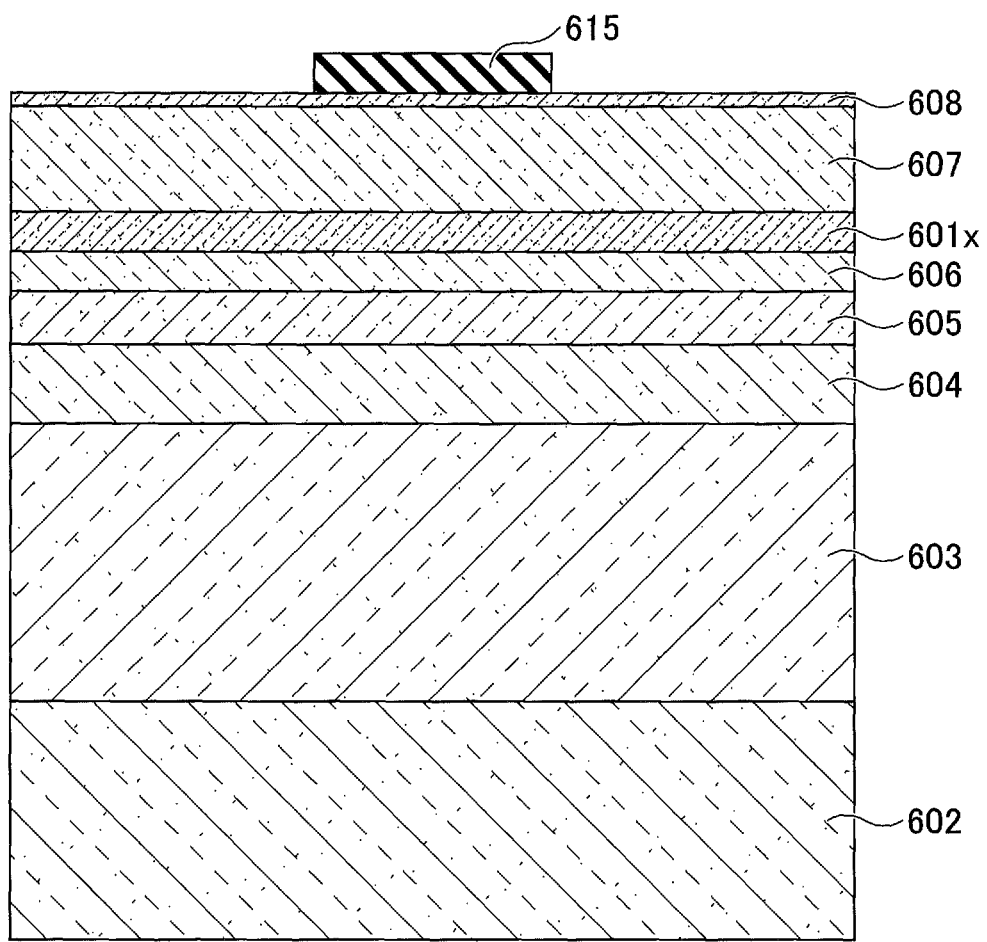
FIG. 12B is a cross-sectional view (part 2) illustrating the method for producing the surface-emitting laser according to the sixth embodiment.

Next, a structure illustrated in FIG. 12A is removed from the MOCVD apparatus, and a $SiO_2$ film 615 having a diameter of 10 and a thickness of 100 nm is formed on the p$^{++}$-GaN layer 608, as illustrated in FIG. 12B. The $SiO_2$ film 615 serves as a protective mask that covers a region where the p-$Al_{0.70}In_{0.30}N$ layer 601a is to be formed. The $SiO_2$ film 615 may be formed by photolithography, for example.

Figure 12C:
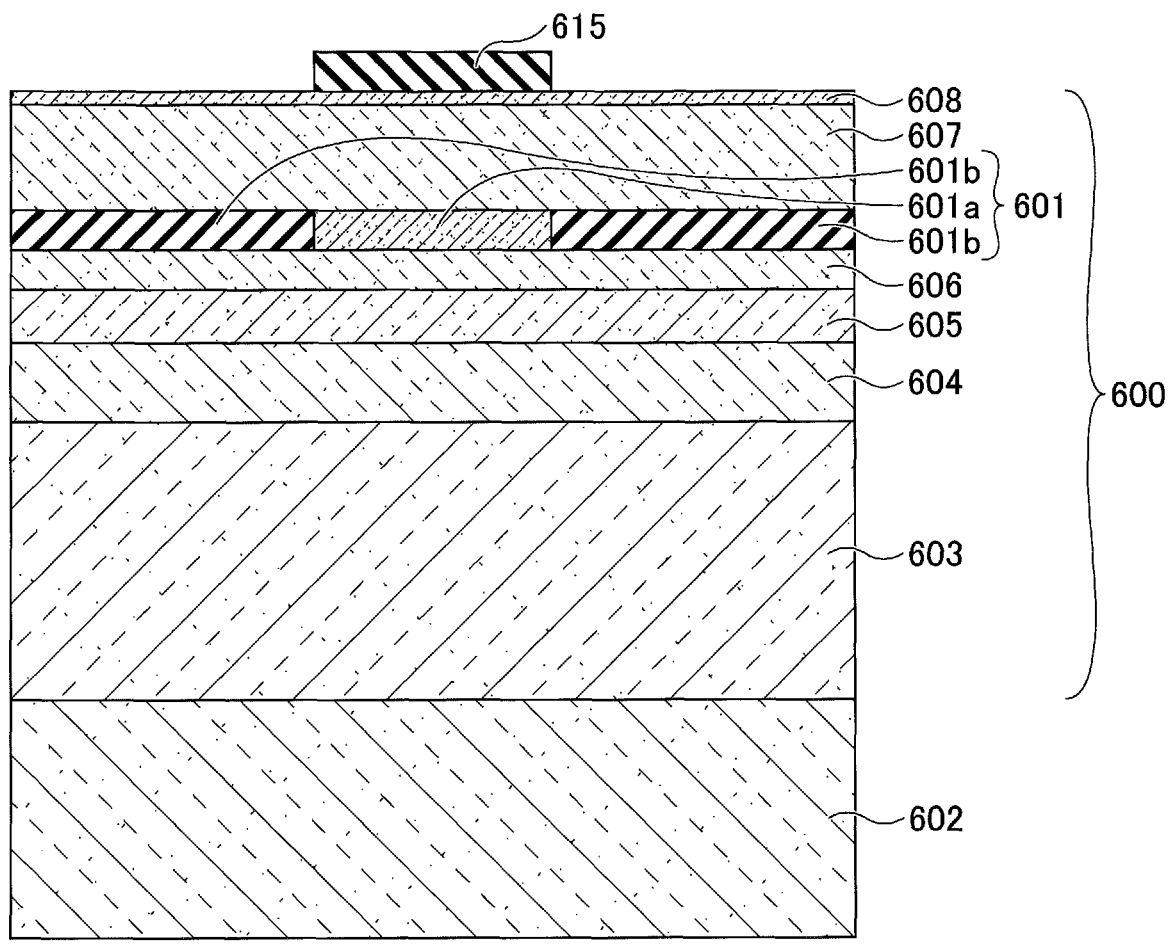
FIG. 12C is a cross-sectional view (part 3) illustrating the method for producing the surface-emitting laser according to the sixth embodiment.

Next, a structure illustrated in FIG. 12C is placed in the MOCVD apparatus, and heat treatment is performed at a temperature of 800° C. in a mixed gas atmosphere of hydrogen and ammonia. The heat treatment time is set to 30 minutes, for example. By the heat treatment, hydrogen penetrates a portion of the p-$Al_{0.70}In_{0.30}N$ layer 601x not covered by the $SiO_2$ film 615, and also In is evaporated from the portion of the p-$Al_{0.70}In_{0.30}N$ layer 601x. The amount of In evaporated from the p-$Al_{0.70}In_{0.30}N$ layer 601x can be controlled by the thickness of the p-GaN layer 607. As a result, as illustrated in FIG. 12C, the portion of the p-$Al_{0.70}In_{0.30}N$ layer 601x not covered by the $SiO_2$ film 615 becomes the p-$Al_{0.90}In_{0.10}N$ layer 601b. The remainder of the p-$Al_{0.70}In_{0.30}N$ layer 601x becomes the p-$Al_{0.70}In_{0.30}N$ layer 601a whose In content remains unchanged from that of the p-$Al_{0.70}In_{0.30}N$ layer 601x. In this manner, the current confinement layer 601 including the p-$Al_{0.70}In_{0.30}N$ layer 601a and the p-$Al_{0.90}In_{0.10}N$ layer 601b is formed.

Figure 12D:
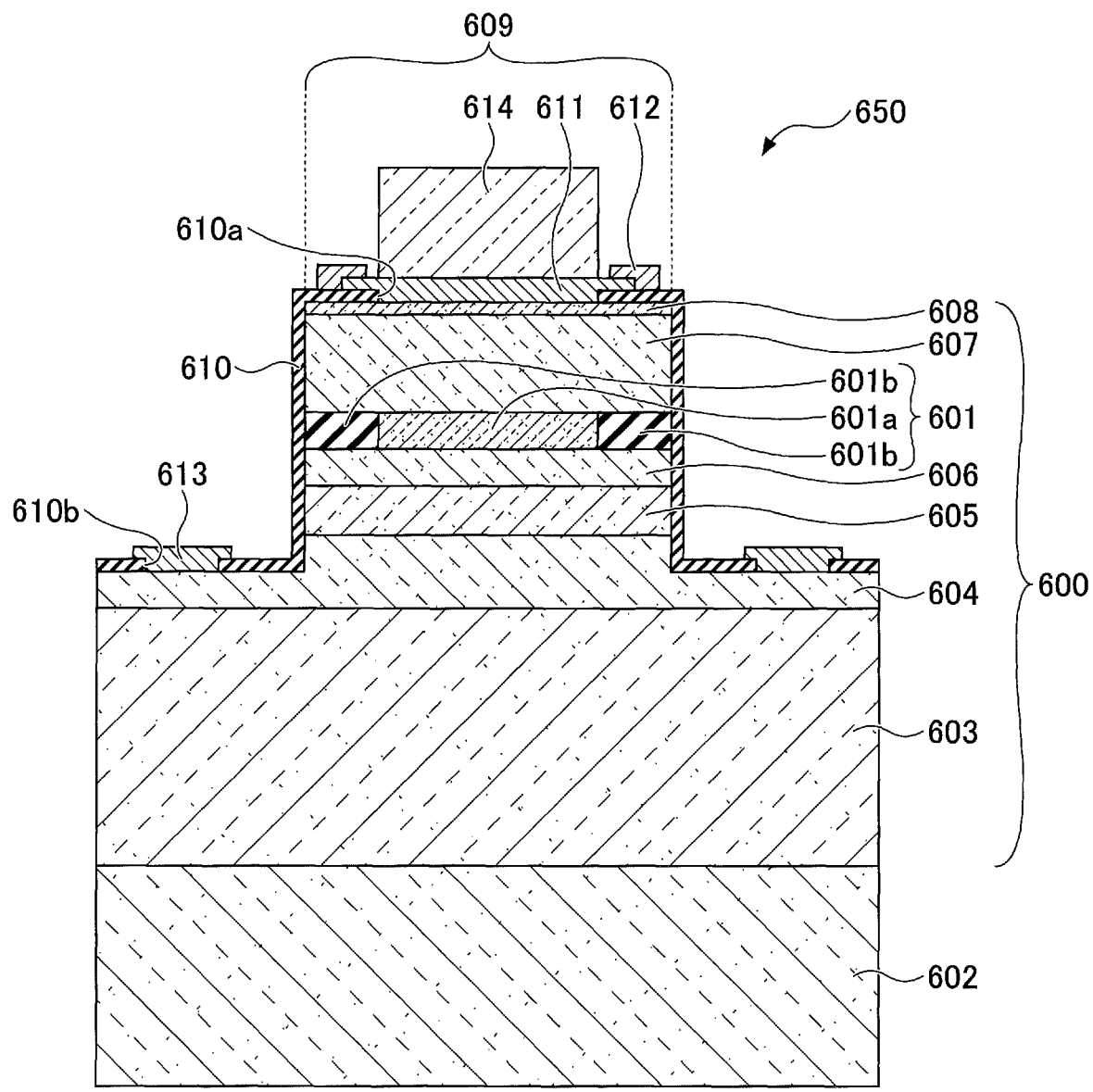
FIG. 12D is a cross-sectional view (part 4) illustrating the method for producing the surface-emitting laser according to the sixth embodiment.

Next, a structure illustrated in FIG. 12C is removed from the MOCVD apparatus, and the $SiO_2$ film 615 is removed as illustrated in FIG. 12D. The $SiO_2$ film 615 can be removed by buffered hydrofluoric acid, for example. Next, activation annealing of the acceptor is performed. Subsequently, the p$^{++}$-GaN layer 608, the p-GaN layer 607, the current confinement layer 601, the p-$Al_{0.20}Ga_{0.80}N$ layer 606, the multi-quantum well layer 605, and a portion of the n-GaN layer 604 are removed by lithography and dry etching, thereby forming the mesa structure 609 for element isolation. Next, the SiN film 610 is formed so as to cover the top surface and the side surfaces of the mesa structure 609 and also the top surface of the n-GaN layer 604. Next, the opening 610a that exposes the portion of the top surface of the p++-GaN layer 608 and the opening 610b that exposes the portion of the top surface of n-GaN layer 604 are formed on the SiN film 610.

Then, the ITO film 611 is formed on the surface of the p++-GaN layer 608 through the opening 610a while partially extending onto the SiN film 610. At the upper side of the mesa structure 609, the upper electrode 612 having a ring shape in plan view is formed on the SiN film 610 and on the ITO film 611. In addition, the lower electrode 613 is formed on the n-GaN layer 604 through the opening 610b while partially extending onto the SiN film 610. For example, when the upper electrode 612 is formed, the Ti film and the Au film are sequentially stacked on the SiN film 610 and the ITO film 611. For example, when the lower electrode 613 is formed, the Ti film and the Al film are sequentially stacked on the n-GaN layer 604. Next, the DBR 614 is formed on the ITO film 611 so as to be located inward relative to the upper electrode 612.

In this manner, the surface-emitting laser 650 according to the sixth embodiment can be produced.

According to the above-described method, the current confinement layer 601 can be formed without forming a level difference in the p-$Al_{0.70}In_{0.30}N$ layer 601x. Accordingly, stable characteristics can be obtained.

Seventh Embodiment

Figure 13:
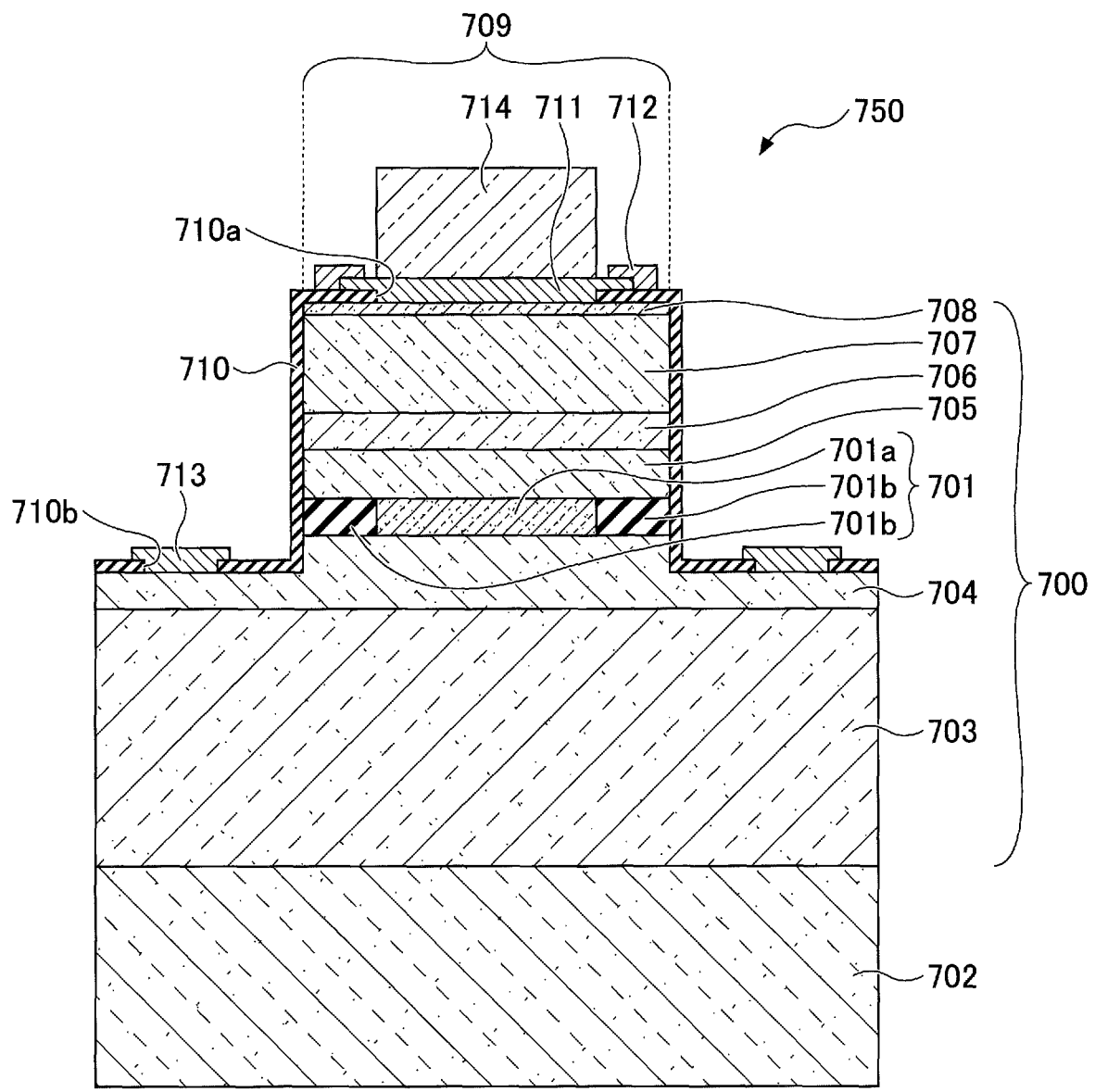
FIG. 13 is a cross-sectional view of a surface-emitting laser according to a seventh embodiment.

Next, a seventh embodiment will be described. The seventh embodiment relates to surface-emitting laser including a nitride semiconductor multilayer structure. The surface-emitting laser is an example of a light emitting element. FIG. 13 is a cross-sectional view of the surface-emitting laser according to the seventh embodiment.

As illustrated in FIG. 13, a surface-emitting laser 750 according to the seventh embodiment includes an n-GaN substrate 702 and a laser structure 700 formed on the n-GaN substrate 702. The laser structure 700 includes a lower multilayer film reflector 703, an n-GaN layer 704, a current confinement layer 701, a multi-quantum well layer 705, a p-AlGaN layer 706, a p-GaN layer 707, and a p++-GaN layer 708. The n-GaN layer 704 is an example of a first nitride semiconductor layer, the multi-quantum well layer 705 is an example of a second nitride semiconductor layer, and the current confinement layer 701 is an example of a third nitride semiconductor layer. The laser structure 700 is an example of a nitride semiconductor multilayer structure.

The lower multilayer film reflector 703 is formed on the n-GaN substrate 702. The lower multilayer film reflector 703 has a structure including 46 periods of alternating high refractive index and low refractive index layers. The high refractive index layer is, for example, an $In_{0.05}Ga_{0.95}N$ layer having a thickness of 50 nm. The low refractive index layer has a multilayer structure in which two AlN layers having a thickness of 6 nm are inserted between three GaN layers having a thickness of 6 nm.

The n-GaN layer 704 is formed on the lower multilayer film reflector 703. The thickness of the n-GaN layer 704 is, for example, 1.050 μm.

The current confinement layer 701 is formed on the n-GaN layer 704. The thickness of the current confinement layer 701 is, for example, 50 nm. The current confinement layer 701 includes an n-$Al_{0.70}In_{0.30}N$ layer 701a and an n-AlN layer 701b. The n-AlN layer 701b surrounds the n-$Al_{0.70}In_{0.30}N$ layer 701a in a same plane. The In content of the n-AlN layer 701b is lower than that of the n-$Al_{0.70}In_{0.30}N$ layer 701a. The n-$Al_{0.70}In_{0.30}N$ layer 701a is an example of a first region, and the n-AlN layer 701b is an example of a second region.

The multi-quantum well layer 705 is formed on the current confinement layer 701. For example, the multi-quantum well layer 705 has a structure including 5 periods of alternating $In_{0.10}Ga_{0.90}N$ and GaN layers. The $In_{0.10}Ga_{0.90}N$ layer has a thickness of 4 nm and the GaN layer has a thickness of 6 nm. The multi-quantum well layer 705 is an example of an active layer.

The p-AlGaN layer 706 is formed on the multi-quantum well layer 705. The thickness of the p-AlGaN layer 706 is, for example, 20 nm.

The p-GaN layer 707 is formed on the p-AlGaN layer 706. The thickness of the p-GaN layer 707 is, for example, 75 nm.

The p++-GaN layer 708 is formed on the p-GaN layer 707. The thickness of the p++-GaN layer 708 is, for example, 5 nm. The p++-GaN layer 708 is doped with Mg, which serves as an acceptor, at a concentration of $1 \times 10^{20}$ cm$^{-3}$.

In the laser structure 700, the p++-GaN layer 708, the p-GaN layer 707, the p-AlGaN layer 706, the multi-quantum well layer 705, the current confinement layer 701, and a portion of the n-GaN layer 704 are etched, thereby forming a circular-shaped mesa structure 709 in plan view.

A SiN film 710, serving as a passivation film, is formed so as to cover the top surface and the side surfaces of the mesa structure 709 and also the top surface of the n-GaN layer 704. The SiN film 710 has an opening 710a that exposes a portion of the top surface of the p++-GaN layer 708, and also has an opening 710b that exposes a portion of the top surface of the n-GaN layer 704. For example, the n-$Al_{0.70}In_{0.30}N$ layer 701a is located inward relative to the opening 710a in plan view.

An ITO film 711 is formed on the surface of the p++-GaN layer 708 through the opening 710a while partially extending onto the SiN film 710. At the upper side of the mesa structure 709, an upper electrode 712 having a ring shape in plan view is formed on the SiN film 710 and the ITO film 711. A dielectric DBR 714 is formed on the ITO film 711 so as to be located inward relative to the upper electrode 712. A lower electrode 713 is formed on the n-GaN layer 704 through the opening 710b while partially extending onto the SiN film 710. The upper electrode 712 has, for example, a Ti film and an Au film sequentially stacked on the SiN film 710 and the ITO film 711. The lower electrode 713 has, for example, a Ti film and an Al film sequentially stacked on the n-GaN layer 704. The DBR 714 includes a $Ta_2O_5$ film and a $SiO_2$ film. The lower multilayer film reflector 703 and the DBR 714 are included in a resonator structure.

In the surface-emitting laser 750, the current confinement layer 701 includes the n-$Al_{0.70}In_{0.30}N$ layer 701a and the n-AlN layer 701b as described above. The band gap of the n-$Al_{0.70}In_{0.30}N$ layer 701a is 3.59 eV, and the band gap of the n-AlN layer 701b is 6.2 eV. Further, the n-GaN layer 704 and the multi-quantum well layer 705, which sandwich the current confinement layer 701 therebetween, have band gaps of 3.4 eV and 3.1 eV, respectively. The band gap of the n-AlN layer 701b is larger, by 1.0 eV or more, than the band gap of each of the n-$Al_{0.70}In_{0.30}N$ layer 701a, the n-GaN layer 704, and the multi-quantum well layer 705, which are formed in the surroundings of the n-AlN layer 701b. Accordingly, large band offsets are formed between the n-AlN layer 701b and the n-$Al_{0.70}In_{0.30}N$ layer 701a, the n-GaN layer 704, and the multi-quantum well layer 705. Accordingly, in the current confinement layer 701, a current is blocked by the n-AlN layer 701b and selectively flows through the n-Al$_{0.70}$In$_{0.30}$N layer 701a.

As will be described below in detail, the current confinement layer 701 can be formed without employing a nitride semiconductor layer having a level difference. Accordingly, the surface-emitting laser 750 including the laser structure 700 can obtain stable characteristics.

Further, the refractive index of the n-AlN layer 701b is lower than the refractive index of the n-Al$_{0.70}$In$_{0.30}$N layer 701a. Accordingly, it is possible to obtain a light confinement effect in the in-plane direction of the substrate.

Next, a method for producing the surface-emitting laser 750 according to the seventh embodiment will be described. FIG. 14A through FIG. 14E are cross-sectional views illustrating the method for producing the surface-emitting laser 750 according to the seventh embodiment. In this producing method, the nitride semiconductor layers included in the laser structure 700 are epitaxially grown on the n-GaN substrate 702.

Figure 14A:
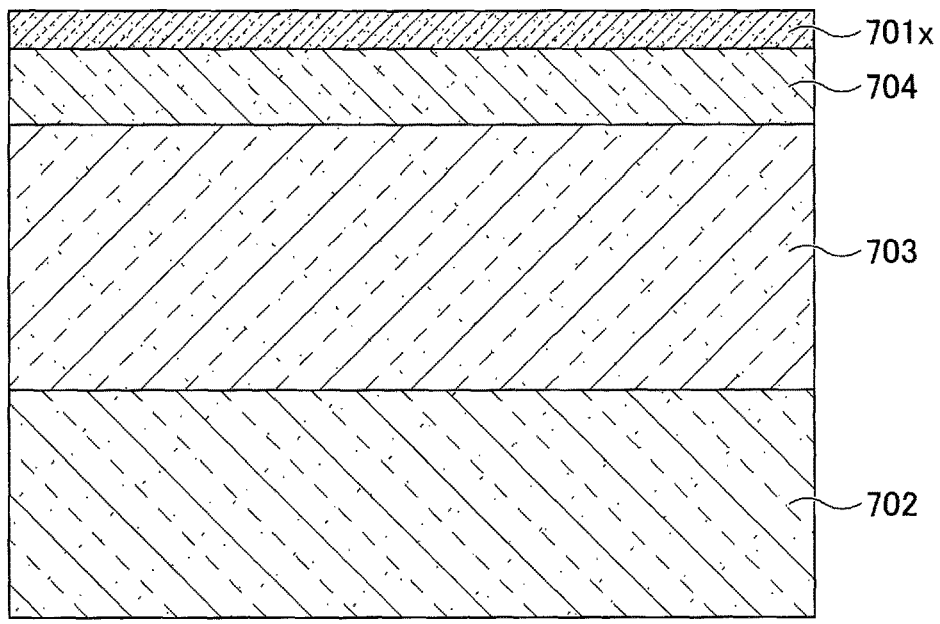
FIG. 14A is a cross-sectional view (part 1) illustrating a method for producing the surface-emitting laser according to the seventh embodiment.

First, the MOCVD apparatus is used to sequentially form the lower multilayer film reflector 703, the n-GaN layer 704, and an n-Al$_{0.70}$In$_{0.30}$N layer 701x on the n-GaN substrate 702, as illustrated in FIG. 14A.

Figure 14B:
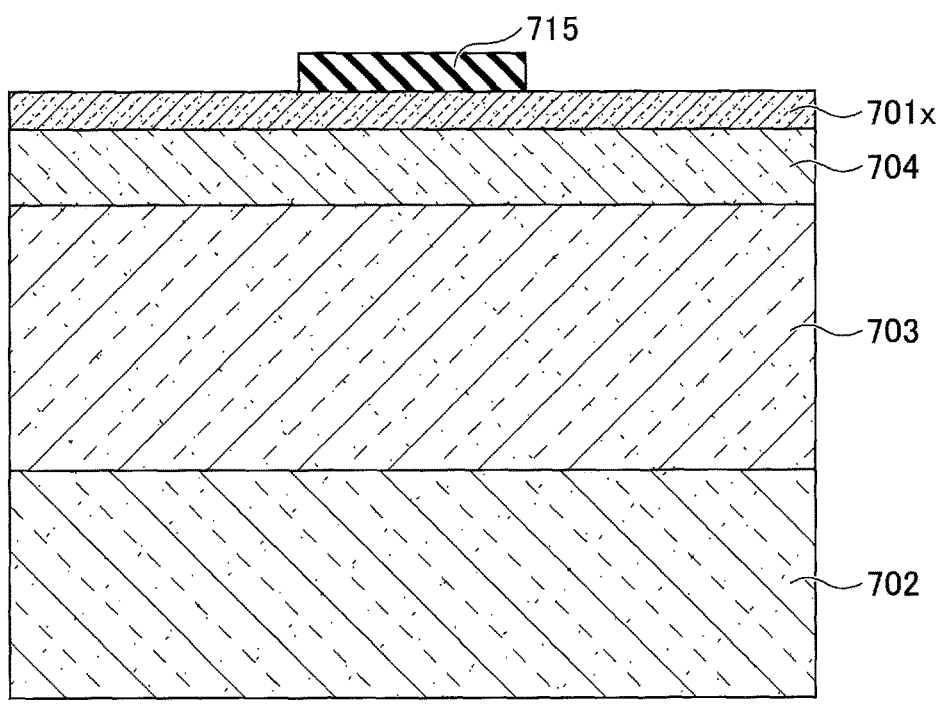
FIG. 14B is a cross-sectional view (part 2) illustrating the method for producing the surface-emitting laser according to the seventh embodiment.

Next, a structure illustrated in FIG. 14A is removed from the MOCVD apparatus, and a SiO$_2$ film 715 having a diameter of 10 μm and a thickness of 100 nm is formed on the n-Al$_{0.70}$In$_{0.30}$N layer 701x as illustrated in FIG. 14B. The SiO$_2$ film 715 serves as a protective mask that covers a region where the n-Al$_{0.70}$In$_{0.30}$N layer 701a is to be formed. The SiO$_2$ film 715 may be formed by photolithography, for example.

Figure 14C:
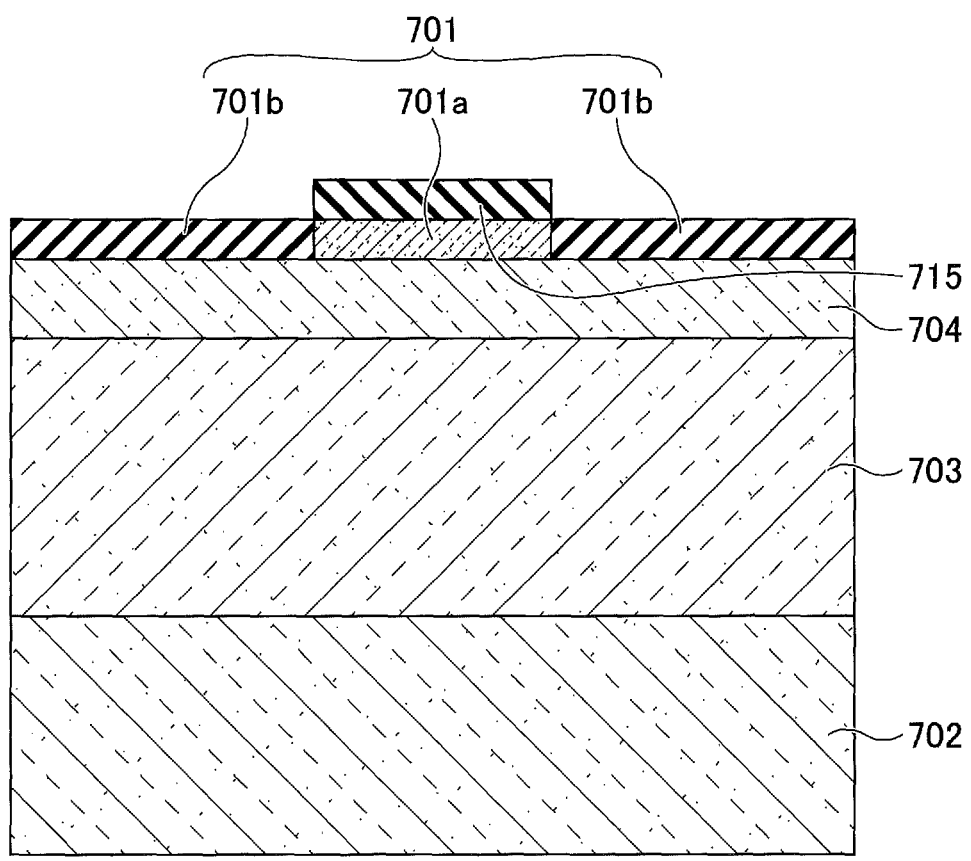
FIG. 14C is a cross-sectional view (part 3) illustrating the method for producing the surface-emitting laser according to the seventh embodiment.

Next, a structure illustrated in FIG. 14B is placed in the heat treatment apparatus, and heat treatment is performed at a temperature of 800° C. in a mixed gas atmosphere of hydrogen and ammonia. The heat treatment time is set to 10 minutes, for example. By the heat treatment, hydrogen penetrates an exposed portion of the n-Al$_{0.70}$In$_{0.30}$N layer 701x not covered by the SiO$_2$ film 715, and also In is evaporated from the exposed portion. As a result, as illustrated in FIG. 14C, the exposed portion of the n-Al$_{0.70}$In$_{0.30}$N layer 701x not covered by the SiO$_2$ film 715 becomes the n-AlN layer 701b. The remainder of the n-Al$_{0.70}$In$_{0.30}$N layer 701x becomes the n-Al$_{0.70}$In$_{0.30}$N layer 701a whose In content remains unchanged from that of the n-Al$_{0.70}$In$_{0.30}$N layer 701x. In this manner, the current confinement layer 701 including the n-Al$_{0.70}$In$_{0.30}$N layer 701a and the n-AlN layer 701b is formed.

Figure 14D:
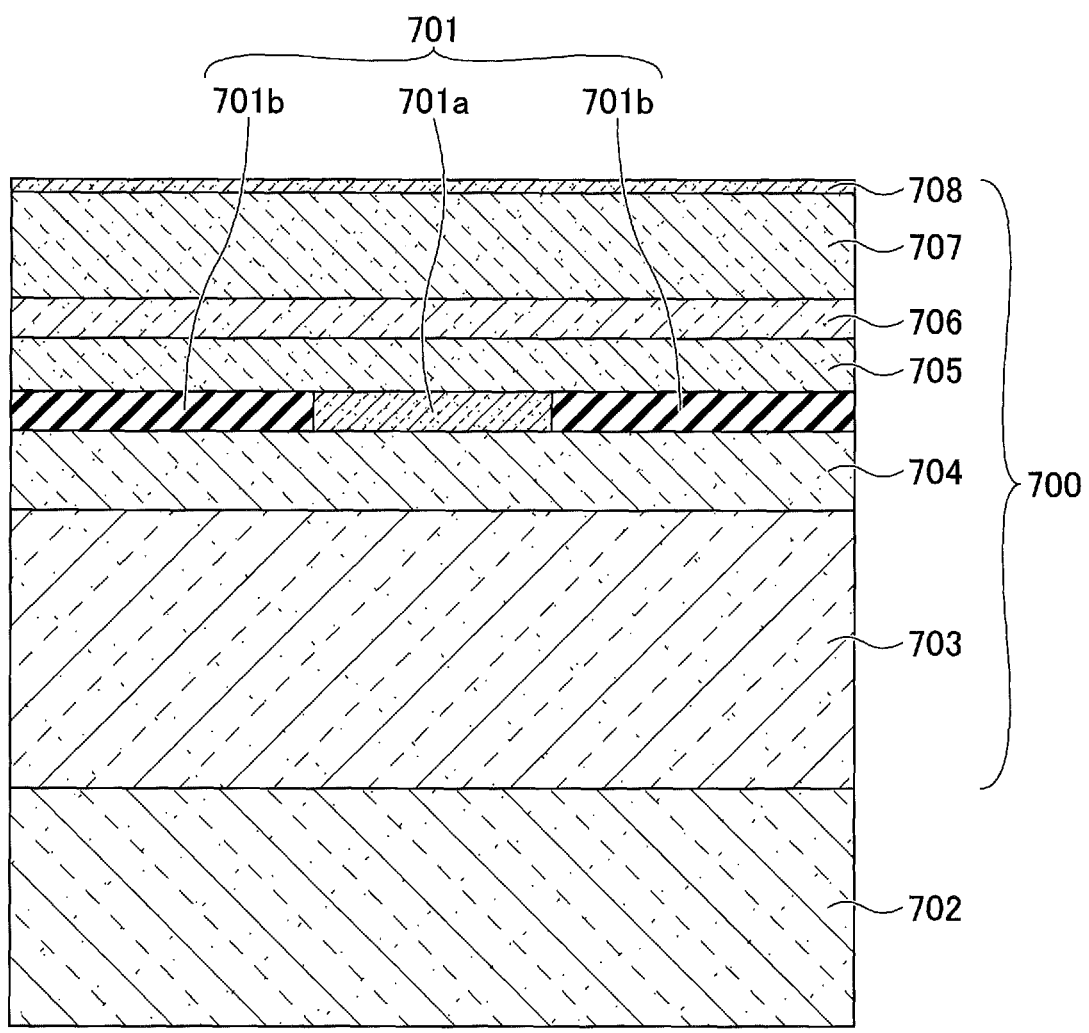
FIG. 14D is a cross-sectional view (part 4) illustrating the method for producing the surface-emitting laser according to the seventh embodiment.
Figure 14E:
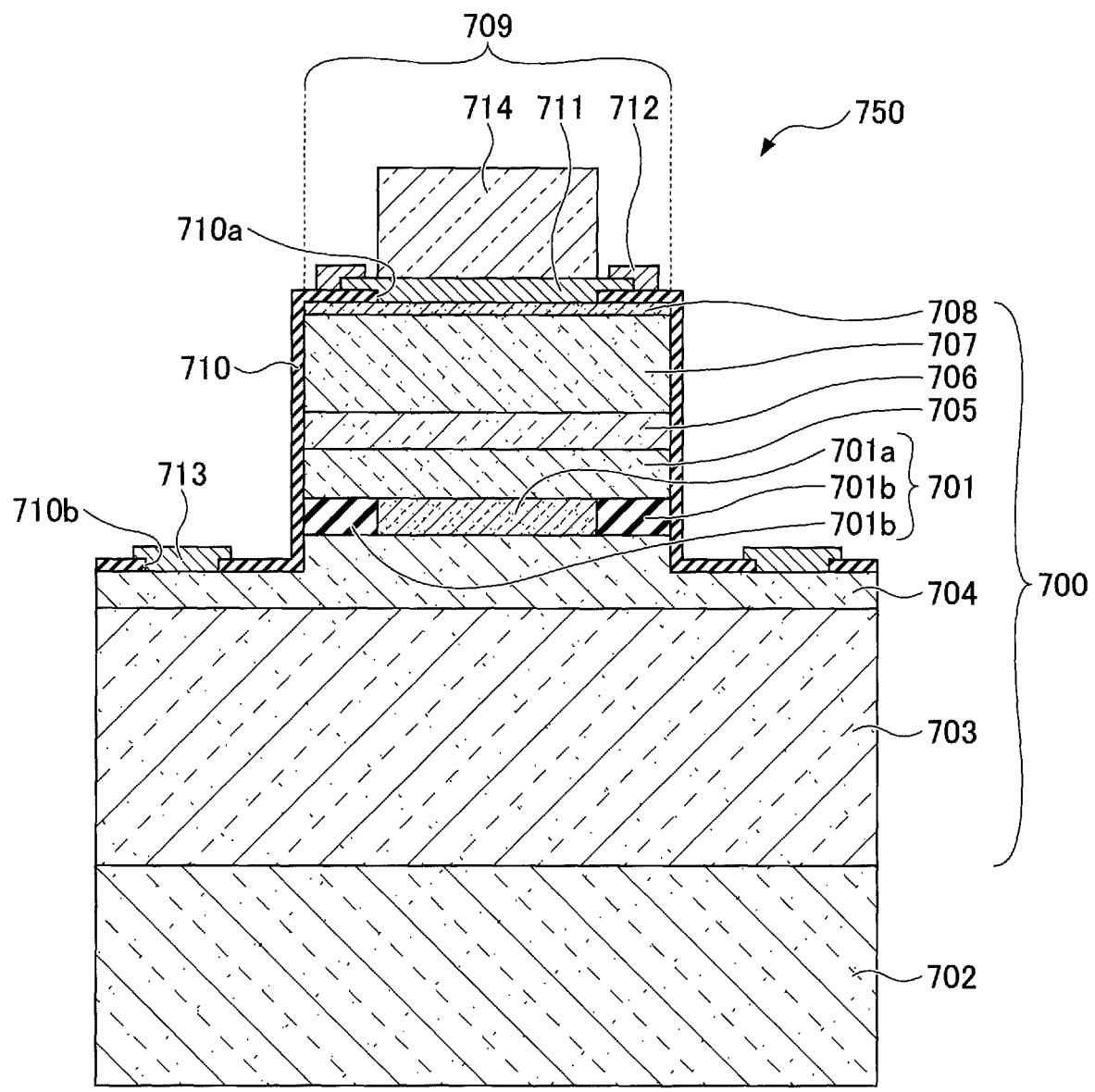
FIG. 14E is a cross-sectional view (part 5) illustrating the method for producing the surface-emitting laser according to the seventh embodiment.

Next, the SiO$_2$ film 715 is removed as illustrated in FIG. 14D. The SiO$_2$ film 715 can be removed by buffered hydrofluoric acid, for example. Next, a structure from which the SiO$_2$ film 715 has been removed is placed in the MOCVD apparatus, and the multi-quantum well layer 705, the p-AlGaN layer 706, the p-GaN layer 707, and the p$^{++}$-GaN layer 708 are sequentially formed on or above the current confinement layer 701.

Next, a structure illustrated in FIG. 14D is removed from the MOCVD apparatus, and activation annealing of the acceptor is performed. Next, the p-GaN layer 707, the p-AlGaN layer 706, the multi-quantum well layer 705, the current confinement layer 701, and a portion of the n-GaN layer 704 are removed by lithography and dry etching, thereby forming the mesa structure 709 for element isolation. Next, the SiN film 710 is formed so as to cover the top surface and the side surfaces of the mesa structure 709 and also the top surface of the n-GaN layer 704. Next, the opening 710a that exposes the portion of the top surface of the p$^{++}$-GaN layer 708 and the opening 710b that exposes the portion of the top surface of the n-GaN layer 704 are formed on the SiN film 710.

Then, the ITO film 711 is formed on the surface of the p$^{++}$-GaN layer 708 through the opening 710a while partially extending onto the SiN film 710. At the upper side of the mesa structure 709, the upper electrode 712 having a ring shape in plan view is formed on the SiN film 710 and the ITO film 711. In addition, the lower electrode 713 is formed on the n-GaN layer 704 through the opening 710b while partially extending onto the SiN film 710. For example, when the upper electrode 712 is formed, the Ti film and the Au film are stacked sequentially on the SiN film 710 and the ITO film 711. For example, when the lower electrode 713 is formed, the Ti film and the Al film are stacked sequentially on the n-GaN layer 704. Next, the DBR 714 is formed on the ITO film 711 at an inward position relative to the upper electrode 712.

In this manner, the surface-emitting laser 750 according to the seventh embodiment can be produced.

According to the above-described method, the current confinement layer 701 can be formed without forming a level difference in the n-Al$_{0.70}$In$_{0.30}$N layer 701x. Accordingly, stable characteristics can be obtained.

Eighth Embodiment

Figure 15:
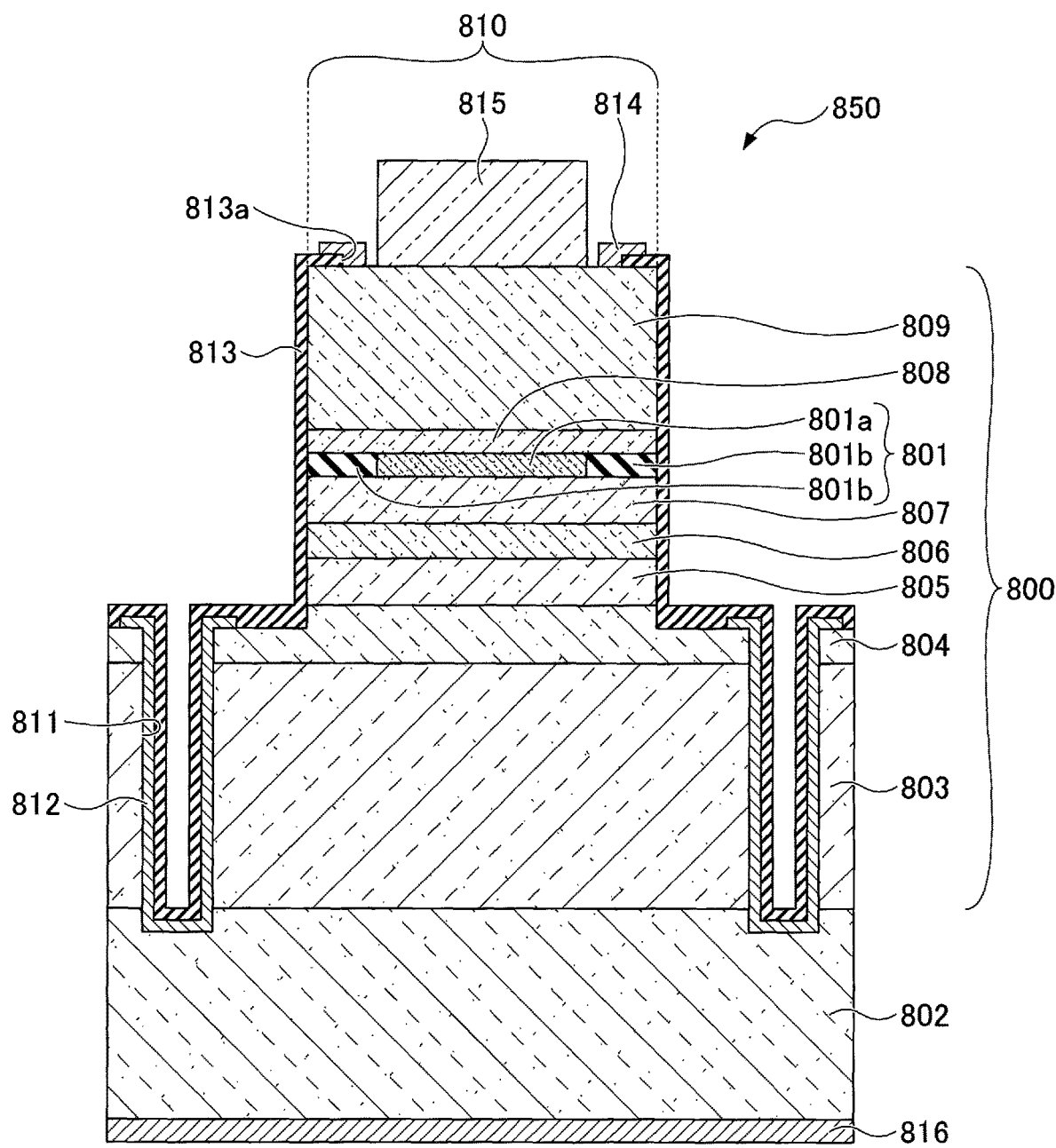
FIG. 15 is a cross-sectional view of a surface-emitting laser according to an eighth embodiment.

Next, an eighth embodiment will be described. The eighth embodiment relates to a surface-emitting laser including a nitride semiconductor multilayer structure. The surface-emitting laser is an example of a light emitting element. FIG. 15 is a cross-sectional view of the surface-emitting laser according to the eighth embodiment.

As illustrated in FIG. 15, a surface-emitting laser 850 according to the eighth embodiment includes an n-GaN substrate 802 and a laser structure 800 formed on the n-GaN substrate 802. The laser structure 800 includes a lower multilayer film reflector 803, an n-GaN layer 804, a multi-quantum well layer 805, a p-AlGaN layer 806, a p-GaN layer 807, a current confinement layer 801, an n$^{++}$-GaN layer 808, and an n-GaN layer 809. The p-GaN layer 807 is an example of a first nitride semiconductor layer, the n$^{++}$-GaN layer 808 is an example of a second nitride semiconductor layer, and the current confinement layer 801 is an example of a third nitride semiconductor layer. The laser structure 800 is an example of a nitride semiconductor multilayer structure.

The lower multilayer film reflector 803 is formed on the n-GaN substrate 802. The lower multilayer film reflector 803 has a structure including 46 periods of alternating high refractive index and low refractive index layers. The high refractive index layer is, for example, an In$_{0.05}$Ga$_{0.95}$N layer having a thickness of 50 nm. The low refractive index layer has a multilayer structure in which two AlN layers having a thickness of 6 nm are inserted between three GaN layers having a thickness of 6 nm.

The n-GaN layer 804 is formed on the lower multilayer film reflector 803. The thickness of the n-GaN layer 804 is, for example, 1.1 μm.

The multi-quantum well layer 805 is formed on the n-GaN layer 804. The multi-quantum well layer 805 has a structure including 5 periods of alternating In$_{0.10}$Ga$_{0.90}$N and GaN layers. The In$_{0.10}$Ga$_{0.90}$N layer has a thickness of 4 nm and the GaN layer has a thickness of 6 nm. The multi-quantum well layer 805 is an example of an active layer.

The p-AlGaN layer 806 is formed on the multi-quantum well layer 805. The thickness of the p-AlGaN layer 806 is, for example, 20 nm.

The p-GaN layer 807 is formed on the p-AlGaN layer 806. The thickness of the p-GaN layer 807 is, for example, 100 nm.

The current confinement layer 801 is formed on the p-GaN layer 807. The thickness of the current confinement layer 801 is, for example, 5 nm. The current confinement layer 801 includes a $p^{++}$-$Al_{0.70}In_{0.30}N$ layer 801a and a $p^{++}$-AlN layer 801b. The $p^{++}$-AlN layer 801b surrounds the $p^{++}$-$Al_{0.70}In_{0.30}N$ layer 801a in a same plane. The In content of the $p^{++}$-AlN layer 801b is lower than that of the $p^{++}$-$Al_{0.70}In_{0.30}N$ layer 801a. The $p^{++}$-$Al_{0.70}In_{0.30}N$ layer 801a is an example of a first region, and the $p^{++}$-AlN layer 801b is an example of a second region. The $p^{++}$-$Al_{0.70}In_{0.30}N$ layer 801a and the $p^{++}$-AlN layer 801b are each doped with Mg, which serves as an acceptor, at a concentration of $1\times10^{20}$ cm$^{-3}$.

The $n^{++}$-GaN layer 808 is formed on the current confinement layer 801. The thickness of the $n^{++}$-GaN layer 808 is, for example, 5 nm. The $n^{++}$-GaN layer 808 is doped with Si, which serves as a donor, at a concentration of $3\times10^{20}$ cm$^{-3}$.

The n-GaN layer 809 is formed on the $n^{++}$-GaN layer 808. The thickness of the n-GaN layer 809 is, for example, 470 nm.

In the laser structure 800, the n-GaN layer 809, the $n^{++}$-GaN layer 808, the current confinement layer 801, the p-GaN layer 807, the p-AlGaN layer 806, the multi-quantum well layer 805, and a portion of the n-GaN layer 804 are etched, thereby forming a circular-shaped mesa structure 810 in plan view.

Further, an opening 811 is formed in the n-GaN layer 804, the lower multilayer film reflector 803, and a portion of the n-GaN substrate 802, while being spaced apart from the mesa structure 810. An electrically conductive film 812 that electrically connects the n-GaN layer 804 and the n-GaN substrate 802 is formed in the opening 811. The electrically conductive film 812 includes, for example, a Ti film and an Al film sequentially stacked on the n-GaN substrate 802.

A SiN film 813, serving as a passivation film, is formed so as to cover the surface and the side surfaces of the mesa structure 810, the top surface of the n-GaN layer 804, and the surface of the electrically conductive film 812. The SiN film 813 has an opening 813a that exposes a portion of the top surface of the n-GaN layer 809. For example, the $p^{++}$-$Al_{0.70}In_{0.30}N$ layer 801a is located inward relative to the opening 813a in plan view.

An upper electrode 814 having a ring shape in plan view is formed on the surface of the n-GaN layer 809 while partially extending onto the SiN film 813 along the edge of the opening 813a. A dielectric DBR 815 is formed on the n-GaN layer 809 so as to be located inward relative to the upper electrode 814. A lower electrode 816 is formed on the bottom surface of the n-GaN substrate 802. The upper electrode 814 has, for example, a Ti film and an Au film sequentially stacked on the n-GaN layer 809. The lower electrode 816 has, for example, a Ti film and an Al film sequentially stacked on the n-GaN substrate 802. The DBR 815 includes a $Ta_2O_5$ film and a $SiO_2$ film. The lower multilayer film reflector 803 and the DBR 815 are included in a resonator structure.

In the surface-emitting laser 850, a tunnel junction is formed between the $p^{++}$-$Al_{0.70}In_{0.30}N$ layer 801a and the $n^{++}$-GaN layer 808. Further, the current confinement layer 801 includes the $p^{++}$-$Al_{0.70}In_{0.30}N$ layer 801a and the $p^{++}$-AlN layer 801b as described above. The band gap of the $p^{++}$-$Al_{0.70}In_{0.30}N$ layer 801a is 3.59 eV, and the band gap of the $p^{++}$-AlN layer 801b is 6.2 eV. Further, the band gap of each of the p-GaN layer 807 and the $n^{++}$-GaN layer 808, which sandwich the current confinement layer 801 therebetween, is 3.4 eV. The band gap of the $p^{++}$-AlN layer 801b is larger, by 1.0 eV or more, than the band gap of each of the $p^{++}$-$Al_{0.70}In_{0.30}N$ layer 801a, the p-GaN layer 807, and the $n^{++}$-GaN layer 808, which are formed in the surroundings of the $p^{++}$-AlN layer 801b. Accordingly, large band offsets are formed between the $p^{++}$-AlN layer 801b and the $p^{++}$-$Al_{0.70}In_{0.30}N$ layer 801a, the p-GaN layer 807, and the $n^{++}$-GaN layer 808. Accordingly, in the current confinement layer 801, a current is blocked by the $p^{++}$-AlN layer 801b and selectively flows through the $p^{++}$-$Al_{0.70}In_{0.30}N$ layer 801a.

As will be described below in detail, the current confinement layer 801 can be formed without employing a nitride semiconductor layer having a level difference. Accordingly, the surface-emitting laser 850 including the laser structure 800 can obtain stable characteristics.

Further, the refractive index of the $p^{++}$-AlN layer 801b is lower than the refractive index of the $p^{++}$-$Al_{0.70}In_{0.30}N$ layer 801a. Accordingly, it is possible to obtain a light confinement effect in the in-plane direction of the substrate.

Next, a method for producing the surface-emitting laser 850 according to the eighth embodiment will be described. FIG. 16A through FIG. 16D are cross-sectional views illustrating the method for producing the surface-emitting laser 850 according to the eighth embodiment. In this producing method, the nitride semiconductor layers included in the laser structure 800 are epitaxially grown on the n-GaN substrate 802.

Figure 16A:
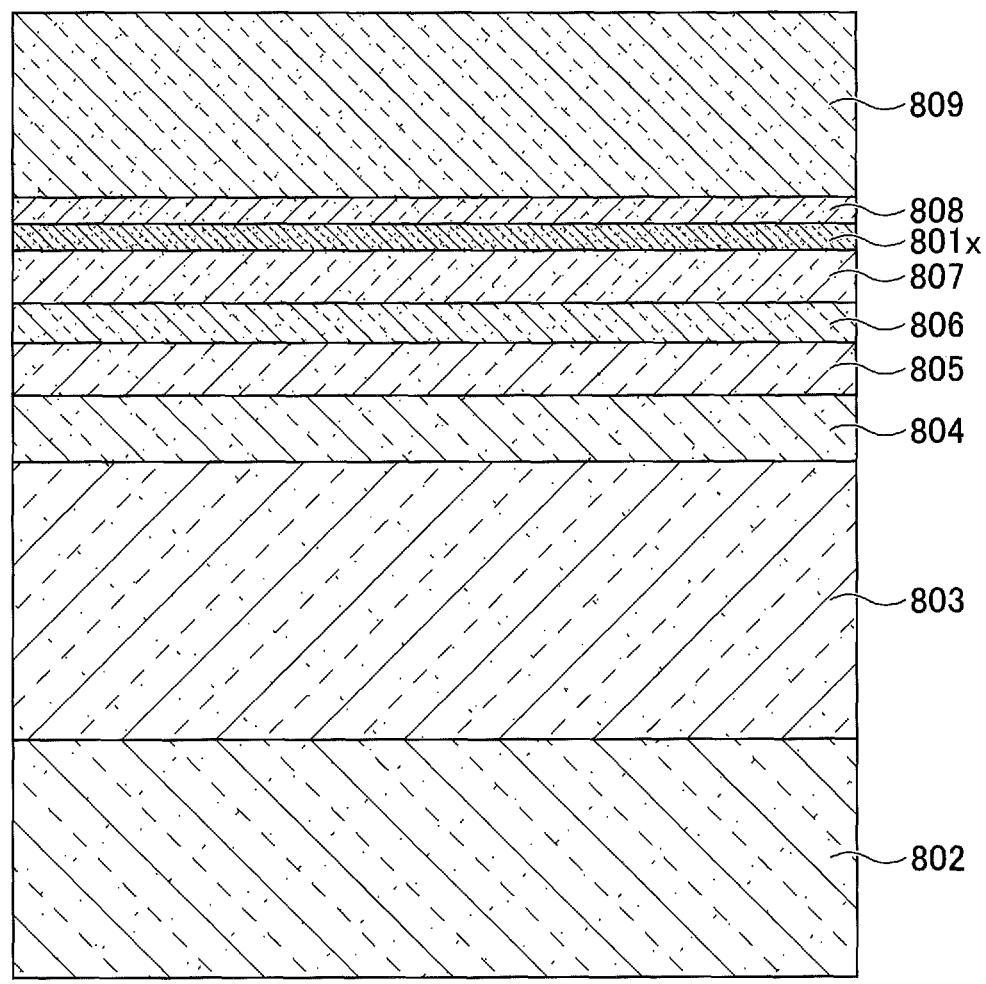
FIG. 16A is a cross-sectional view (part 1) illustrating a method for producing the surface-emitting laser according to the eighth embodiment.

First, the MOCVD apparatus is used to sequentially form the lower multilayer film reflector 803, the n-GaN layer 804, the multi-quantum well layer 805, the p-AlGaN layer 806, the p-GaN layer 807, a $p^{++}$-$Al_{0.70}In_{0.30}N$ layer 801x, the $n^{++}$-GaN layer 808, and the n-GaN layer 809 on or above the n-GaN substrate 802, as illustrated in FIG. 16A.

Figure 16B:
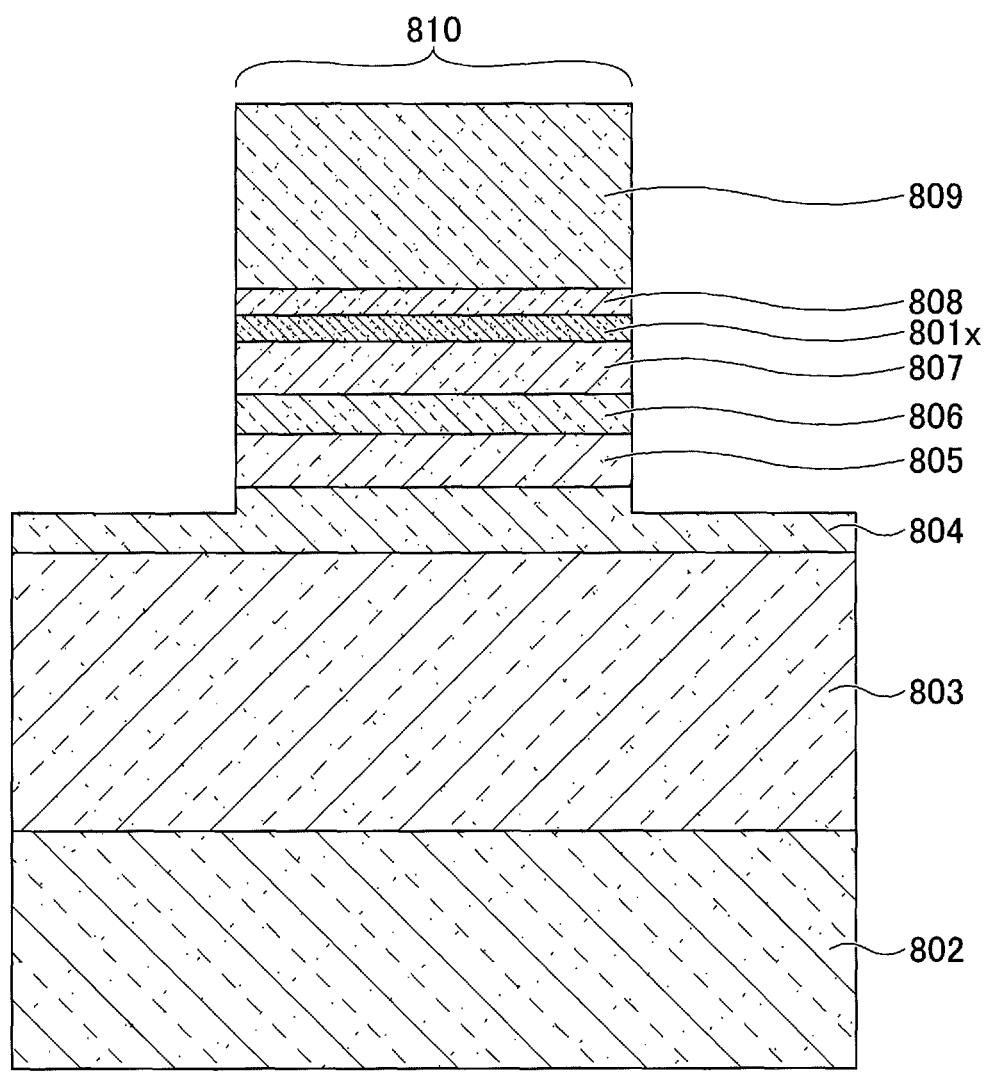
FIG. 16B is a cross-sectional view (part 2) illustrating the method for producing the surface-emitting laser according to the eighth embodiment.

Next, a structure illustrated in FIG. 16A is removed from the MOCVD apparatus, and the n-GaN layer 809, the $n^{++}$-GaN layer 808, the $p^{++}$-$Al_{0.70}In_{0.30}N$ layer 801x, the p-GaN layer 807, the p-AlGaN layer 806, the multi-quantum well layer 805, and a portion of the n-GaN layer 804 are removed by lithography and dry etching, thereby forming the mesa structure 810, as illustrated in FIG. 16B.

Figure 16C:
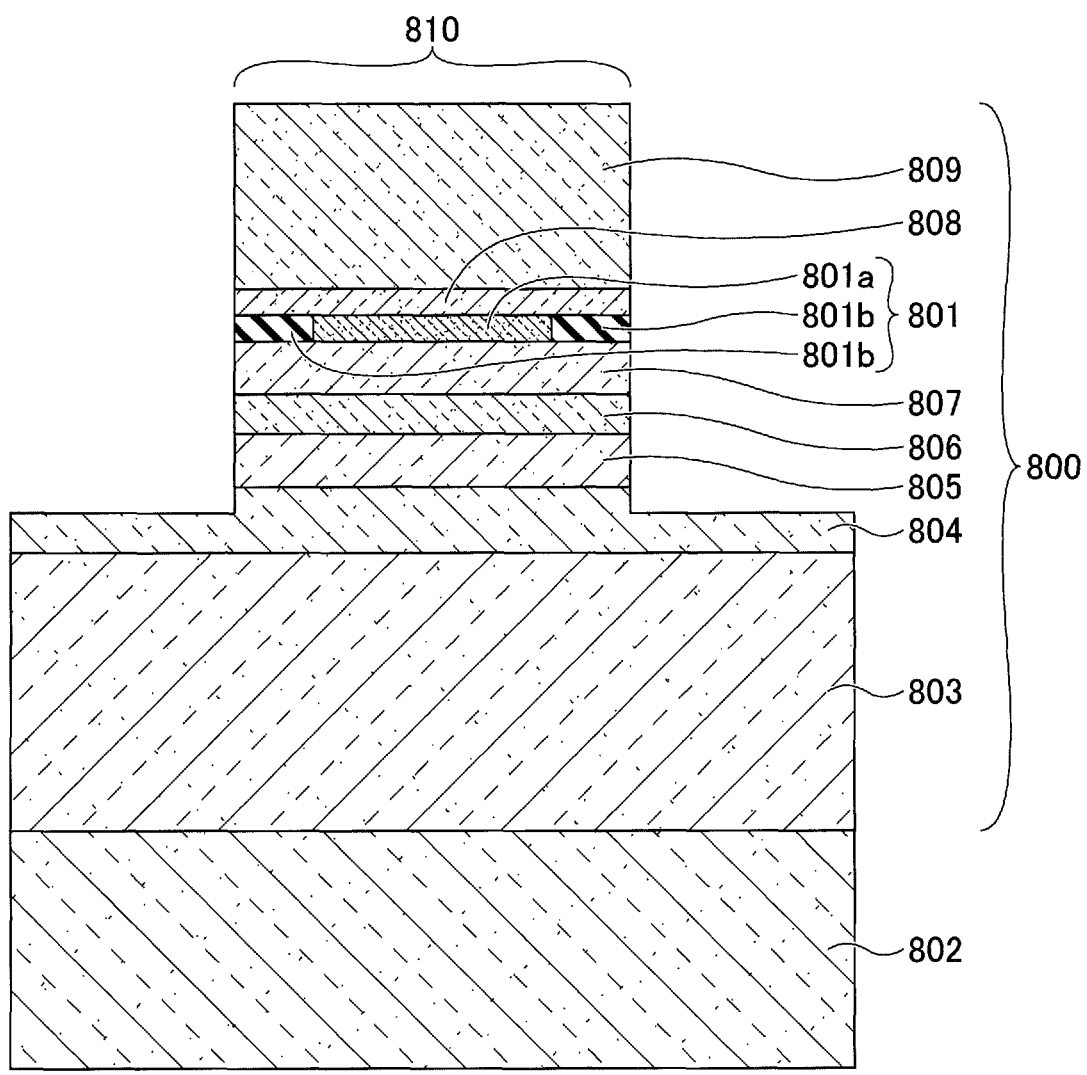
FIG. 16C is a cross-sectional view (part 3) illustrating the method for producing the surface-emitting laser according to the eighth embodiment.

Next, a structure illustrated in FIG. 16B is placed in the heat treatment apparatus, and heat treatment is performed at a temperature of 800° C. in a mixed gas atmosphere of hydrogen and ammonia. The heat treatment time is set to 30 minutes, for example. By the heat treatment, hydrogen penetrates the side walls of the $p^{++}$-$Al_{0.70}In_{0.30}N$ layer 801x, and also In included in the $p^{++}$-$Al_{0.70}In_{0.30}N$ layer 801x is evaporated from the side walls. As a result, as illustrated in FIG. 16C, a portion of the $p^{++}$-$Al_{0.70}In_{0.30}N$ layer 801x in the vicinity of the side walls becomes the $p^{++}$-AlN layer 801b. The remainder of the $p^{++}$-$Al_{0.70}In_{0.30}N$ layer 801x becomes the $p^{++}$-$Al_{0.70}In_{0.30}N$ layer 801a whose In content remains unchanged from that of the $p^{++}$-$Al_{0.70}In_{0.30}N$ layer 801x. In this manner, the current confinement layer 801 including the $p^{++}$-$Al_{0.70}In_{0.30}N$ layer 801a and the $p^{++}$-AlN layer 801b is formed. For example, the p-AlN layer 801b is formed within a range of approximately 10 µm from the side walls.

Figure 16D:
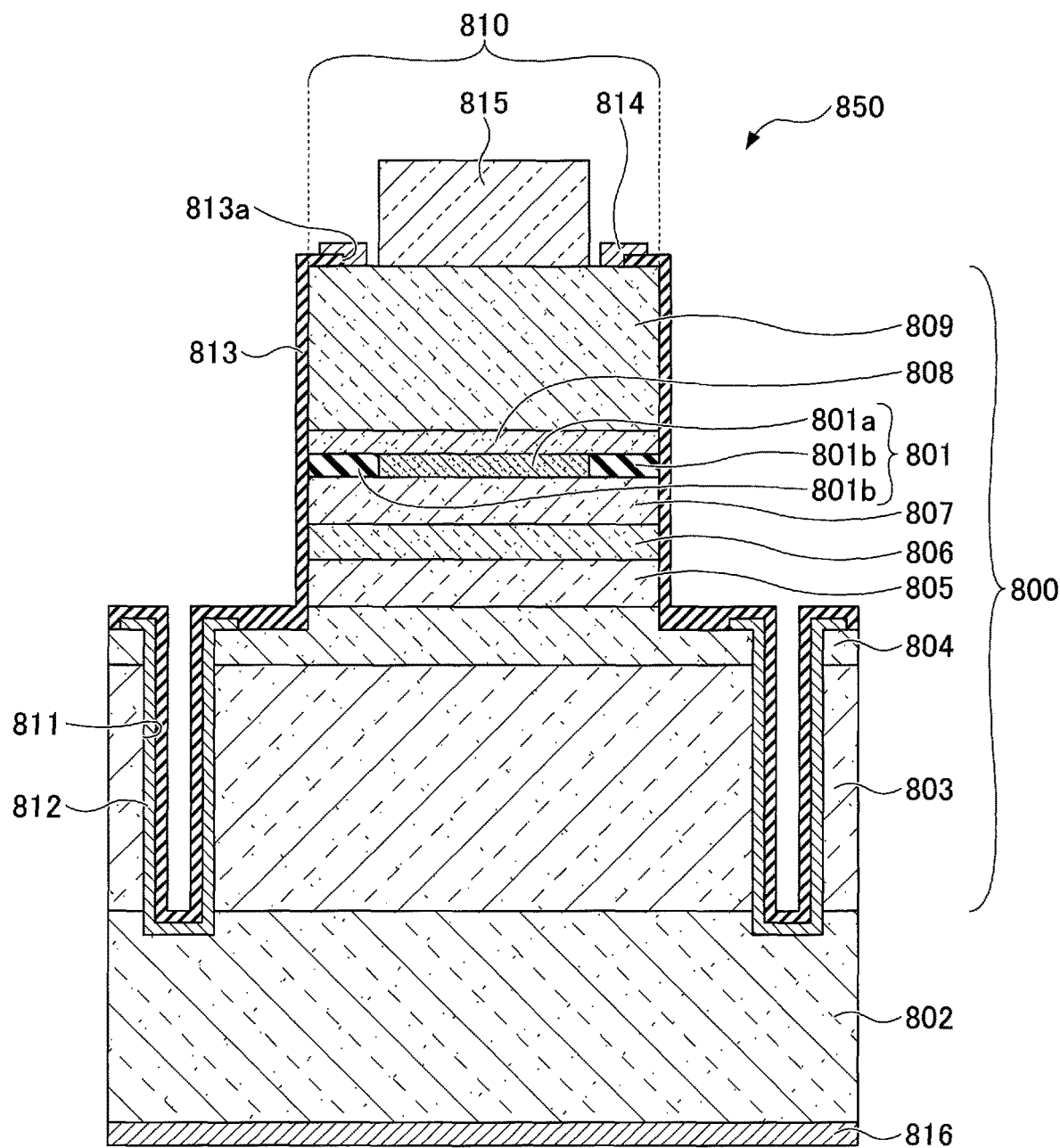
FIG. 16D is a cross-sectional view (part 4) illustrating the method for producing the surface-emitting laser according to the eighth embodiment.

Next, a structure illustrated in FIG. 16C is removed from the MOCVD apparatus, and activation annealing of the acceptor is performed. Next, as illustrated in FIG. 16D, the opening 811 is formed in the n-GaN layer 804, the lower multilayer film reflector 803, and a portion of the n-GaN substrate 802 by lithography and dry etching, while being spaced apart from the mesa structure 810. Next, the electrically conductive film 812 that electrically connects the n-GaN layer 804 and the n-GaN substrate 802 is formed in the opening 811. For example, when the electrically conductive film 812 is formed, the Ti film and the Al film are sequentially formed on the n-GaN substrate 802. Next, the SiN film 813 is formed so as to cover the top surface and the side surfaces of the mesa structure 810, the top surface of the n-GaN layer 804, and the surface of the electrically conductive film 812. Next, the opening 813a that exposes the portion of the top surface of the n-GaN layer 809 is formed on the SiN film 813.

Then, the upper electrode 814 having a ring shape in plan view is formed on the surface of the n-GaN layer 809 while partially extending onto the SiN film 813 along the edge of the opening 813a. Next, the dielectric DBR 815 is formed on the n-GaN layer 809 so as to be located inward relative to the upper electrode 814. Next, the lower electrode 816 is formed on the bottom surface of the n-GaN substrate 802. For example, when the upper electrode 814 is formed, the Ti film and the Au film are sequentially stacked on the n-GaN layer 809. For example, when the lower electrode 816 is formed, the Ti film and the Al film are sequentially stacked on the n-GaN substrate 802.

In this manner, the surface-emitting laser 850 according to the eighth embodiment can be produced.

According to the above-described method, the current confinement layer 801 can be formed without forming a level difference in the $p^{++}$-$Al_{0.70}In_{0.30}N$ layer 801x. Accordingly, stable characteristics can be obtained.

Further, the In content is not required to be sharply and discontinuously changed between the $p^{++}$-$Al_{0.70}In_{0.30}N$ layer 801a and the $p^{++}$-AlN layer 801b. A region in which the In content continuously changes may be present between the $p^{++}$-$Al_{0.70}In_{0.30}N$ layer 801a and the $p^{++}$-AlN layer 801b.

The compositions, conductivity types, and impurity concentrations of the first nitride semiconductor layer, the second nitride semiconductor layer, and the third nitride semiconductor layer are not limited to those described in the embodiments. Further, the application of a nitride semiconductor multilayer structure including a current confinement layer is not limited to an optical element. A nitride semiconductor multilayer structure including a current confinement layer may be applied to any other electronic device.

Ninth Embodiment

Figure 17:
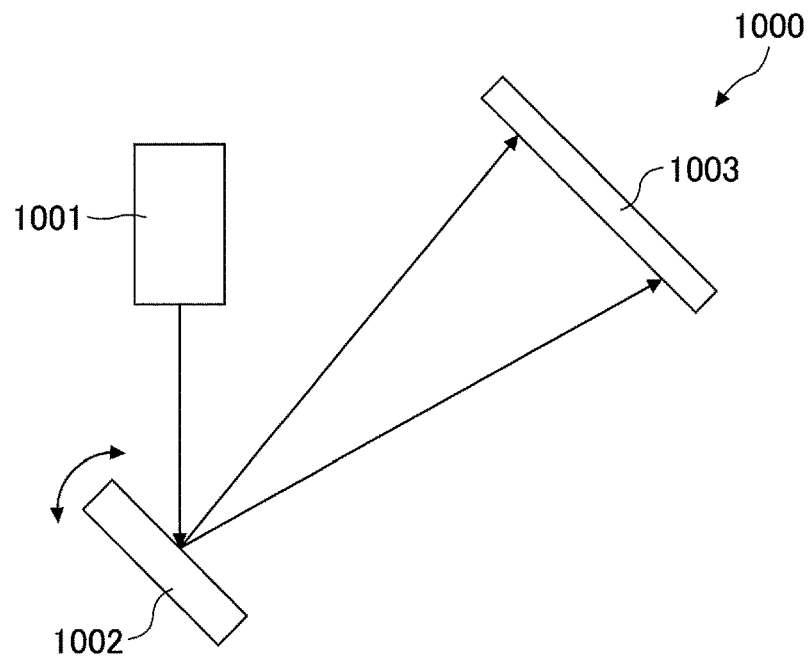
FIG. 17 is a diagram illustrating a layout of a projection apparatus according to a ninth embodiment.

Next, a ninth embodiment will be described. The ninth embodiment relates to a projection apparatus that scans a laser beam to render an image. The projection apparatus is an example of a light source apparatus. FIG. 17 is a diagram illustrating a layout of the projection apparatus according to the ninth embodiment.

A projection apparatus 1000 according to the ninth embodiment includes a light source 1001 and an optical scanner 1002. The light source 1001 includes one or more edge-emitting lasers 550 according to the fifth embodiment, one or more surface-emitting lasers 650 according to the sixth embodiment, one or more surface-emitting lasers 750 according to the seventh embodiment, or one or more surface-emitting lasers 850 according to the eighth embodiment. In a case where the light source 1001 includes one edge-emitting laser 550, one surface-emitting laser 650, one surface-emitting laser 750, or one surface-emitting laser 850, the projection apparatus 1000 projects a monochrome image onto an object 1003. In a case where the light source 1001 includes a plurality of edge-emitting lasers 550, a plurality of surface-emitting lasers 650, a plurality of surface-emitting lasers 750, or a plurality of surface-emitting lasers 850, the projection apparatus 1000 can project an image of a plurality of colors onto the object 1003, by coaxially aligning optical axes of edge-emitting lasers or surface-emitting lasers included in the light source 1001, emitting light from an emitting surface, and changing an oscillating wavelength for each of the edge-emitting lasers or the surface emitting lasers.

The optical scanner 1002 includes an element for scanning a laser beam emitted from the light source 1001 and projecting an image onto the object 1003. Examples of the element that may be used include an element combining two microelectromechanical systems (MEMS) mirrors, such as a MEMS mirror movable in two axis directions or a MEMS mirror movable in one axis direction. The optical scanner 1002 is an example of an optical element that adjusts the traveling direction of a laser beam emitted from the light source 1001.

When an image is formed, the intensity of a laser beam is modulated in accordance with the scanning of the optical scanner 1002, and the object 1003 is irradiated with the laser beam. In this manner, an image can be directly formed on the object 1003.

In a case where the light source 1001 includes a single or a few edge-emitting lasers or surface-emitting lasers, it is possible to output a laser beam on an order of µW to several mW, and render an image in a minute area. Such a projection apparatus 1000 may be used as a retina display, for example.

In a case where the light source 1001 includes a two-dimensional array light source in which multiple surface-emitting lasers are arranged in an array, it is possible to output a laser beam on an order of mW to kW, and render an image in a large area. Such a projection apparatus may be used as a projector, for example.

Tenth Embodiment

Figure 18:
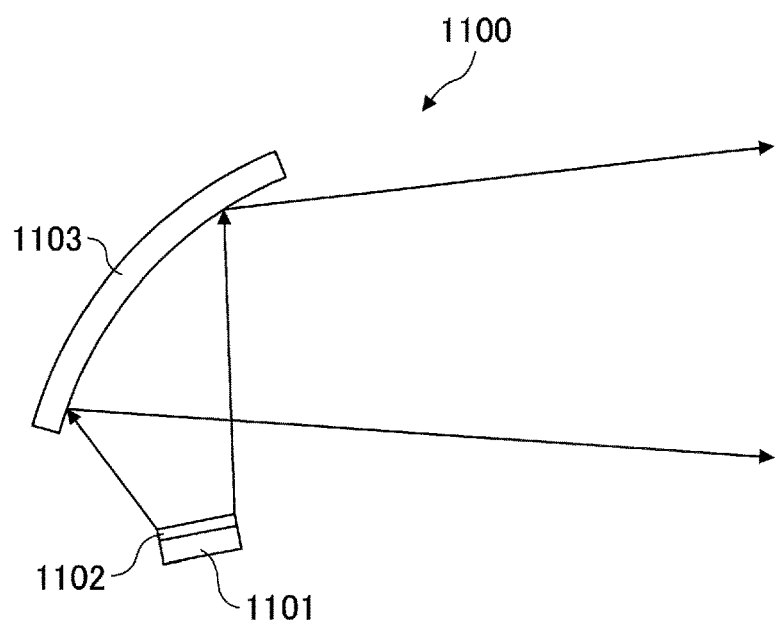
FIG. 18 is a diagram illustrating a layout of a light projecting apparatus according to a tenth embodiment.

Next, a tenth embodiment will be described. The tenth embodiment relates to a light projecting apparatus. The light projecting apparatus is an example of a light source apparatus. FIG. 18 is a diagram illustrating a layout of the light projecting apparatus according to the tenth embodiment.

A light projecting apparatus 1100 according to the tenth embodiment includes a light source 1101, a fluorescent member 1102, and a light projecting member 1103. Examples of the light source 1101 that may be used include a two-dimensional array light source in which a plurality of surface-emitting lasers 650 according to the sixth embodiment, a plurality of surface-emitting lasers 750 according to the seventh embodiment, or a plurality of surface-emitting lasers 850 according to the eighth embodiment are arranged in an array. The fluorescent member 1102 is excited with light emitted from the light source 1101. The light emitted from the light source 1101 and light emitted by excitation of the fluorescent member 1102 are two-dimensionally expanded and projected by the light projecting member 1103. FIG. 18 illustrates a reflector as an example of the light projecting member 1103.

For example, in a case where light emitted from the light source 1101 is blue light, a fluorescent member that emits yellow light is used as the fluorescent member 1102. In a case where light emitted from the light source 1101 is ultraviolet light, a fluorescent member that emits white light is used as the fluorescent member 1102. The fluorescent member 1102 is an example of an optical element that adjusts the wavelength of a laser beam emitted from the light source 1101. The light projecting member 1103 is an example of an optical element that adjusts the traveling direction of a laser beam emitted from the light source 1101 and having a wavelength adjusted by the fluorescent member 1102.

The light source 1101 is, for example, a two-dimensional array light source in which thousands to tens of thousands of surface-emitting lasers are arranged in a two-dimensional array in a plane. Electrodes are connected to the light source 1101 such that a plurality of surface-emitting laser groups are individually driven. A surface-emitting laser group may include a plurality of surface-emitting lasers or may include a single surface-emitting laser.

By selecting a surface-emitting laser group to which a voltage is applied, the one light source 1101 can project light onto any place or space. For example, in a case where the light projecting apparatus 1100 is used as an on-vehicle headlight module, the light projecting apparatus 1100 can be used as a variable light distribution headlamp.

Eleventh Embodiment

Figure 19:
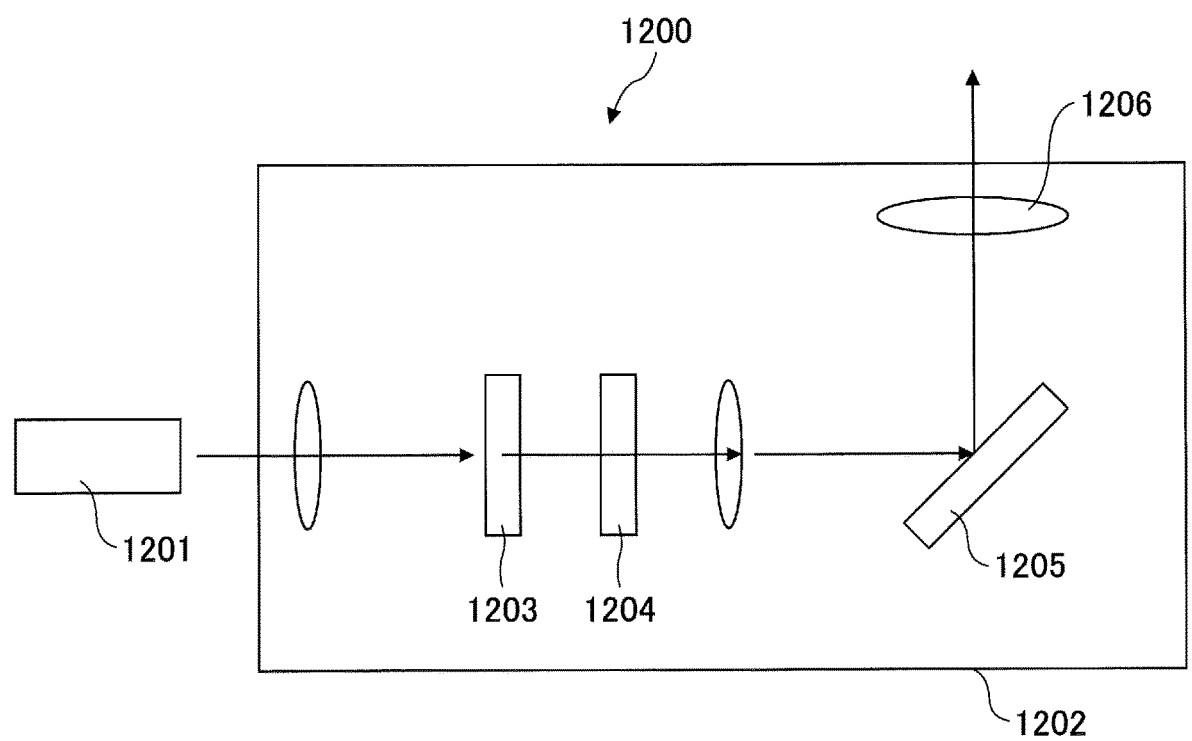
FIG. 19 is a diagram illustrating a layout of a projection apparatus according to an eleventh embodiment.

Next, an eleventh embodiment will be described. The eleventh embodiment relates to a projection apparatus. The projection apparatus is an example of a light source apparatus. FIG. 19 is a diagram illustrating a layout of the projection apparatus according to the eleventh embodiment.

A projection apparatus 1200 according to the eleventh embodiment includes a light source 1201 and a projection optical unit 1202. The light source 1201 includes a two-dimensional array light source in which a plurality of surface-emitting lasers 650 according to the sixth embodiment, a plurality of surface-emitting lasers 750 according to the seventh embodiment, or a plurality of surface-emitting lasers 850 according to the eighth embodiment are arranged in an array.

The projection optical unit 1202 includes at least a fluorescent member 1203, a filter 1204, and an image generation element 1205, and may further include a lens, such as a projection lens 1206, and a mirror, as necessary.

The fluorescent member 1203 is excited by a part of light incident on the projection optical unit 1202 from the light source 1201 to produce white light.

For example, in a case where light emitted from the light source 1201 is blue light, a fluorescent member that emits yellow light is used as the fluorescent member 1203. In a case where light emitted from the light source 1201 is ultraviolet light, a fluorescent member that emits white light is used as the fluorescent member 1203.

The filter 1204 separates a color from white light, and also includes a movable unit. Examples of the filter 1204 include a color wheel that transmits red, blue, or green light.

The image generation element 1205 generates an image from light that has passed through the filter 1204. Examples of the image generation element 1205 include a MEMS device having fine mirrors arranged in a two-dimensional array and a reflection type liquid crystal element.

The projection lens 1206 enlarges an image generated by the image generation element 1205 to a desired magnification, and projects the image onto an object.

The projection optical unit 1202 is an example of an optical element that adjusts the wavelength and the traveling direction of a laser beam emitted from the light source 1201.

In the present embodiment, the projection optical unit 1202 includes the filter 1204, but a prism or a dichroic mirror may be used instead of the filter 1204. If the prism or the dichroic mirror is used, the projection optical unit 1202 may have a configuration in which light is divided into red, green, and blue, images of the respective colors are generated by three image generation elements, and lastly, the images are combined by the prism.

According to an embodiment of the present invention, stable characteristics can be obtained.

Further, the present invention is not limited to these embodiments, but various variations and modifications may be made to the described subject matter without departing from the scope of the present invention.

What is claimed is:

1. A nitride semiconductor multilayer structure comprising:
   a first nitride semiconductor layer;
   a second nitride semiconductor layer; and
   a third nitride semiconductor layer formed between the first nitride semiconductor layer and the second nitride semiconductor layer,
   wherein the third nitride semiconductor layer includes a first region and a second region, that surrounds the first region in a same plane,
   the first region includes at least indium and nitrogen,
   the second region includes at least nitrogen, and
   an indium content of the second region is greater than or equal to zero and lower than the indium content of the first region.

2. The nitride semiconductor multilayer structure according to claim 1, wherein a band gap of the second region is, larger than a band gap of each of the first nitride semiconductor layer, the second nitride semiconductor layer, and the first region by 0.5 eV or more.

3. The nitride semiconductor multilayer structure according, to claim 1, wherein the third, nitride semiconductor layer has a thickness of 20 nm or more.

4. The nitride semiconductor multilayer structure according to claim 1, wherein the first region and the second region each include Al.

5. The nitride semiconductor multilayer structure according to claim 4, wherein the first region and the second region are each formed of AlInN or AlGaInN.

6. A light emitting element comprising,
   the nitride semiconductor multilayer structure according to claim 1, the nitride semiconductor multilayer structure including an active layer that emits light.

7. The light emitting element according to claim 6, wherein the nitride semiconductor multilayer structure includes a resonator structure that causes the light emitted from the active layer to resonate.

8. A light source apparatus comprising,
   the light emitting element according to claim 6.

9. A nitride semiconductor multilayer structure comprising:
   a first nitride semiconductor layer;
   a second nitride semiconductor layer; and
   a third nitride semiconductor layer formed between the first nitride semiconductor layer and the second nitride semiconductor layer,
   wherein the third nitride semiconductor layer includes a first region and a second region that surrounds the first region in a same plane, and
   the second region has a largest band gap, among the first nitride semiconductor layer, the second nitride semiconductor layer, the first region, and the second region.

10. A method for producing a nitride semiconductor multilayer structure, the method comprising:
- forming a first nitride semiconductor layer, a second nitride semiconductor layer, and a third nitride semiconductor layer on a substrate, the third nitride semiconductor layer being formed between the first nitride semiconductor layer and the second nitride semiconductor layer and including at least an indium and a nitrogen; and
- performing heat treatment so as to reduce an indium content of a part of the third nitride semiconductor and form, in the third nitride semiconductor layer, a first region and a second region that surrounds the first region in a same plane, the first region including at least the indium and a nitrogen and allowing an electric current to flow through the first region between the first nitride semiconductor layer and the second, nitride semiconductor layer, and the second region including at least the nitrogen and preventing the electric current from flowing through the second region,
- wherein the indium content of the second region is greater than or equal to zero and lower than the indium content of the first region.

* * * * *